(12) United States Patent
Villarreal et al.

(10) Patent No.: US 9,694,526 B2
(45) Date of Patent: Jul. 4, 2017

(54) INJECTION MOLD WITH MULTI-AXIAL CORE INSERTS

(71) Applicant: Apple Inc., Cupertino, CA (US)

(72) Inventors: Cesar Lozano Villarreal, Sunnyvale, CA (US); Richard J. Langlois, Sunnyvale, CA (US); Alexander Kwan, San Francisco, CA (US); Ciaran Keane, San Carlos, CA (US); Dominic E. Dolci, Berkeley, CA (US); Chiew-Siang Goh, San Jose, CA (US); Bruce E. Berg, Encinas, CA (US)

(73) Assignee: Apple Inc., Cupertino, CA (US)

( * ) Notice: Subject to any disclaimer, the term of this patent is extended or adjusted under 35 U.S.C. 154(b) by 556 days.

(21) Appl. No.: 14/038,176

(22) Filed: Sep. 26, 2013

(65) Prior Publication Data

US 2014/0265763 A1     Sep. 18, 2014

Related U.S. Application Data

(60) Provisional application No. 61/799,065, filed on Mar. 15, 2013.

(51) Int. Cl.
*H01R 31/06* (2006.01)
*H05K 5/02* (2006.01)
(Continued)

(52) U.S. Cl.
CPC ........ *B29C 45/376* (2013.01); *B29C 45/4421* (2013.01); *H01R 31/065* (2013.01);
(Continued)

(58) Field of Classification Search
CPC ...... H05K 5/02; H05K 5/0217; H05K 5/0278; H05K 7/18; G06F 1/16; G06F 1/181; H01R 13/665; H01R 31/065
(Continued)

(56) References Cited

U.S. PATENT DOCUMENTS 5,520,976 A    5/1996 Giannetti et al.
5,620,242 A *  4/1997 Leon ................... H01M 2/1055
                                               292/175
(Continued)

FOREIGN PATENT DOCUMENTS

CN    1404936    3/2003
CN    1438567    8/2003
(Continued)

OTHER PUBLICATIONS

Author Unknown, "Prepeg Technology," Hexcel Corporation, 34 pages, Mar. 2005.
(Continued)

*Primary Examiner* — James O Hansen
(74) *Attorney, Agent, or Firm* — Kilpatrick Townsend & Stockton LLP

(57) ABSTRACT

Systems and methods of providing a tooling system for forming a unitary housing are disclosed herein. One embodiment may utilize a plurality of injection cavity slides. The slides may form the interior cavity of the housing. Utilizing a plurality of injection cavity slides to form a single cavity insert may allow the slides to be remove from an opening in the housing which is smaller than the cavity of the housing. Removing the slides from housing allows for the formation of housing having a unitary structure.

17 Claims, 46 Drawing Sheets

(51) Int. Cl.
*B29C 45/37* (2006.01)
*B29C 45/44* (2006.01)
*B29C 45/26* (2006.01)
*B29C 45/33* (2006.01)

(52) U.S. Cl.
CPC ........ *H05K 5/0278* (2013.01); *B29C 45/2628* (2013.01); *B29C 45/33* (2013.01)

(58) Field of Classification Search
USPC .................. 312/223.1, 223.2; 307/150, 151; 439/131, 502
See application file for complete search history.

(56) References Cited

U.S. PATENT DOCUMENTS

| | | | |
|---|---|---|---|
| 6,086,395 A * | 7/2000 | Lloyd | H01R 13/6675 363/146 |
| 6,291,369 B1 | 9/2001 | Yoshikawa et al. | |
| 6,293,636 B1 * | 9/2001 | Le | G06F 1/184 292/DIG. 37 |
| D478,310 S * | 8/2003 | Andre | D13/110 |
| 8,053,077 B2 | 11/2011 | Braidwood et al. | |
| D663,688 S * | 7/2012 | Liu | D13/108 |
| 8,222,773 B2 | 7/2012 | De Iuliis et al. | |
| 2009/0291266 A1 | 11/2009 | Wakisaka | |
| 2010/0277007 A1 | 11/2010 | Deiuliis et al. | |
| 2011/0007462 A1 * | 1/2011 | Probst | H02K 5/08 361/679.01 |
| 2012/0274155 A1 * | 11/2012 | Deluliis | H01R 31/065 307/150 |
| 2013/0126073 A1 | 5/2013 | Kenney | |
| 2015/0367545 A1 | 12/2015 | Berg et al. | |

FOREIGN PATENT DOCUMENTS

| | | |
|---|---|---|
| CN | 1562620 | 1/2005 |
| CN | 1567169 | 1/2005 |
| CN | 101634911 | 1/2010 |
| CN | 101974198 | 2/2011 |
| CN | 102147668 | 8/2011 |
| JP | 03252416 | 11/1991 |
| JP | H05200914 | 8/1993 |
| JP | 2003266485 | 9/2003 |
| KR | 1020020073224 | 6/2003 |
| KR | 1020009013944 | 12/2009 |
| KR | 1020090131944 A | 12/2009 |
| TW | 201322093 | 6/2013 |

OTHER PUBLICATIONS

Chinese Patent Application No, 201410093899.6, "Office Action", mailed Sep. 9, 2016, 33 pages.
Taiwan Patent Application No. 103107284, "Notice of Allowance", mailed Jan. 19, 2017, 3 pages.
Taiwan Patent Application No. 103107284, "Office Action", mailed Mar. 9 2016, 6 pages.

* cited by examiner

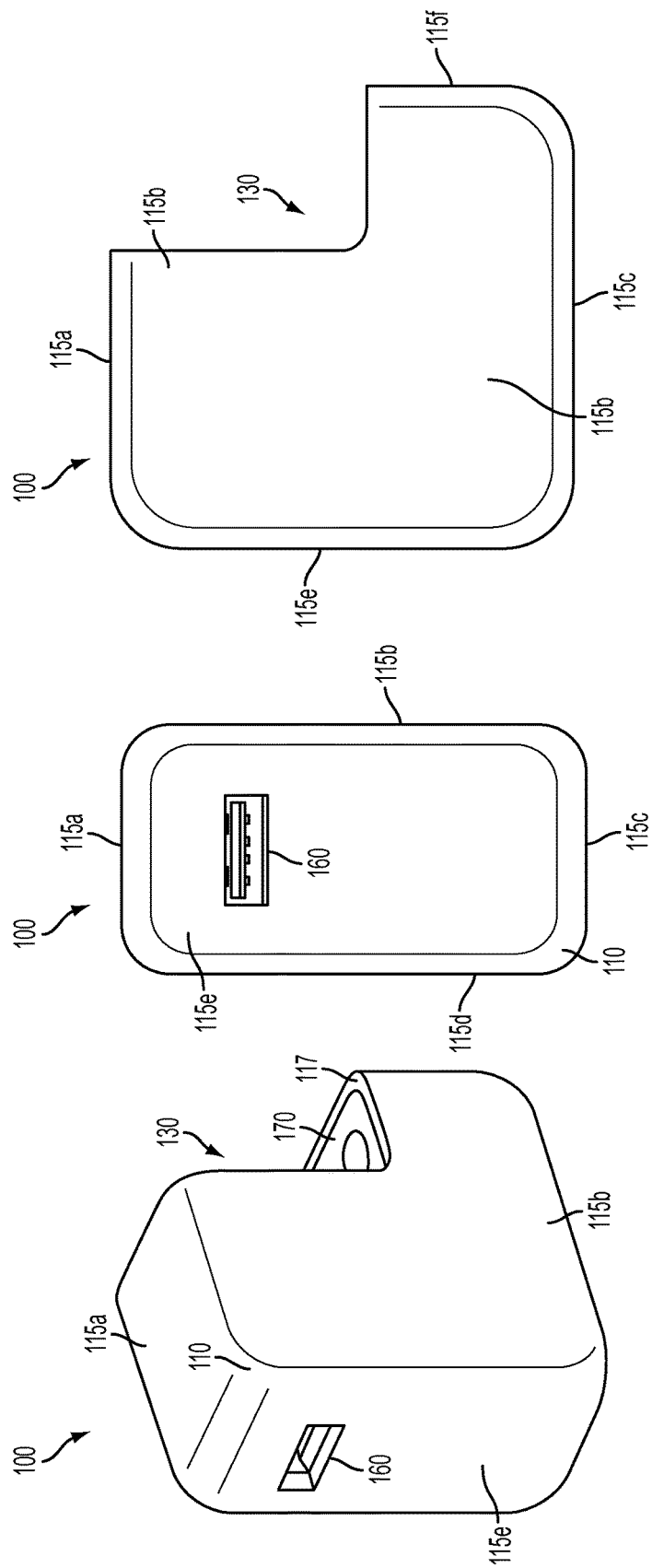

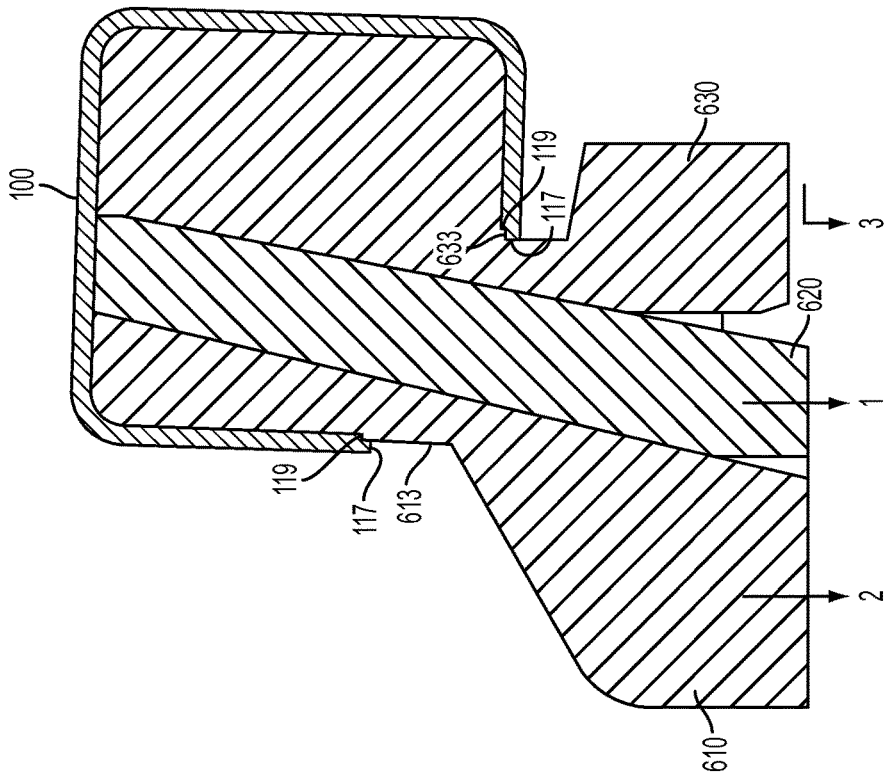
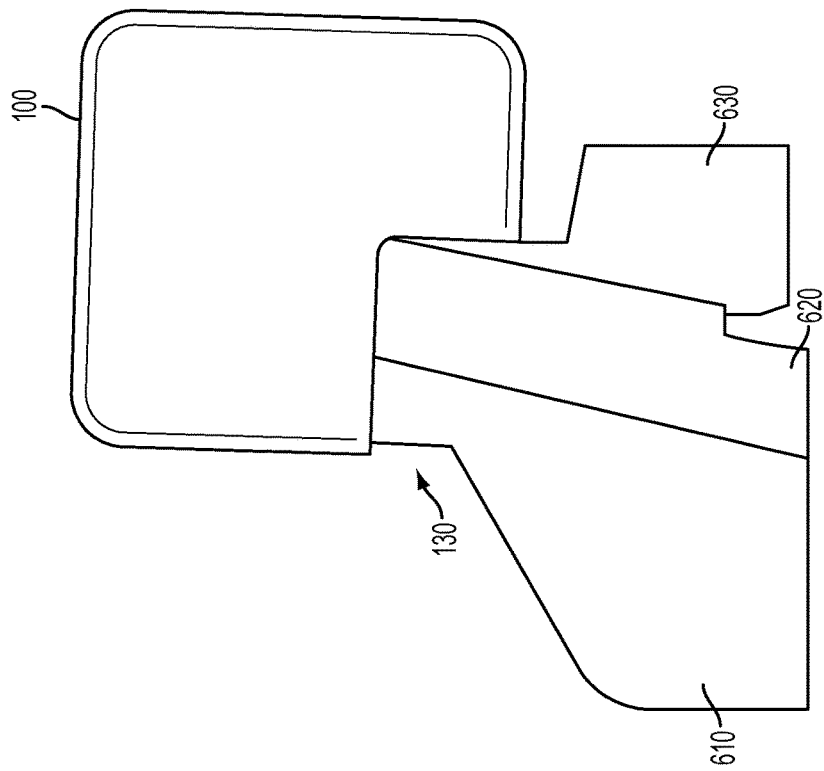

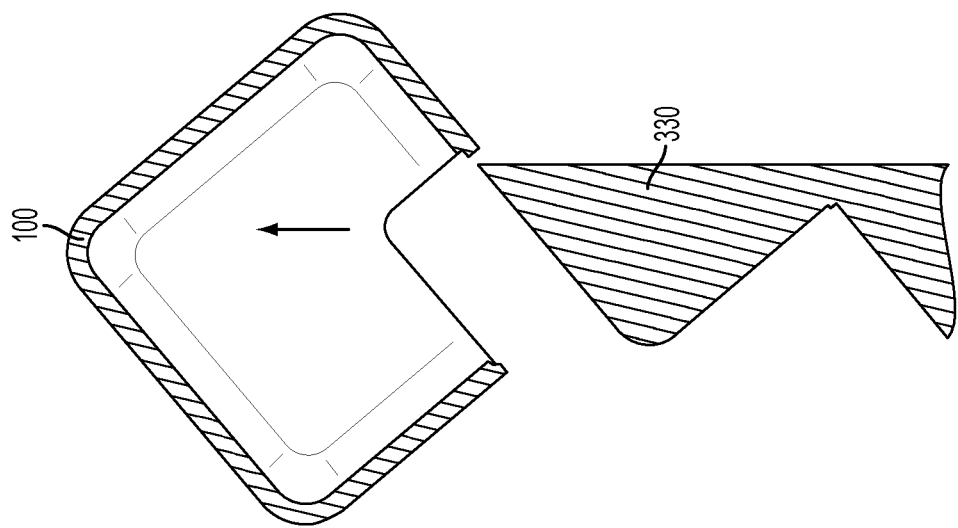
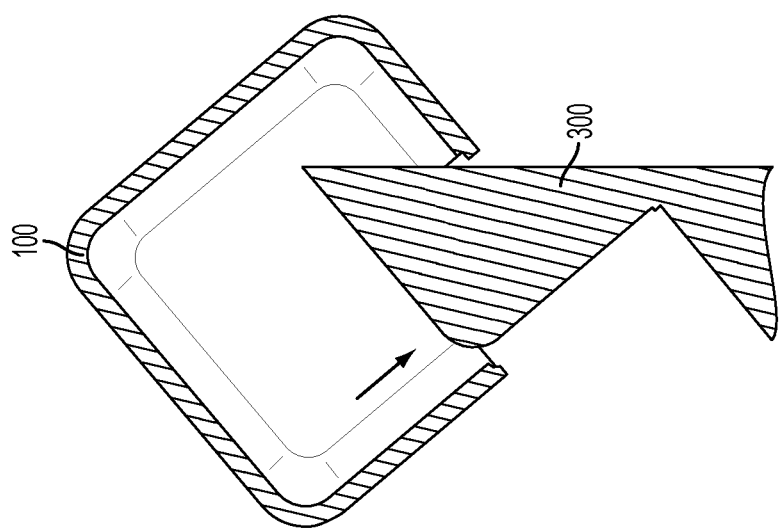

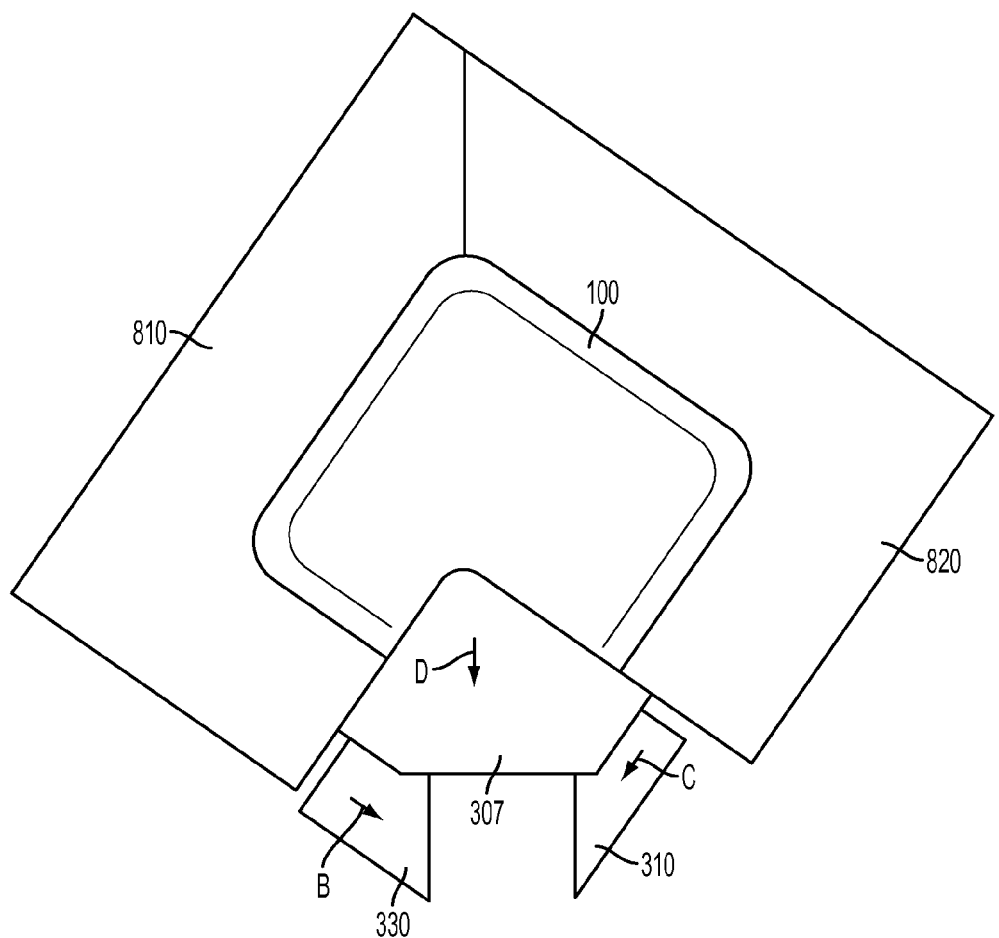
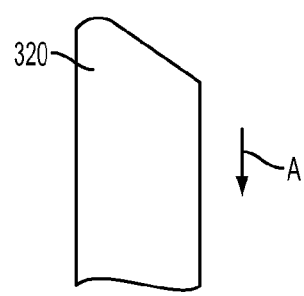
FIG. 8K

INJECTION MOLD WITH MULTI-AXIAL CORE INSERTS

CROSS-REFERENCE TO RELATED APPLICATIONS

This application claims priority under 35 U.S.C. §119(e) to U.S. Provisional Patent Application No. 61/799,065 filed 15 Mar. 2013 and entitled "Injection Mold with Multi-Axial Core Inserts," which is incorporated by reference herein in its entirety.

TECHNICAL FIELD

This disclosure relates generally to an injection mold for forming a unitary housing, and in particular to methods of assembling and disassembling the same, suitable for injection molding of a housing of unitary construction, the housing having internal surface features suitable for receiving electronic components.

BACKGROUND

Housings of various forms are used to contain and protect electronic components internal to the housings. Housings may be made lightweight. Reducing the material weight of a housing often reduces strength and durability which increases the likelihood of device failure if dropped on a hard surface. Alternately, selecting lighter materials of equivalent strength may be cost prohibitive to electronic device manufacturers. Furthermore, electronic device housings are often composed of multiple components. During assembly, multiple separate components may be mechanically coupled together to form a singular housing. This process may increase both time and cost of manufacture. In addition, the mechanical coupling often becomes a structural weak point and/or an aesthetic blemish of a fully assembled device.

In one example, housings are formed in a clam shell structure. In such a process, two halves of the housing may be formed separately. After the halves are formed, the two halves of the housing are then assembled using an adhesive or similar mechanical process to hold the two halves together. As indicated above, this may be a costly additional step and the process leaves behind an unattractive seam between the two housing halves.

SUMMARY

Systems and methods for forming a housing of unitary construction are described herein. One embodiment may take the form of, a housing for electronic components including a major interior surface that defines an interior cavity. The housing may include a major exterior surface comprising at least a first surface and a second surface. The housing may include a major aperture extending from the interior cavity through the major interior surface and major exterior surface. The major aperture may pass through a portion of the first surface and the second surface. The major aperture may extend through a portion of but not the entirety of the at least the first surface and the second surface. The housing may be a single, unitary construction formed of a rigid material of substantially uniform thickness. The housing may be formed in one injection molding step. In further embodiments, the rigid housing for electronic components also includes at least one interior surface feature of the housing member configured to couple to electronic components. The major aperture of the housing may have a substantially L-shaped cross section. The major aperture of the housing may also include a receiving lip around the perimeter of the major aperture. The housing may include a retention cap configured to couple to the receiving lip such that the surface of the retention cap is flush with the at least first and second face of the exterior of the housing member. The retention cap may be flush with the exposed edge of the major aperture. The housing may include a surface feature on the interior surface configured to receive a screw. This surface feature may be molded with a threaded insert member, or in other embodiments, may be molded to receive a self-tapping screw.

In accordance with various embodiments, a method for forming a rigid housing of unitary construction may include providing a major internal mold assembly. Providing the major internal mold assembly may include providing a plurality of movable interior slides in a first position for forming an interior cavity of the housing with each slide having an extraction protrusion. The method may include providing a major external mold assembly. The major external mold assembly may include providing a plurality of movable components in a first position for forming a major external surface of the housing. A cavity may be formed between the major internal mold assembly and the major external mold assembly. The cavity may be configured for injecting resin to form the housing of unitary construction. Resin may be injected in the cavity between the major internal mold assembly and the major external mold assembly. This injection may form a major internal surface and a major external surface, respectively. The formation of the surfaces forms the housing of unitary construction. The major external mold assembly may mate with the extraction protrusion of each of the plurality of movable interior slides. A major aperture may be formed in the housing of unitary construction. The aperture may pass from the interior cavity through the interior surface and the exterior surface of the housing. The major aperture may be formed around the extraction protrusions of each of the movable slides. For example, the aperture formation may be located where the major external mold assembly mates with the extraction protrusion of each of the plurality of movable interior slides. This location may be proximal to the cavity formed between the major internal mold assembly and the major external mold assembly. A first moveable interior slide may be removed through the aperture formed in the housing of unitary construction. A second moveable interior slide may be moved within the formed housing of unitary construction toward the aperture and the second moveable interior slide may be removed through the aperture formed in the housing of unitary construction. The first movable exterior mold component may be removed. The housing of unitary construction may be removed from the tooling.

In accordance with various embodiments, a system for forming a rigid housing of unitary construction may include a major internal mold assembly comprising a plurality of movable interior slides. Each of the plurality of movable interior slides may have an extraction protrusion. The system may include a major external mold assembly having a plurality of movable components. The major internal mold assembly may be located internally to the major external mold assembly such that a housing cavity is formed between the major internal mold assembly and the major external mold assembly. The cavity may be configured to receive resin to form the housing. In response to the plurality of movable interior slides being assembled to form the major internal mold assembly the plurality of movable interior slides occupy at least a portion of an interior cavity within the major external mold assembly. The major external mold assembly may mate with the extraction protrusion of each of the plurality of movable interior slides. The plurality of movable interior slides may be movable within the major external mold assembly and may be configured to move out of the interior cavity. The plurality of movable interior slides may include extraction protrusions that extend out of the interior cavity and mate with an interior of the major external mold assembly. The plurality of movable interior slides may include a first slide, a second slide and a third slide, with the first and second slide engaged and the second and third slide engaged with both engagements being sufficiently tight to prevent resin form flowing between the plurality of movable interior slides. The engagement may allow for the plurality of movable interior slides to move relative to one another. The second slide may be located between the first slide and the third slide. The second slide may be sized and positioned such that it is operable to be moved out from between the first slide and the third slide. The first slide is sized and positioned such that it is operable to be moved out of the interior cavity by utilizing the space occupied by the second slide prior to the second slide's movement, while the third slide is still positioned in the interior cavity. The third slide is sized such that it is operable to be moved out of the interior cavity after the first slide and the second slide are removed.

Another embodiment may take the form of a housing, comprising: an injection-molded body defining a cavity therein; an aperture passing through the injection-molded body; wherein the largest cross-section of the interior cavity is larger than the largest cross-section of the aperture; and the injection-molded body is unitary.

BRIEF DESCRIPTION OF THE DRAWINGS

FIG. 1A illustrates a parallel projection view of an example housing of unitary construction.

FIG. 1B illustrates a rear view of an example housing of unitary construction.

FIG. 1C illustrates a side view of an example housing of unitary construction.

FIG. 6A illustrates a side view of an example housing of unitary construction with an example tooling insert extending therefrom.

FIG. 6B illustrates a cross section side view of an example housing of unitary construction with an example tooling insert extending therefrom.

FIG. 8I illustrates an alternative side cross section view of an example injection molding tool for forming a housing of unitary construction as viewed from a section D-D in FIG. 8G.

FIG. 8J illustrates an alternative side cross section view of an example injection molding tool for forming a housing of unitary construction as viewed from a section D-D in FIG. 8G.

FIG. 8K illustrates a top view of a portion of an example injection molding tool for forming a housing of unitary construction highlighting the removal of inserts.

FIG. 9K illustrates a cross section view of FIG. 12a.

DETAILED DESCRIPTION

Introduction

Figure 1E:
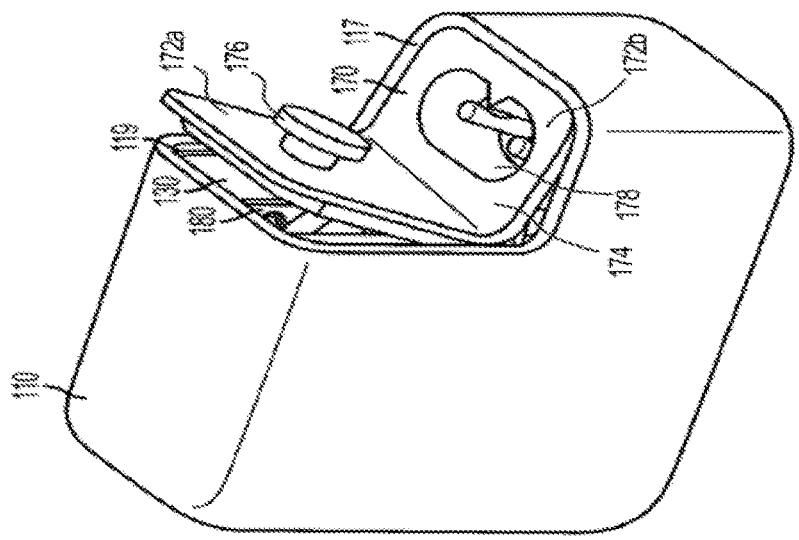
FIG. 1E illustrates a parallel projection view of an example housing of unitary construction.
Figure 1D:
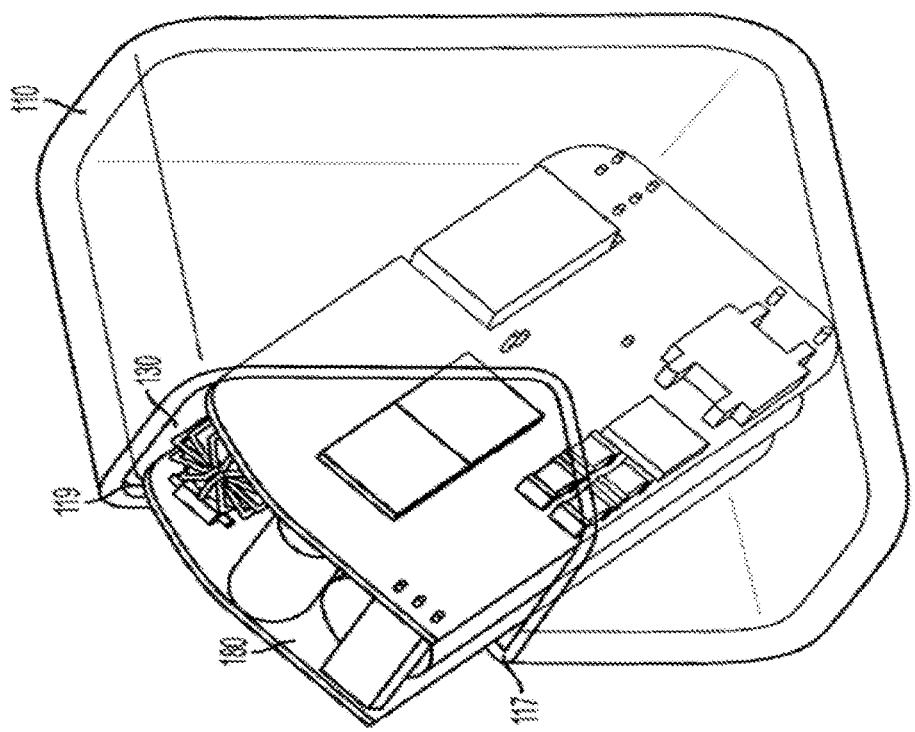
FIG. 1D illustrates a parallel projection view of an example housing of unitary construction illustrating an electric component inserted through an aperture in the housing.

Numerous consumer and non-consumer devices utilize housings to contain electronic components. As discussed herein and in accordance with various embodiments, a tooling system may be utilized in order to form a unitary housing structure that may house these various electronic components or serve similar purposes.

More particularly, an injection molding system may include a cavity that is configured to receive a plurality of internal slides. The cavity may be defined by one or more external tooling sections that cooperate to form the cavity (collectively, a "major exterior mold assembly"). The plurality of internal slides may form a major internal mold assembly and generally cooperate to define a cavity within a finished unitary housing structure, as well as an aperture through the unitary housing structure to provide access to this cavity. In accordance with various embodiments, the housing of unitary construction may be molded with a major internal mold assembly and a major exterior mold assembly meeting in a first position to form a cavity.

A resin may be injected into the cavity to form the unitary housing structure (or "housing"). To facilitate efficient removal of a molded housing, the major internal mold assembly and the major exterior mold assembly may be selectively movable and disassemblable. In various embodiments, a portion of the internal mold assembly may be removed from the interior cavity before the molded part is removed for further manufacturing processing. The major internal mold assembly may form an interior cavity of the unitary housing during the injection molding process. The major internal mold assembly may also form an exterior aperture in the unitary housing. After the molding process, the major internal mold assembly may be removed through the exterior aperture in the unitary housing. As discussed herein, the major internal mold assembly may have a larger cross section than the cross section of the exterior aperture in the housing.

Unitary Housings

Additionally, examples and embodiments described herein relate to geometries of housings of unitary construction that are more efficient to manufacture. Housings of unitary construction generally may have internal surface features intentionally placed for coupling to, and securing, electronic components to be inserted therein in a later product assembly process. The later assembly processes often involve the polishing away of undesirable flash, removing by a secondary process (e.g. CNC machining) excess gate or runner material left behind by the injection molding process, and creating minor apertures through the housing by similar or the same secondary processes.

The minor apertures in the housing may be configured to pass light through the housing from, for example, light emitted by the housed electronic components and that is to be viewed external to the housing. In various embodiments, the minor apertures in the housing may be configured to pass audio produced by the housed electronic components through the housing such that it may be better heard outside the housing. In various embodiments, the minor apertures in the housing may be configured to allow access to the housed electronic components, for example, access to a reset or power button is available external to the housing. In various embodiments, the minor apertures in the housing may be configured such that the housing, in a later process, can be coupled to an additional part.

Each of these operations, especially the processing of additional minor apertures, may add cost or delay to the manufacturing of each housing. Accordingly, various benefits may be achieved by co-locating internal surface features of the housing with the gates from the injection molding process such that the gates may be removed in the same process in which the minor apertures are later opened. In other embodiments, some internal surface features may be co-located with gates from the injection molding process in order to provide additional structural integrity around locations where apertures will be later opened.

A "unitary structure," as described herein, refers to a housing in which the exterior surfaces are contiguous (e.g., are not separate but mechanically attached to one another to form a surface or component). A unitary structure may also be formed in a single manufacturing process. The housing of unitary construction may be formed, in certain embodiments, in a single injection molding process. In one example, the formation of the exterior surfaces may include the formation of the entire exterior surfaces of the molded housing. The entire exterior surface of a housing may not include caps or other features utilized to fill various apertures. The caps or other features may however constitute additional surfaces and not mechanical extensions or seams in the same surface. In another example, the formation of the exterior surfaces may include the formation of at least a portion of all of the exterior surfaces of the housing. For example, a box may have six sides. The box may have an aperture through one or more of the sides. The aperture may make one or more of the sides incomplete preventing the box from being enclosed. The six sides may be formed in the injection molding process. In various embodiments, the six sides may be seamless. The six sides may be contiguous with no mechanical attachments utilized to form the six sides. The six sides may all be formed at the same time in the same tool in a contiguous manner.

Figure 1G:
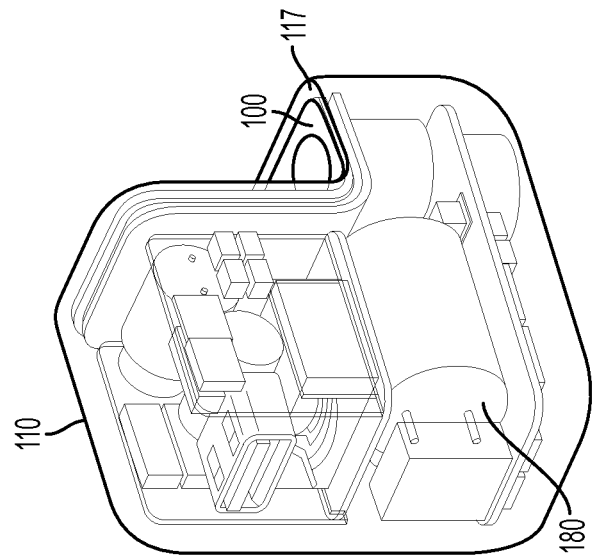
FIG. 1G illustrates a parallel projection view of an example housing of unitary construction.
Figure 1F:
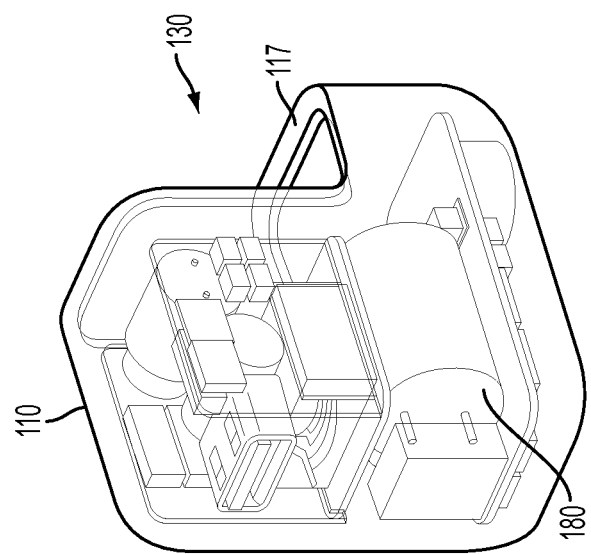
FIG. 1F illustrates a parallel projection view of an example housing of unitary construction.
Figure 2:
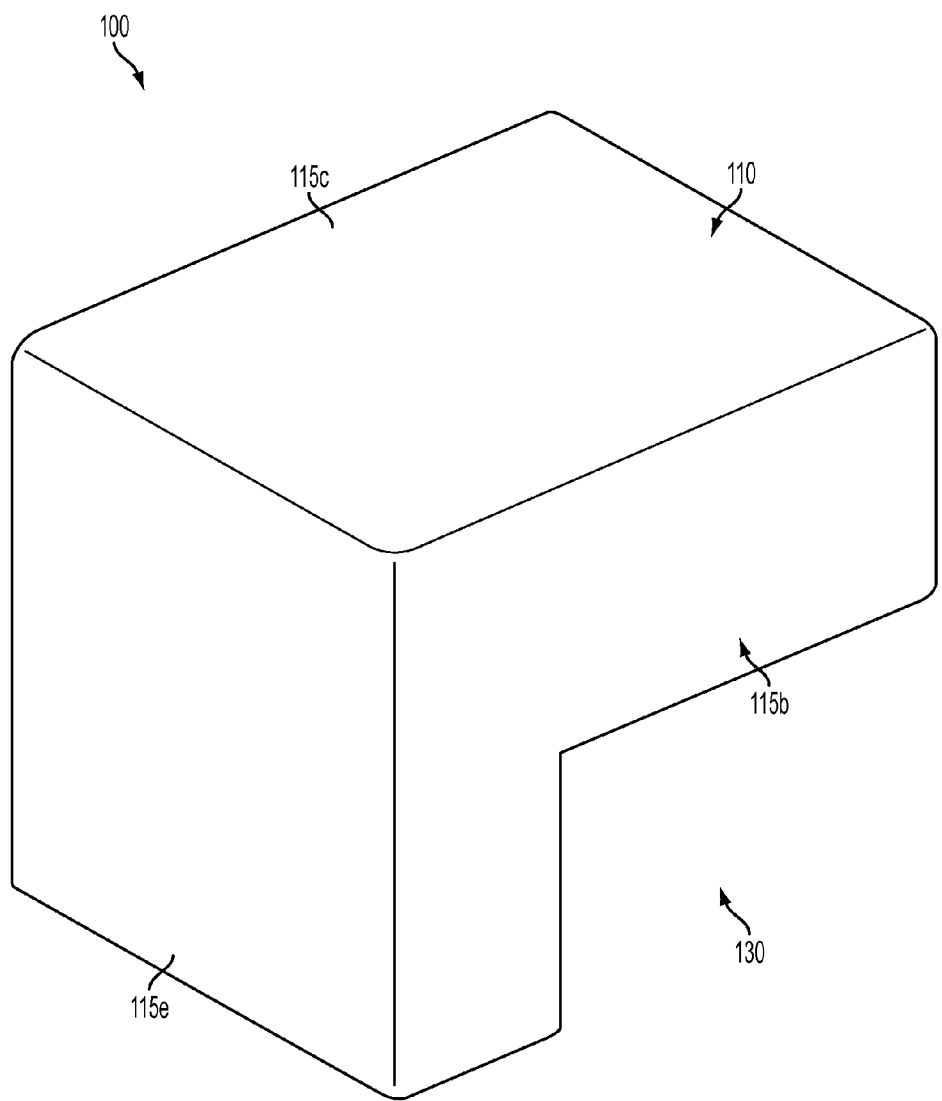
FIG. 2 is a parallel projection view of an example housing of unitary construction.

For example, FIGS. 1-4 illustrate an example housing of unitary construction. In accordance with various embodiments and as illustrated in FIGS. 1a-c, the housing may include a top surface 115a, a front surface 115b, a bottom surface 115c, a back surface 115d, a left surface 115e, or a right surface 115f. In accordance with various embodiments, as illustrated in FIG. 2, the housing 100 may include a major exterior surface 110 and a major aperture 130 which provides a location through which major internal mold assemblies may be inserted and removed during molding. The interior volume of the housing 100 may be visible through aperture 130. The interior volume may be defined by the walls defined by a major internal surface 120 and the major exterior surface 110. The housing 100 may be constructed of any material suitable for injection molding. For example, the housing may be made of a rigid material not subject to substantial deformation.

In accordance with various embodiments, as discussed above and illustrated in FIGS. 1-4, the housing may include one or more apertures. For example, a minor aperture 160 may pass through at least one surface such as left surface 115e. In various embodiments, at least one aperture may pass through more than one surface. A major aperture 130 may pass through 115a, 115b, 115f and 115d forming an aperture surface 117. By having the aperture in several surfaces but by leaving at least a portion of each of those surfaces, the housing may have a unitary construction. In accordance with various embodiments, as illustrated in FIGS. 1-4, the housing does not have seams where multiple portions of the housing are assembled to create the completed housing with surfaces 115a-g. The housing may be a contiguous structure without the use of adhesives or mechanical attachments to connect portions of any of the walls 115a-g.

The major aperture 130 may extend from a major interior surface 120 through the housing 100 to the exterior surface 110 through at least two faces 115a and 115b of the exterior surface. By extending through at least more than one face of the exterior surface, the perimeter of the major aperture may be defined by an area parallel to the first face 115a and an area parallel to the second face 115b. The cross sectional opening of the major aperture 130 may be larger than the cross sectional of the largest slide utilized to form a portion of the interior cavity. The cross sectional opening may be smaller than the cross sectional of the largest slide combined with the cross section of the narrowest portion of any other additional slide utilized to form at least a portion of the interior cavity.

As illustrated in FIGS. 1d-g, the housing 100 may be configured to receive and contain electronic components 180. In various embodiments, electronic components 180 may be inserted through the major aperture 130 into the housing 100. As such, the major aperture 130 may have a suitable cross section entrance to receive the electronic components 180. The electronic components 180 may be inserted into the housing 100 in one or more sections. For example, a first electronic component may be inserted and then a second electronic component may be inserted connecting to the first electronic component.

As illustrated in FIGS. 1A, 1E, and 1G, the housing 100 may include a retention cap 170. The retention cap 170 having first and second exterior cap surfaces 172a and 172b that intersect at an elbow 174. The retention cap 170 may mate with a receiving lip 119 formed around major aperture 130, In this structure; the retention cap 170 may mount flush with the aperture surface 117, Once mounted, the retention cap 170 may close the major aperture 130 and contain the electronic components 180 inside of the housing 100, Thus, the retention cap 170 may be configured as an electronics retention cap. The retention cap 170 includes a protrusion 176 that extends outward from the first exterior cap surface 172a and a minor aperture 178 that extends through the second exterior cap surface 172b to the interior cavity. The housing is illustrated as being transparent in FIGS. 1D, 1F and 1G for purposes of clarity, although the housing is not necessarily transparent in any embodiment.

Figure 3:
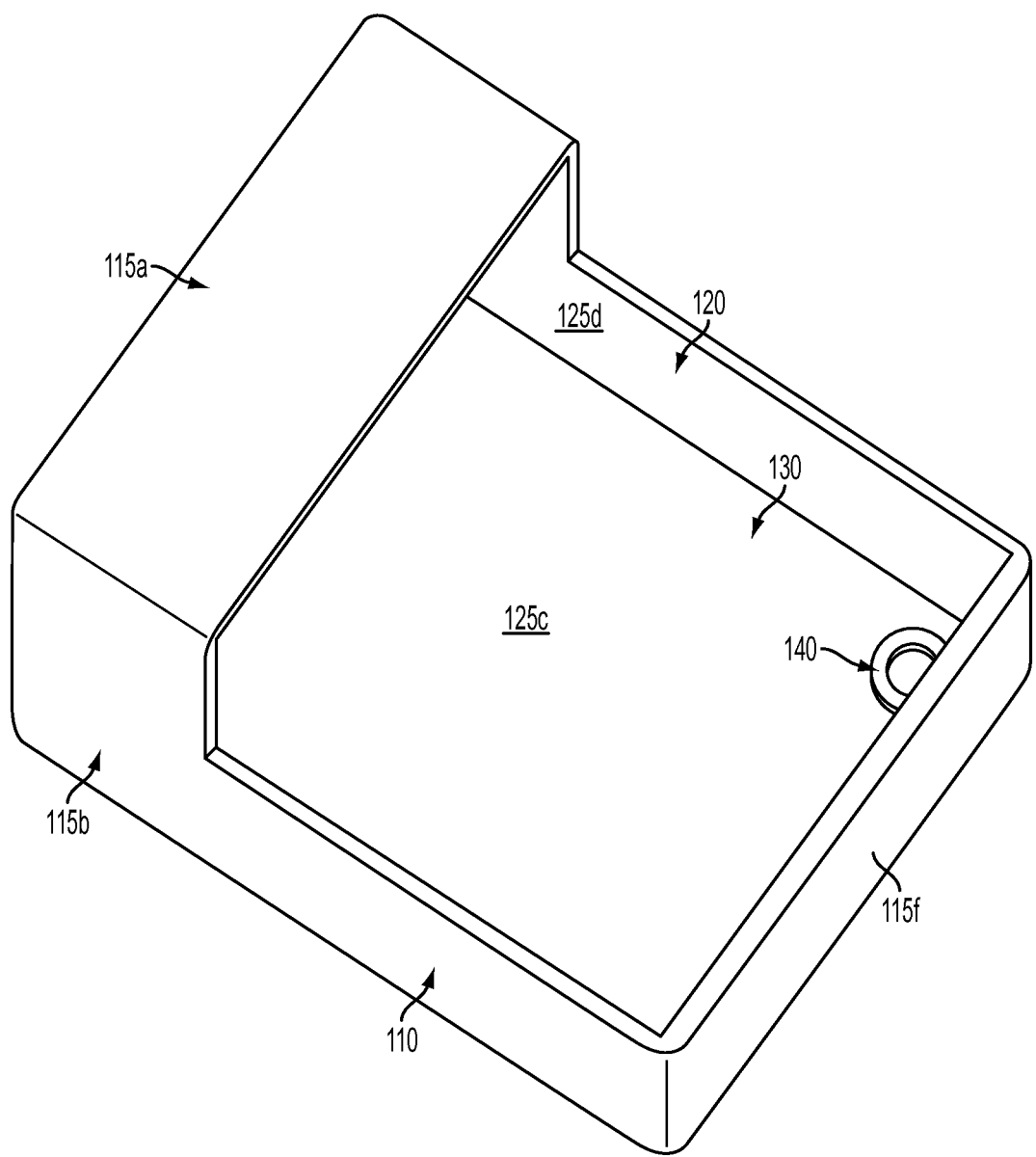
FIG. 3 is a parallel projection view of an example housing of unitary construction, where an interior surface feature can be seen through a major aperture of the housing.
Figure 4:
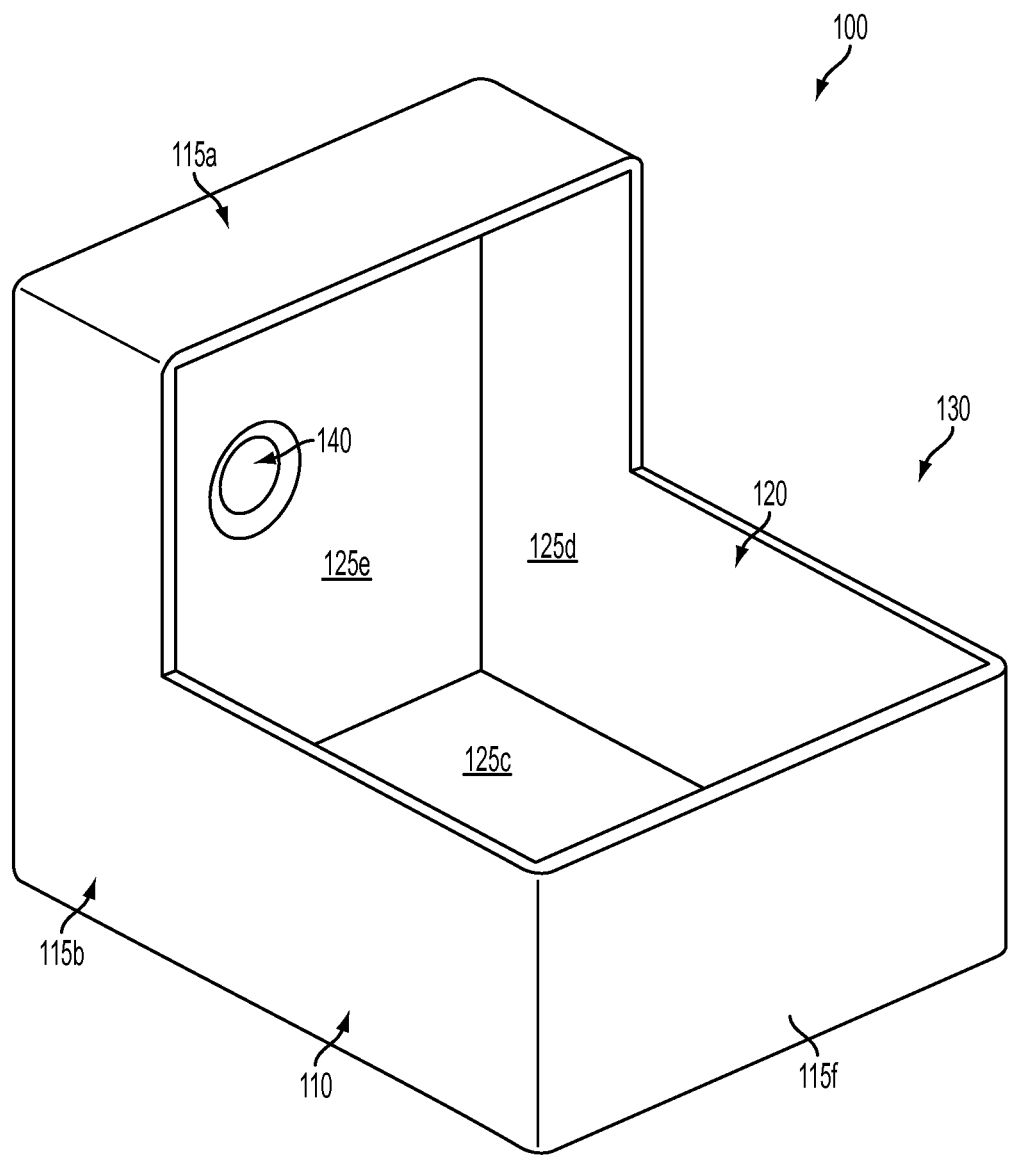
FIG. 4 is a parallel projection view of an example housing of unitary construction, where an interior surface feature can be seen through a major aperture of the housing.

As illustrated in FIG. 3, the housing may have an interior surface 120. Interior surface 120 may include interior surfaces which correspond to the opposing wall surfaces of 115a-f. For example, interior surface 120 may comprise interior back surface 125d (corresponding to back surface 115d) and interior bottom surface 125c (corresponding to bottom surface 115c). Interior surface 120 may also comprise interior feature 140. Interior surface feature 140 may be located on or through the bottom surface 125c, as can be seen through the major aperture 130 of the housing in FIG. 3. As illustrated in FIG. 4, the housing 100 may comprise an additional interior surface feature 140. For example, the additional interior surface feature can be seen through a major aperture 130 of the housing 100.

In accordance with one embodiment, as illustrated in FIGS. 5-8 a tooling apparatus may be operable to assemble and separate inside of a molded part allowing the tool to form an internal cavity that is larger than the aperture through which the internal mold assembly is inserted. This internal mold assembly may include a relatively small number of moving parts, for example three. The system may include a major external mold assembly and a major internal mold assembly that are assembled together in a first position to form the cavity with the geometric features of the housing 100.

Mold Assembly with Internal Slides

As illustrated in FIGS. 5A-5D, a major internal mold assembly may include a plurality of tooling slides for the formation of the interior cavity of the housing 100. The plurality of tooling slides may be independently and selectively movable relative to one another. The major internal mold assembly may include a first major interior slide 310, a second major interior slide 320, and a third major interior slide 330. The major internal mold assembly may extend from major aperture 130 after forming the housing 100.

Figure 5A:
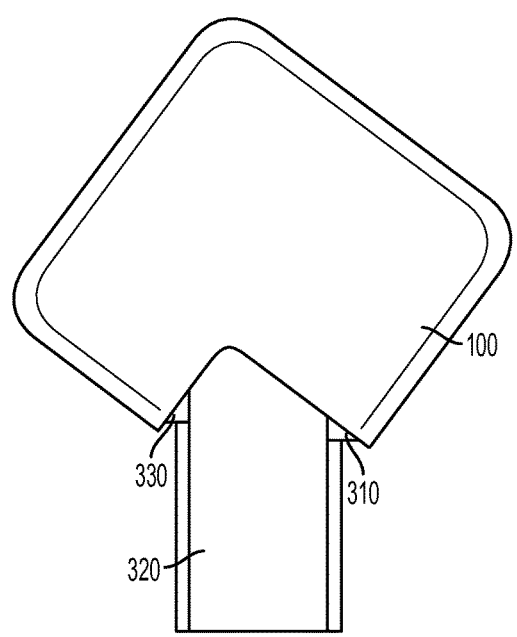
FIG. 5A illustrates a side view of an example housing of unitary construction with an example tooling insert extending therefrom.
Figure 5B:
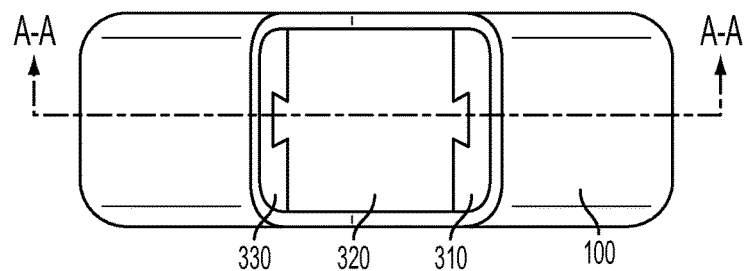
FIG. 5B illustrates a bottom view of the example housing of FIG. 5A.

As illustrated in FIG. 5B, the first major interior slide 310, the second major interior slide 320, and the third major interior slide 330 may extend through the aperture at the same time and engage one another, although they may enter or exit the aperture at different times. In accordance with various embodiments, the second major interior slide 320 may engage the first major interior slide 310 through a first engagement feature 327. The second major interior slide 320 may engage the third major interior slide 330 through a second engagement feature 329. The engagement may be any process or feature for engaging two movable tooling slides. For example, as illustrated in FIG. 5B the engagement features may include dovetail connections with an engagement groove and an engagement protrusion. It may be noted that each of the first major interior slide 310, the second major interior slide 320, and the third major interior slide 330 may include a receiving feature, a protruding feature or any combination of the same, and so are not limited to dovetail connections.

Figure 5C:
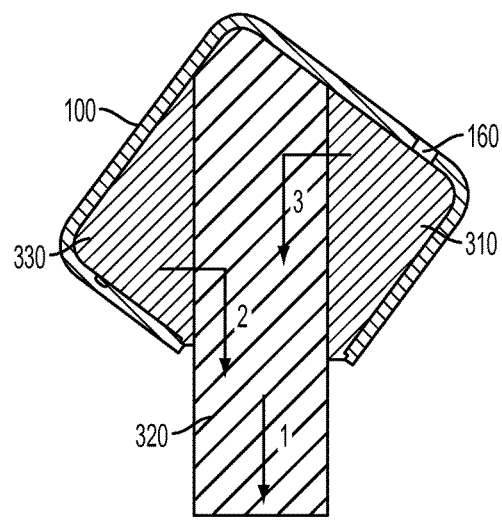
FIG. 5C illustrates a cross section side view of an example housing of unitary construction with an example tooling insert extending therefrom.

In accordance with various embodiments, the major internal mold assembly may be configured to be removed from the interior of the housing 100 after the housing 100 has been molded. This may be accomplished by removing each interior slide that make up the major internal mold assembly one at a time (or substantially removing them one at a time). For example, as illustrated in FIG. 5C and discussed above, the first major interior slide 310, the second major interior slide 320 and the third major interior slide 330 may be independently movable. The second major interior slide 320 may be moved relative to the first major interior slide 310 and the third major interior slide 330 laterally. For example, FIG. 5C illustrates arrow 1 which may represent the order and path of travel of the second major interior slide 320 relative to the first major interior slide 310 and the third major interior slide 330. Arrow 1 of FIG. 5C may represent a second position of the major internal mold assembly. Arrow 2 may represent the order and path of travel of the third major interior slide 330 relative to the first major interior slide 310 and the second major interior slide 320. Arrow 2 of FIG. 5C may represent a third position of the major internal mold assembly. Arrow 3 may represent the order and path of travel of the first major interior slide 310 relative to the second major interior slide 320 and the third major interior slide 330. Arrow 3 of FIG. 5C may represent a fourth position of the major internal mold assembly.

Figure 5G:
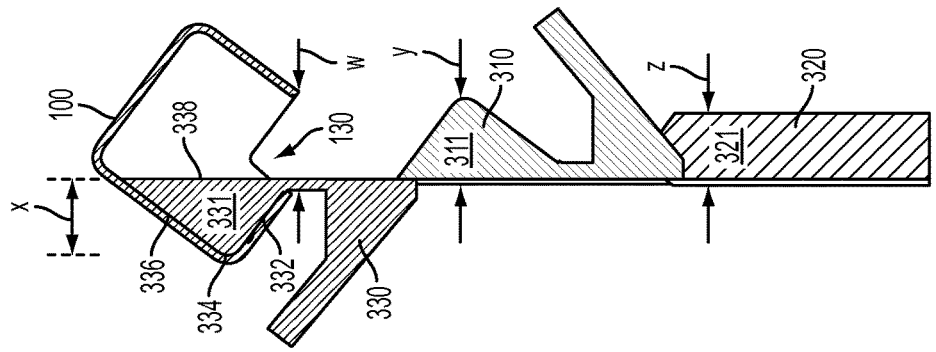
FIG. 5G illustrates a cross section side view of an example housing of unitary construction with an example tooling insert extending therefrom.
Figure 5F:
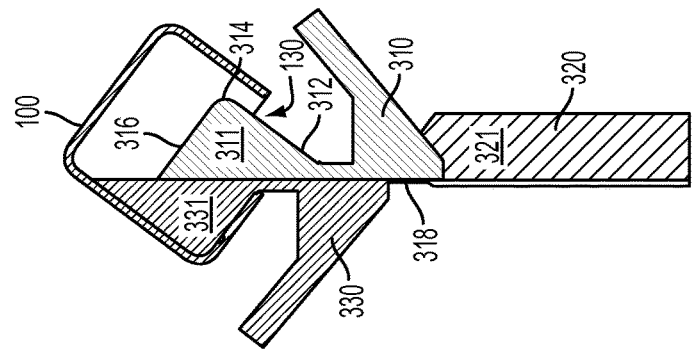
FIG. 5F illustrates a cross section side view of an example housing of unitary construction with an example tooling insert extending therefrom.
Figure 5E:
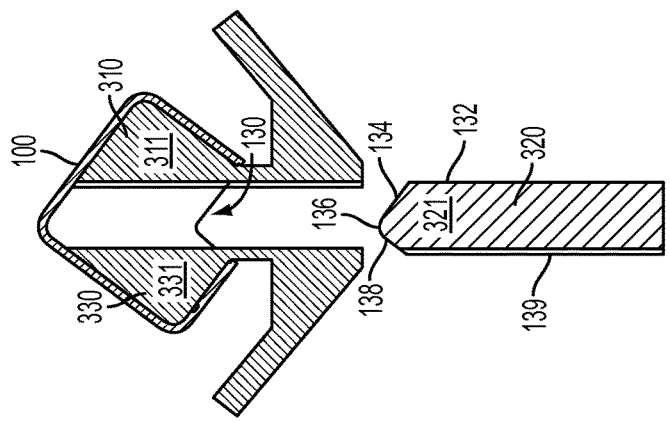
FIG. 5E illustrates a cross section side view of an example housing of unitary construction with an example tooling insert extending therefrom.
Figure 5D:
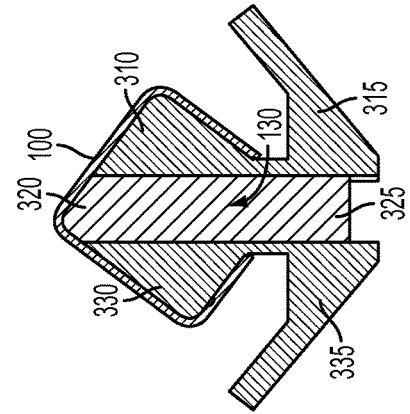
FIG. 5D illustrates a cross section side view of an example housing of unitary construction with an example tooling insert extending therefrom.

As illustrated in FIG. 5D, the major internal mold assembly may be positioned within the housing 100 after the housing 100 has been molded. Portions of the major internal mold assembly may protrude from the housing 100 through the major aperture 130. The portions of the major internal mold assembly that may protrude from the housing 100 may be utilized to extract each of the plurality of tooling slides from the housing 100 after molding is complete. For example, the first major interior slide 310 may include a first extraction protrusion 315. The first extraction protrusion 315 may be located outside of the molded housing 100 and within the injection tooling system. The first extraction protrusion 315 may be configured to receive a mechanical force to extract the first major interior slide 310 from within the molded housing 100. The second major interior slide 320 may include a second extraction protrusion 325. The second extraction protrusion 325 may be located outside of the molded housing 100 and within the injection tooling system.

The second extraction protrusion 325 may be configured to receive a mechanical force to extract the second major interior slide 320 from within the molded housing 100. The third major interior slide 330 may include a third major extraction protrusion 335. The third extraction protrusion 335 may be located outside of the molded housing 100 and within the injection tooling system. The third extraction protrusion 335 may be configured to receive a mechanical force to extract the third major interior slide 330 from within the molded housing 100.

As illustrated in FIG. 5E, the second major interior slide 320 may be configured to move relative to the first major interior slide 310 and the third major interior slide 330 opening a space within housing 100 between the first major interior slide 310 and the third major interior slide 330. The second major interior slide 320 may include various features that allows it to form a portion of the housing 100. For example, the second major interior slide 320 may include a front surface and a back surface. For example, a front surface 321 may form the front interior wall of housing 100. The back surface (on the opposite side of front surface 321 on the second major interior slide 320) may form a portion of the back interior wall 125d of housing 100. Additionally, a first surface 134 may form a portion of an interior wall of housing 100, a second surface 138 may form a portion of a second interior wall of housing 100, and a transition point 136 may form a transition between the first surface 134 and the second surface 138 to form a transition within housing 100. The second major interior slide 320 may include various features that allow it to engage with and move relative to the first major interior slide 310 and the third major interior slide 330. For example, the second major interior slide 320 may include engagement groove 132, (this engagement feature may also be an engagement protrusion in accordance with various embodiments). For example, the second major interior slide 320 may include engagement protrusion 139 (this engagement feature may also be an engagement groove in accordance with various embodiments).

As illustrated in FIG. 5F, the first major interior slide 310 may be configured to move relative to the third major interior slide 330 opening additional space within housing 100. The first major interior slide 310 may include various features that allow it to form a portion of the housing 100. For example, a front surface 311 may form the front interior wall of housing 100. The back surface (on the opposite side of front surface 311 on the first major interior slide 310) may form a portion of the back interior wall 125d of housing 100. Additionally, a first surface 312 may form a portion of an interior wall of housing 100, a second surface 316 may form a portion of a second interior wall of housing 100, and a transition point 314 may form a transition between the first surface 312 and the second surface 316 to form a corresponding transition within housing 100. The first major interior slide 310 may include various features that allow it to engage with and move relative to the second major interior slide 320. For example, the first major interior slide 310 may include engagement protrusion 318 (this engagement feature may also be an engagement groove in accordance with various embodiments).

As illustrated in FIG. 5G, the third major interior slide 330 may be configured to move out of the housing 100 major aperture 130. The third major interior slide 330 may occupy the entirety of the cross section of the major aperture 130 indicated by arrows W in FIG. 5G. This geometry of the third major interior slide 330 may be greater than either of the second major interior slide 320 or the first major interior slide 310. The first major interior slide 310 may have a maximum width illustrated by arrow Y (as illustrated in FIG. 5G). This width may be less than the width W minus the width of the portion of the third interior slide 330 that occupies the major aperture 130 while the third interior slide 330 is seated in the cavity as it would be during the injection molding process. (i.e. the first position discussed above) The second major interior slide 320 may have a maximum width illustrated by arrow Z (as illustrated in FIG. 5G). This width may be approximately the width of W minus the width of the portions of the third interior slide 330 and the first interior slide 310 that occupy the major aperture 130 while the third interior slide 330 and the first interior slide 310 is seated in the cavity as they would be during the injection molding process. (i.e. the first position discussed above) Stated another way, the first major interior slide 310 is sized and positioned such that it is operable to be moved out of the interior cavity while the third major interior slide 330 is still positioned in the interior cavity, wherein the third major interior slide 330 is sized such that it is operable to be moved out of the interior cavity after the first major interior slide 310 and the second major interior slide 320 are removed. In various embodiments, the procedure of removing the first major interior slide 310 and the third slide may be interchangeable. For example, the size of the third major interior slide 330 could not be maximized (reducing the resulting size of the cavity it can form in the injection molding process) but instead having the first major interior slide 310 and the third major interior slide 330 the same size such that after the second major interior slide 320 is removed either the first major interior slide 310 or the third major interior slide 330 can be removed next.

In accordance with various embodiments, the first major interior slide 310, the second major interior slide 320 and the third major interior slide 330 together form the interior cavity of housing 100. The first major interior slide 310 and the third major interior slide 330 may form the corners of the housing where the exterior surfaces 115a/e c/f meet. The width of the first major interior slide 310 (expressed by X) and the third major interior slide 330 may be less than distance W. As such the distance from the aperture to the corners formed by the intersection of the bottom surface 115c and right surface 115f (shown as line X in FIG. 5G) and the corner formed by intersection of the top surface 115a and the left surface 115e may be less than the major aperture opening. In various embodiments, one of the corners formed (e.g. either 115a and 115e or 115c and 115f) may be approximately the same as the cross section distance of major aperture 130 (i.e. width was illustrated in FIG. 5G).

In accordance with various embodiments, the third major interior slide 330 may include various features that allow it to form a portion of the housing 100. For example, a front surface 331 may form the front interior wall of housing 100. The back surface (on the opposite side of front surface 331 on the third major interior slide 330) may form a portion of the back interior wall 125d of housing 100. Additionally, a first surface 332 may form a portion of an interior wall of housing 100, a second surface 336 may form a portion of a second interior wall of housing 100, and a transition point 334 may form a transition between the first surface 312 and the second surface 316 to form a corresponding transition within housing 100. The third major interior slide 330 may include various features that allow it to engage with and move relative to the second major interior slide 320. For example, the third major interior slide 330 may include engagement groove 338 (this engagement feature may also be an engagement protrusion in accordance with various embodiments).

Figure 5H:
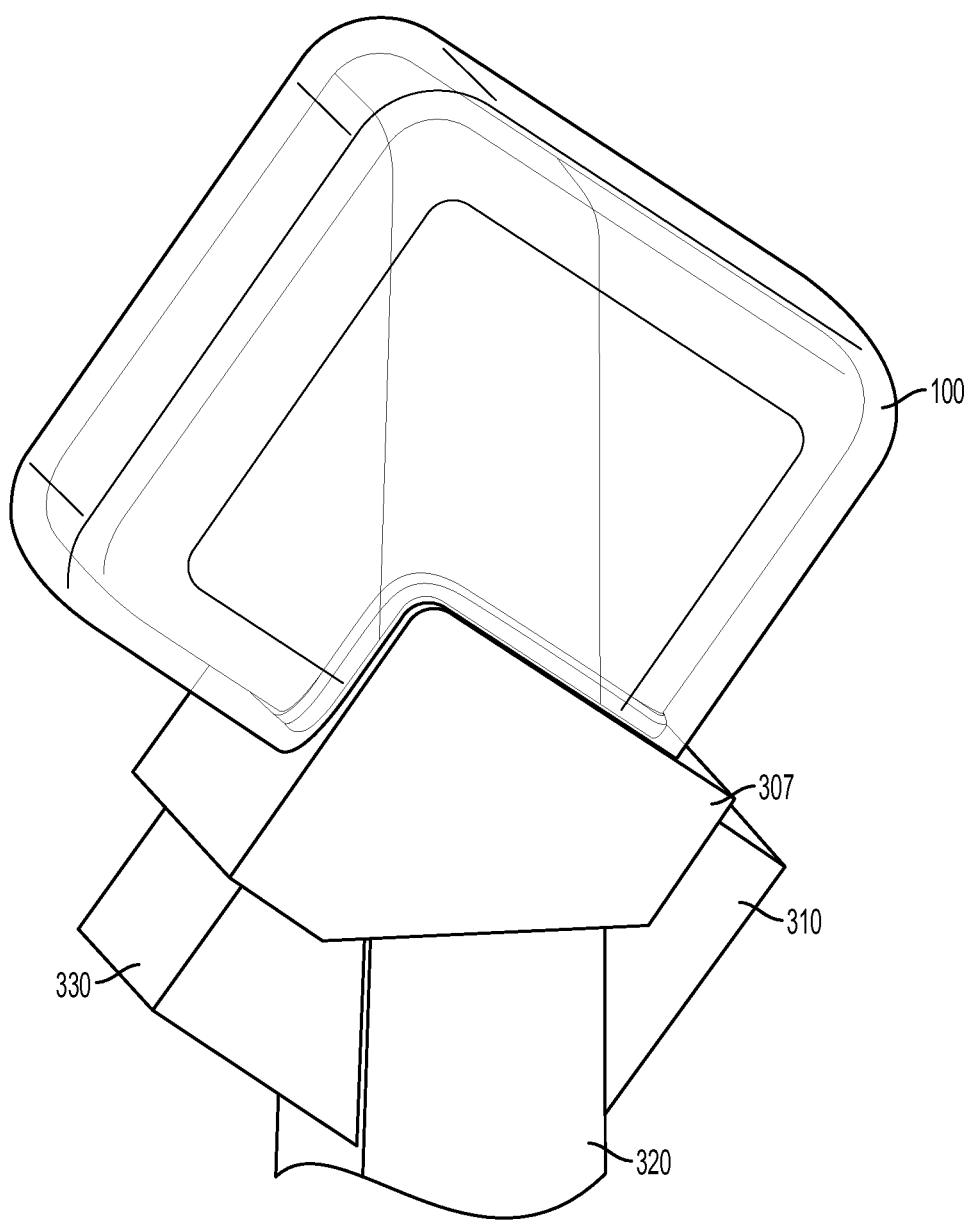
FIG. 5H illustrates a parallel projection view of an example housing of unitary construction with an example tooling insert extending therefrom.
Figure 5I:
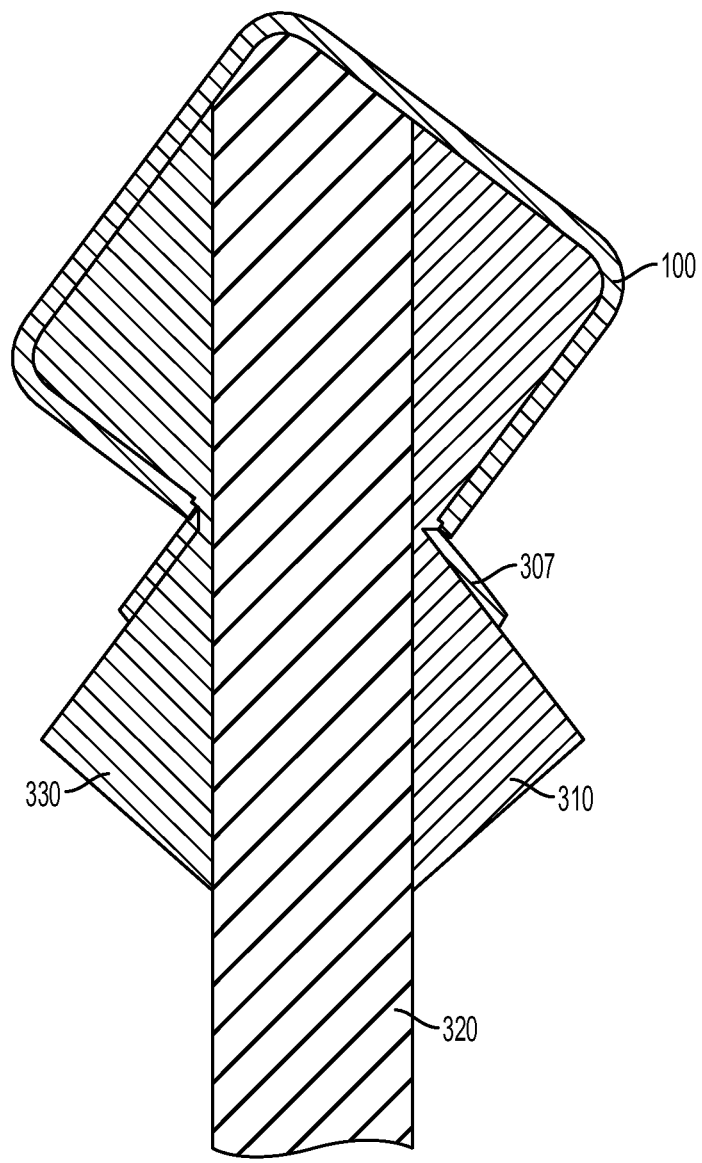
FIG. 5I illustrates a cross section side view of an example housing of unitary construction with an example tooling insert extending therefrom.

In accordance with various embodiments, the major interior slides 310, 320, and 330 may be retained by a ring 307 as illustrated in FIG. 5H and FIG. 5I. Ring 302 may be located in a position suitable to form 117 in the housing. A first ring surface 308 may form a portion of the aperture surface 117 and a second ring surface 309 may form another portion of the aperture surface 117. The ring 307 may also be sized sufficient to compress the major interior slides 310, 320, and 330 together as illustrated in the cross section of FIG. 5I. The ring 307 may aid in maintaining close tolerance between the major interior slides 310, 320, and 330 to limit any housing material from seeping between the major interior slides 310, 320, and 330 during the injection molding process. The opening in the ring 307 may correspond to the major aperture 130.

In accordance with various embodiments, the major internal mold assembly may be removable from the major aperture 130 in a variety of directions. For example FIGS. 5A-I illustrate the various slides (e.g. first major interior slide 310, second major interior slide 320, and third major interior slide 330) extracted in a direction that is not parallel to any of the walls housing walls. In another example, as illustrated in FIGS. 6A-B, one or more of the various slides (e.g. a first major interior slide 610, a second major interior slide 620, and a third major interior slide 630) may be removed parallel to at least one of the walls of the housing 100. The second major interior slide 620 may be removed at an angle to the housing 100 walls according to arrow 1. The first major interior slide 610 may be removed from housing 100 parallel with at least one wall according to arrow 2. The third major interior slide 630 may be removed from housing 100 parallel with at least one wall according to arrow 2.

In accordance with various embodiments, the various slides (e.g. a first major interior slide 610, a second major interior slide 620, and a third major interior slide 630) may be sized and configured in any way to fill the interior volume of housing 100. For example, the first major interior slide 610 may be larger or smaller than either of the other interior slides. The second major interior slide 620 may be larger or smaller than either of the other interior slides. The third major interior slide 630 may be larger or small than either of the other interior slides. Any combination of size and shape may be used to obtain the sought after size and shape of the housing 100. Aperture 130 and the various slide shapes and sizes may be varied in order to allow the various slides to be extracted through aperture 130 while forming an interior cavity for the housing 100.

In accordance with various embodiments, the various slides (e.g. the first major interior slide 610, and the third major interior slide 630) may include additional features for forming other aspects of the housing 100. For example, the first major interior slide 610 may include a lip feature 613 that corresponds to the retention lip 119. As such, the first major interior slide 610 may be configured to form the retention lip 119. The third major interior slide 630 may include a lip feature 633 that also corresponds to the retention lip 119. As such, the third major interior slide 630 may be configured to form the retention lip 119.

Injection Molding Tool with Simple Interior Slides

In accordance with the various embodiments, as discussed herein, the major internal mold assembly may be a portion of an injection molding tool. As illustrated in FIGS. 7A-I, an injection molding tool may include a lower exterior mold assembly 710 and an upper exterior mold assembly 720. In various embodiments, the injection molding tool may include external mechanical actuators. For example, the injection molding tool may include a hydraulic actuator 790 and hydraulic cylinder 792. The injection molding tool may receive a resin from an injection gate 721 which may be delivered by injection pump to an internal cavity in which the housing 100 is formed. The injection gate 721 may be configured for filling the housing cavity with the resin.

Figure 7A:
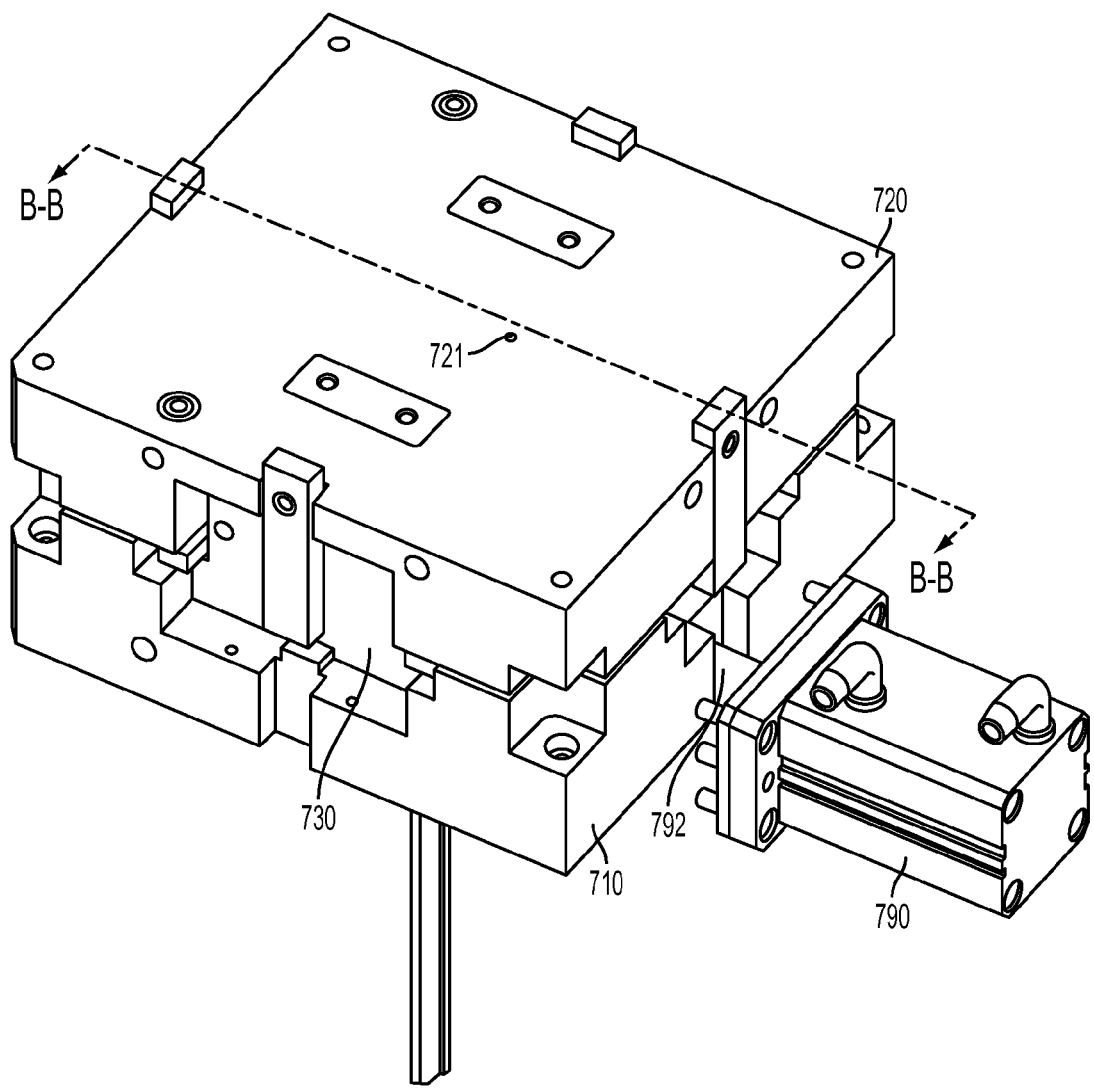
FIG. 7A illustrates a parallel projection view of an example injection molding tool for forming a housing of unitary construction.
Figure 7B:
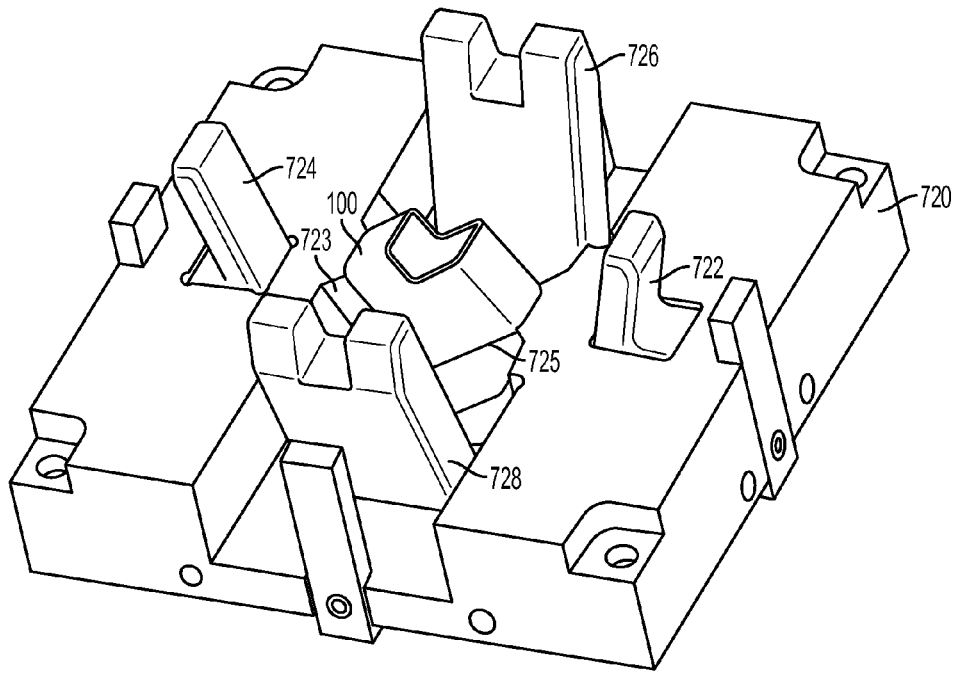
FIG. 7B illustrates a parallel projection view of an example top section of an injection molding tool for forming a housing of unitary construction.

As illustrated in FIG. 7B, an upper exterior mold assembly 720 may include a molding surface 723, and a molding surface 725. The molding surfaces 723 and 725 may be configured to form outer surfaces of the housing 100. For example, molding surface 723 may form the bottom surface 115c. Molding surface 725 may form the left surface 115e.

In various embodiments, the upper exterior mold assembly 720 may include a plurality of lances for engaging the lower exterior mold assembly 710. For example, the upper exterior mold assembly 720 may include one or more of a first lance 726, a second lance 728, a third lance 722, or a fourth lance 724. The lances may be configured to engage exterior slides in the lower exterior mold assembly 710. As the first lance 726, the second lance 728, the third lance 722, or the fourth lance 724 engage the lower exterior mold assembly the lances may compress exterior slides together to aid in forming the cavity that forms the housing 100.

Figure 7C:
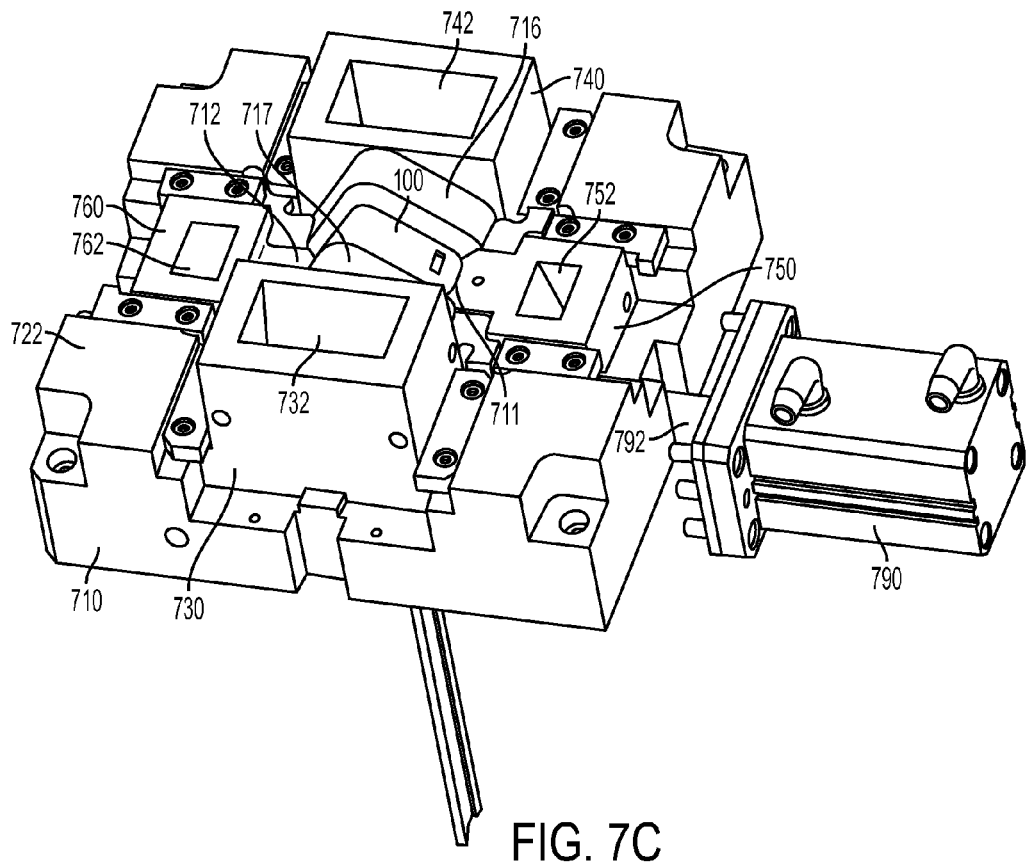
FIG. 7C illustrates a parallel projection view of an example bottom section of an injection molding tool for forming a housing of unitary construction.
Figure 7D:
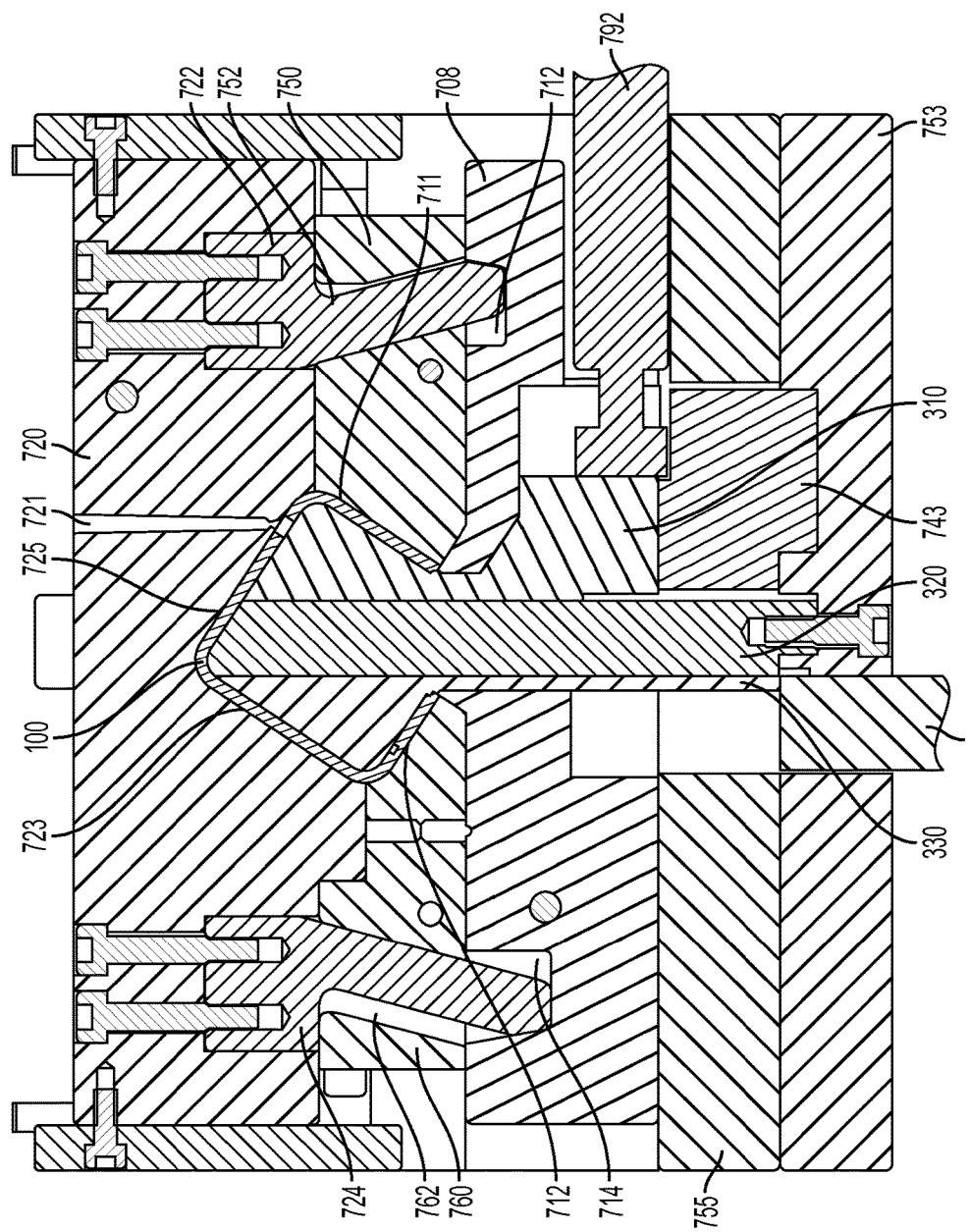
FIG. 7D illustrates a side cross section view of an example injection molding tool for forming a housing of unitary construction as viewed from section B-B in FIG. 7A.

As illustrated in FIGS. 7C and 7D, a lower exterior mold assembly 710 may include a lower core plate 753, an inner core plate 755, a first secondary slide 708, a second secondary slide 713 or a plurality of lance receptacles for engaging the upper exterior mold assembly 720. For example, the lower exterior mold assembly 710 may include one or more of a first lance receptacle 732, a second lance receptacle 742, a third lance receptacle 752, or a fourth lance receptacle 762. The first lance receptacle 732 may be an aperture in a first external slide 730. The first external slide 730 may have a molding surface 717 which forms an exterior surface of the housing 100. For example, the molding surface 717 may form the front surface 115b of the housing 100. The second lance receptacle 742 may be an aperture in a second external slide 740. The second external slide 740 may have a molding surface 716 which forms an exterior surface of the housing 100. For example, the molding surface 716 may form the back surface 115d of the housing 100. The third lance receptacle 752 may be an aperture in a third external slide 750. The third external slide 750 may have a molding surface 711 which may form an exterior surface of the housing 100. For example, the molding surface 711 may form the top surface 115a of the housing 100. The fourth lance receptacle 762 may be an aperture in a fourth external slide 760. The fourth external slide 760 may have a molding surface 712 which forms an exterior surface of the housing 100. For example, the molding surface 712 may form the left surface 115e of the housing 100. As discussed above, each of the lances may be configured to engage their respective receptacles forcing the respective slides to compress toward the center of the tool.

In accordance with various embodiments, the cavity for the housing 100 may nested in the injection molding tool in a verity of ways. For example, as illustrated in FIG. 7D, the upper exterior mold assembly 720 the exterior surface slide 750 and the exterior surface slide 760 are utilized to form the exterior surfaces 115e, 115c and 115f (see e.g. FIGS. 1A-C). It may be noted, as seen in FIG. 7D, that the upper exterior molds assembly 720 forms a plurality of the sides (e.g. left side 115e and right side 115c FIGS. 1A-C) of housing 100 and the exterior surface slide 750 and the exterior surface slide 760 form a single side of housing 100 each.

As illustrated in FIG. 7D, as indicated above, the lower exterior mold assembly 710 may include the first secondary slide 708 or the second secondary slide 713. The first secondary slide 708 may be positioned to mate with the first major interior slide 310. The first secondary slide 708 may also support the third external slide 750 when the upper injection assembly 720 and the lower exterior mold assembly 710 are mated together during the injection molding process. The first secondary slide 708 may also receive the third lance 722 into a secondary slide receptacle 715 which is an aperture within the upper portion of the body of the first secondary slide 708. The second secondary slide 713 may be positioned to mate with the third major interior slide 330. The second secondary slide 713 may also support the fourth external slide 760 when the upper injection assembly 720 and the lower exterior mold assembly 710 are mated together during the injection molding process. The second secondary slide 718 may also receive the fourth lance 724 into a secondary slide receptacle 714 which is an aperture within the upper portion of the body of the second secondary slide 713.

As illustrated in FIG. 7D, as indicated above, the lower exterior mold assembly 710 may include the lower core plate 753, the lower exterior mold assembly 710 may also include the inner core plate 755. The inner core plate 755 may be positioned between the lower core plate 753 and the second secondary slide 713. The inner core plate 755 may provide support to second secondary slide 713 or hydraulic cylinder 792. The lower core plate 753 may be positioned below the inner core plate 755. The lower core plate 753 may provide support to a core block 743. The lower core plate 753 may be in communication with the second major interior slide 320. The core plate 753 may be directly fixed to the second major interior slide 320. Alternatively, the core plate 753 may be attached to the second major interior slide through an intermediary slide. The core plate 753 may have an aperture extending through the core plate 753 such that an ejector block 733 may extend through the lower core plate 753 and contact the third major interior slide 330.

Figure 7E:
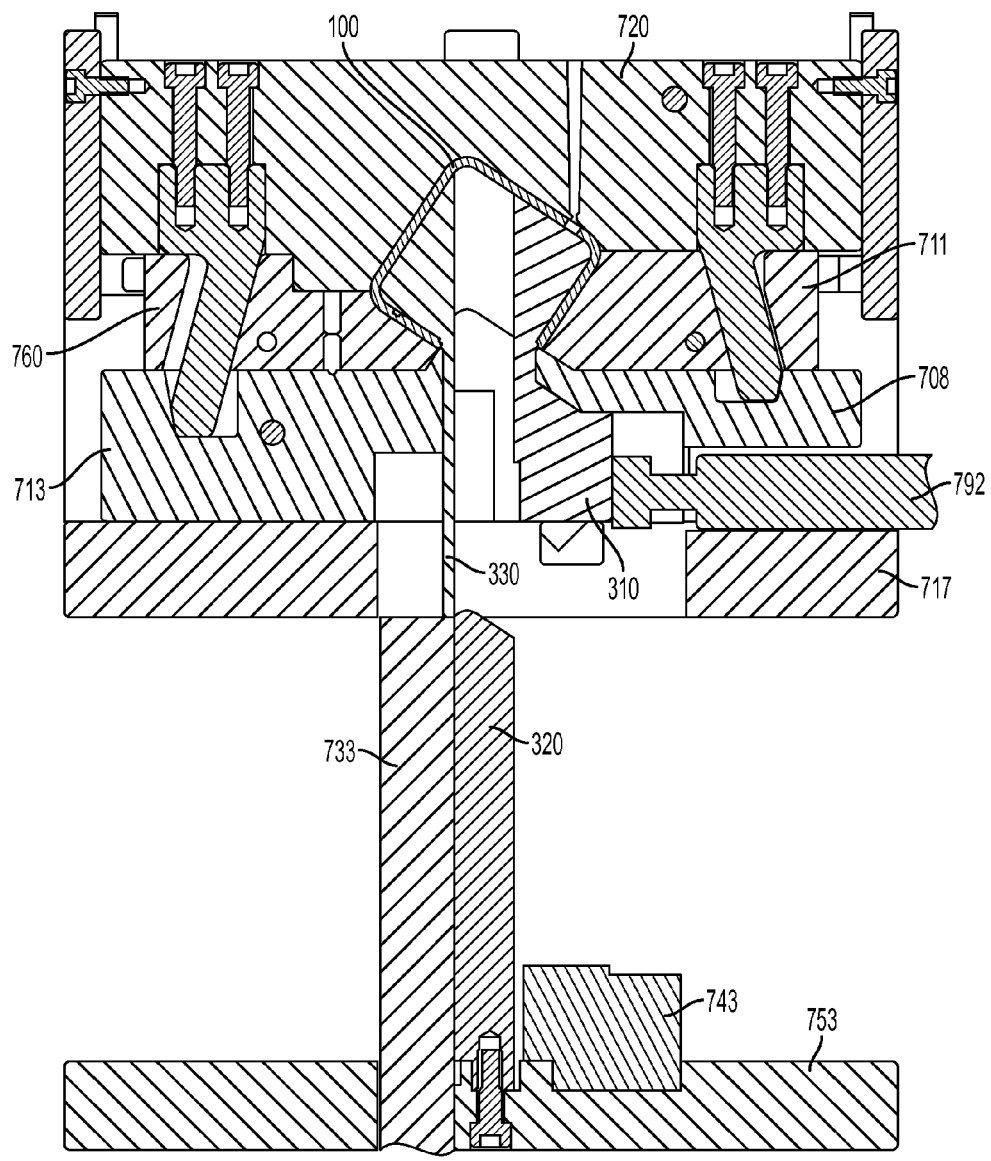
FIG. 7E illustrates a side cross section view of an example injection molding tool for forming a housing of unitary construction as viewed from section B-B in FIG. 7A.
Figure 7F:
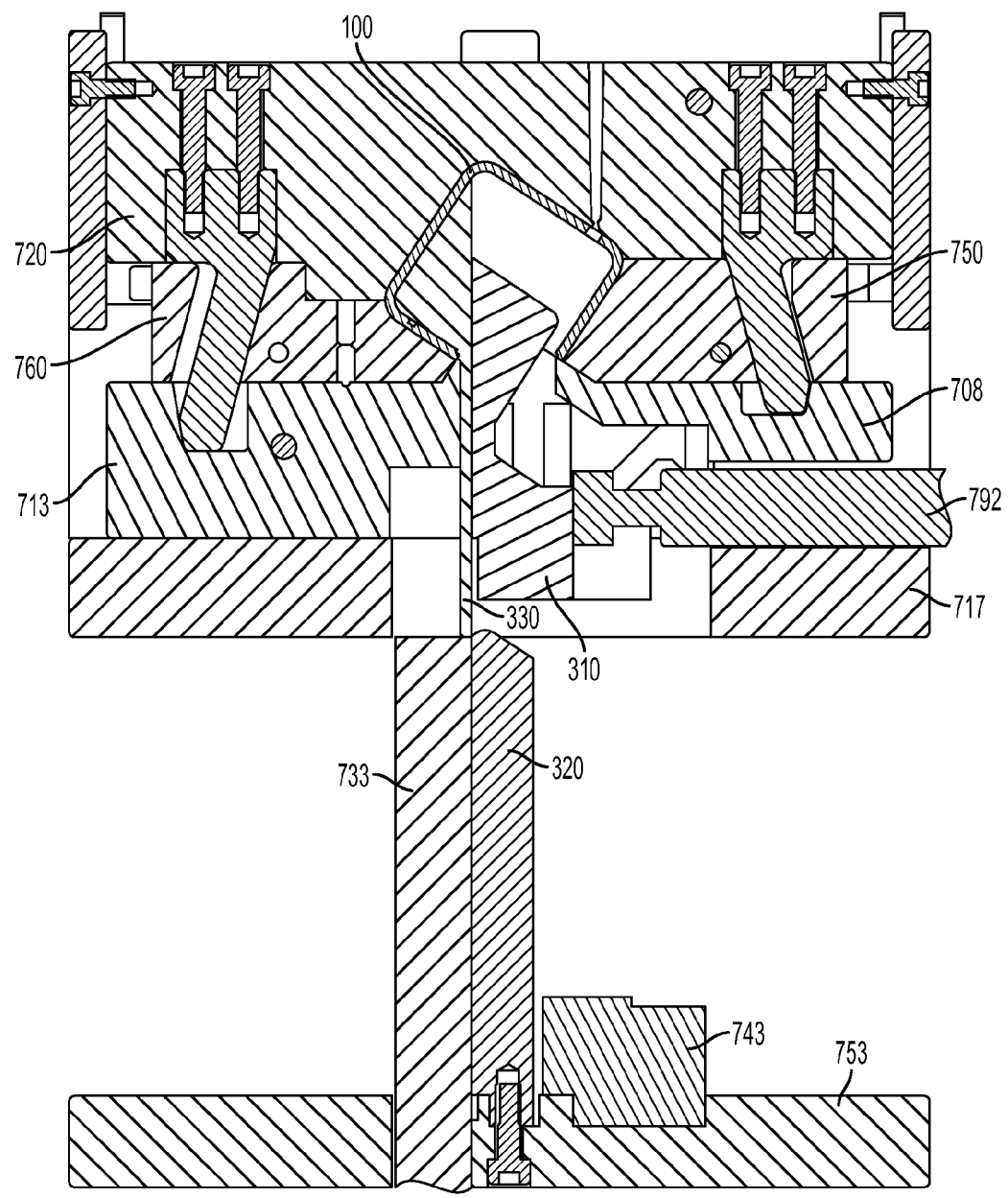
FIG. 7F illustrates a side cross section view of an example injection molding tool for forming a housing of unitary construction as viewed from section B-B in FIG. 7A.

As illustrated in FIG. 7E, the lower core plate 753 may be configured to be removable from the rest of the injection molding tool. Being attached to the second major interior slide 320, removal of the core plate may additionally withdraw the second major interior slide 320 from the interior of the injection molding cavity and the interior of housing 100. The lower core plate 753 may be configured to slide down the ejector block 733 which stays in place during the removal of the lower core plate 753.

As illustrated in FIG. 7E, the hydraulic cylinder 792 may be configured to extend in the direction of arrow 1 illustrated in FIG. 7E. An engagement between the first major interior slide 310 and the hydraulic cylinder 792 may cause the first major interior slide 310 to slide toward the third major interior slide 330. The first major interior slide 310 may be able to contact the third major interior slide 330. In this position the first major interior slide 310 may be operable to be pulled down and extracted from housing 100.

Figure 7G:
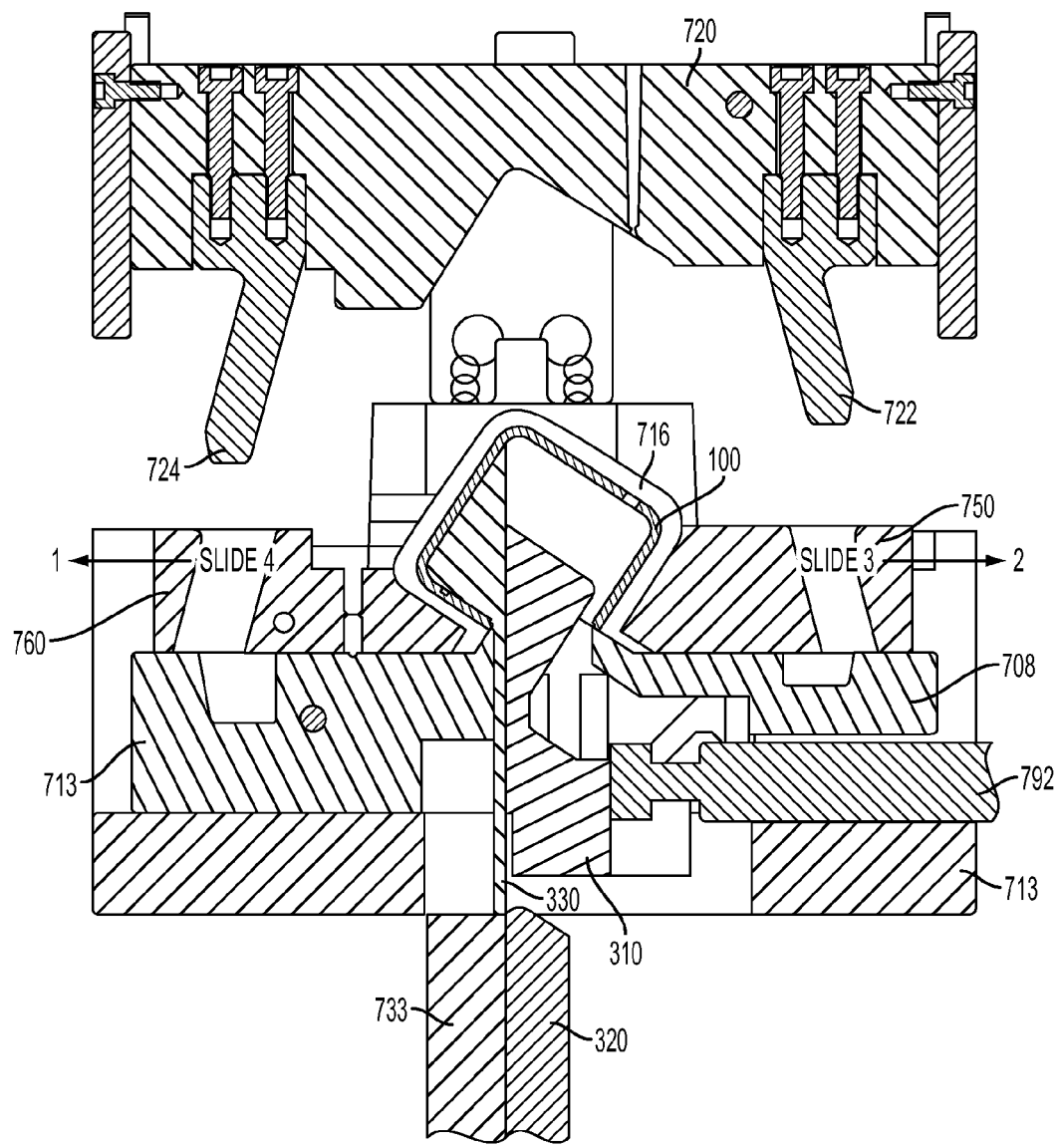
FIG. 7G illustrates a side cross section view of an example injection molding tool for forming a housing of unitary construction as viewed from section B-B in FIG. 7A.

As illustrated in FIG. 7G, the third external slide 750 and the fourth external slide 760 may be translated laterally away from the housing 100 along arrows 1 and 2 respectively. This movement of the third external slide 750 and the fourth external slide 760 may remove the mold from the top surface 115a and the right surface 115f exposing them to the environment outside of the injection molding tool. The upper injection assembly 720 may be translated up and away from the housing 100. This movement of upper injection assembly 720 may remove the mold from the left surface 115e and the bottom surface 115c exposing them to the environment outside.

Figure 7H:
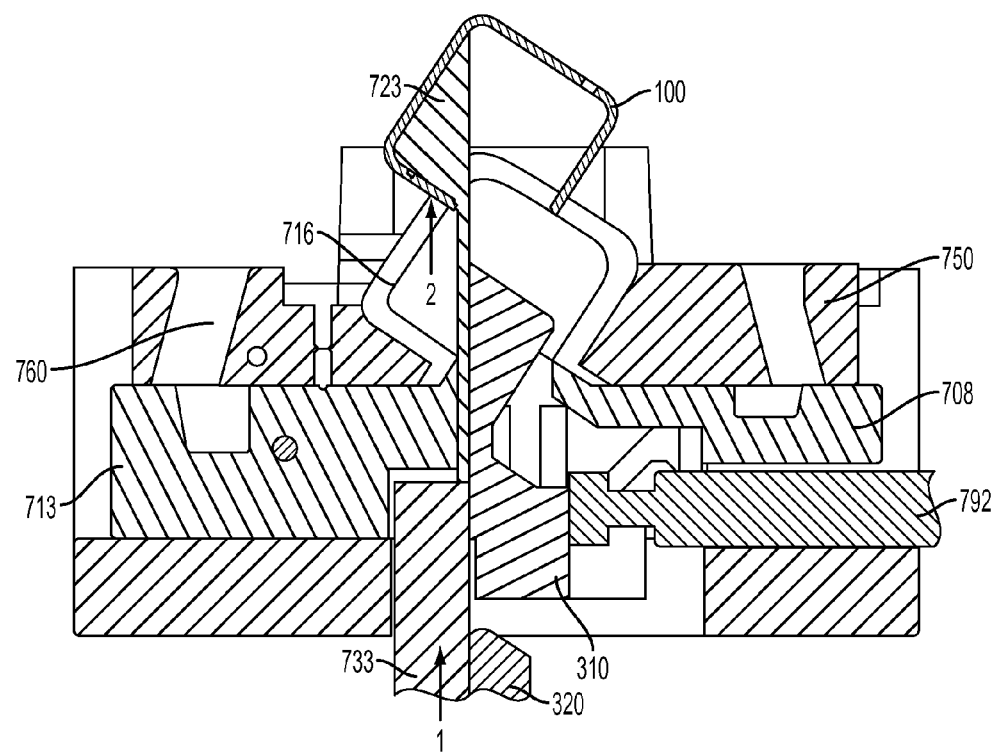
FIG. 7H illustrates a side cross section view of an example injection molding tool for forming a housing of unitary construction as viewed from section B-B in FIG. 7A.
Figure 7I:
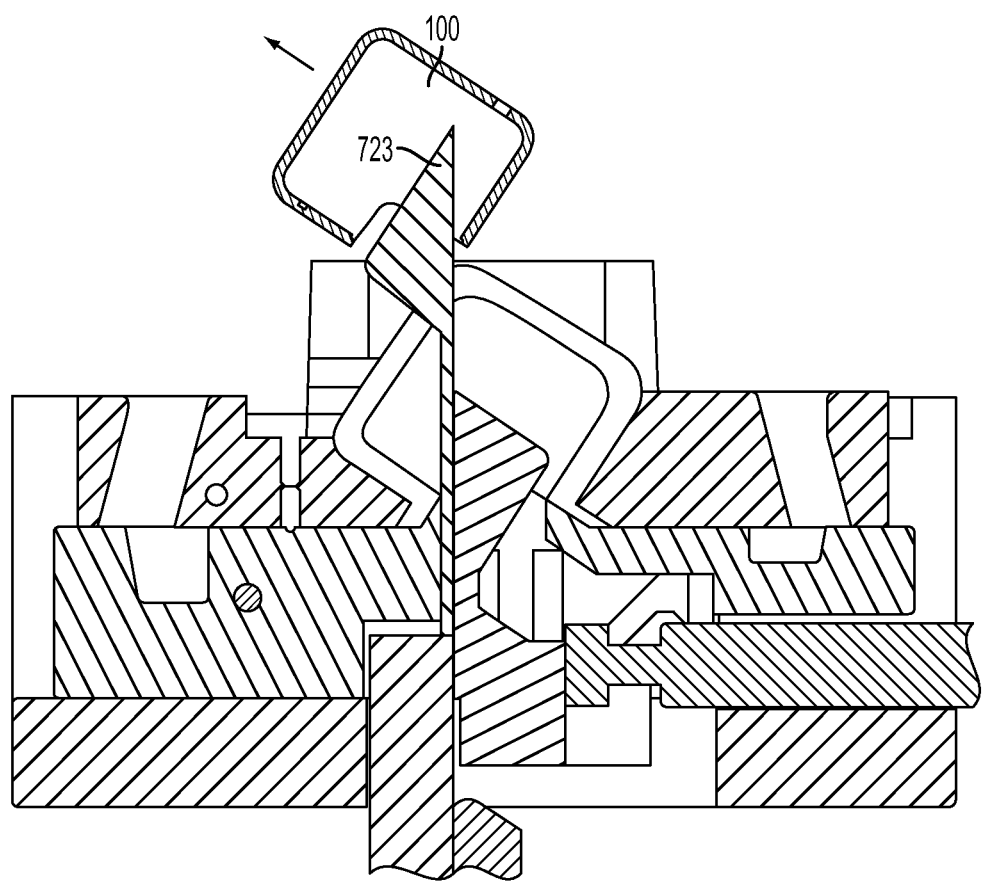
FIG. 7I illustrates a side cross section view of an example injection molding tool for forming a housing of unitary construction as viewed from section B-B in FIG. 7A.

As illustrated in FIG. 7H, the ejector block 733 may be inserted into the mold assembly toward housing 100. The ejector block 733 may be inserted in the direction of arrow 1 as illustrated in FIG. 7H. As the ejector block 733 may contact the third major interior slide 330, the third major interior slide 330 may also be forced up through the lower external mold assembly. With the third major interior slide 330 still located in the housing 100, the housing 100 may be lifted up out of the lower external mold assembly along arrow 2 as illustrated in FIG. 7H. Once the housing is lifted up and out of the lower external mold assembly the housing 100 may be removed off of the third major interior slide 330 in the direction of arrow 1 as illustrated in FIG. 7I.

Figure 8A:
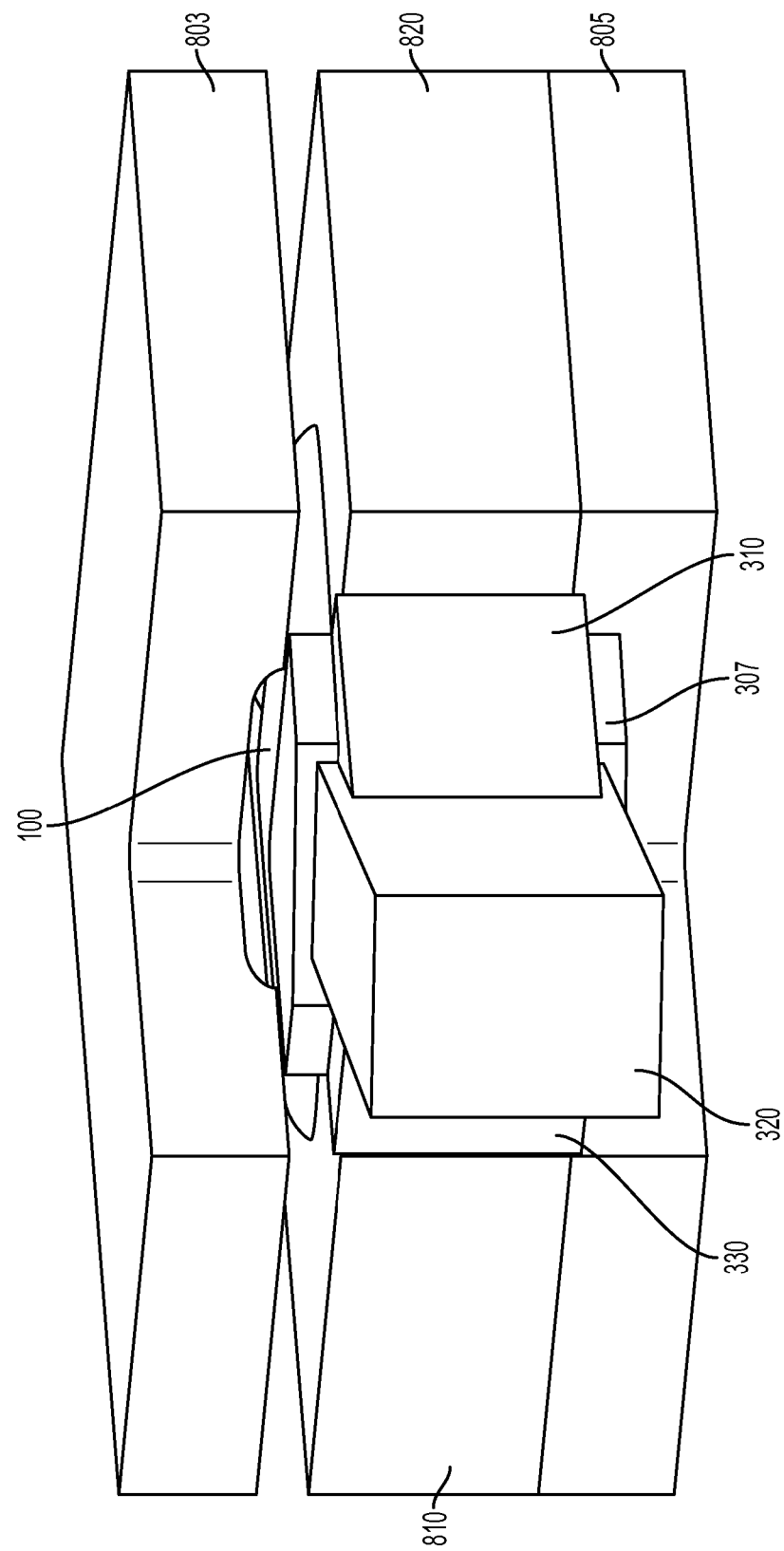
FIG. 8A illustrates parallel projection view of a portion of an example injection molding tool for forming a housing of unitary construction.

Alternatively, the injection tool may have the various components arranged to form housing 100 utilizing different injection molding plates and potentially limiting the parts of the tool used to form the exterior surfaces of housing 100. For example, as illustrated in FIG. 8A, the injection tooling may include an upper plate 803, a lower plate 805, a first exterior plate 810, and a second exterior plate 820. The upper plate 803 and the lower plate 805 may form the front surface 115b and the back surface 115d (the front and back surfaces as shown in FIGS. 1-4). The injection tool may also include the first major interior slide 310, the second major interior slide 320, and third major interior slide 330. Similar to the embodiments discussed above in relationship to FIGS. 5H and 5I, the tool may comprise ring 307 which may form the aperture of housing 100 or retain the major interior slides 310, 320, and 330. However it may be noted that the inclusion is merely one embodiment that may variously by combined with or separated from any of the other embodiments as discussed herein. For example, FIGS. 8B-8J do not specifically mention the ring but instead the major interior slides 310, 320, and 330 form the aperture of housing 100 and engage one another without the added support of ring 100. However, the ring 100 may still be included as shown in FIGS. 8K-8M.

Figure 8B:
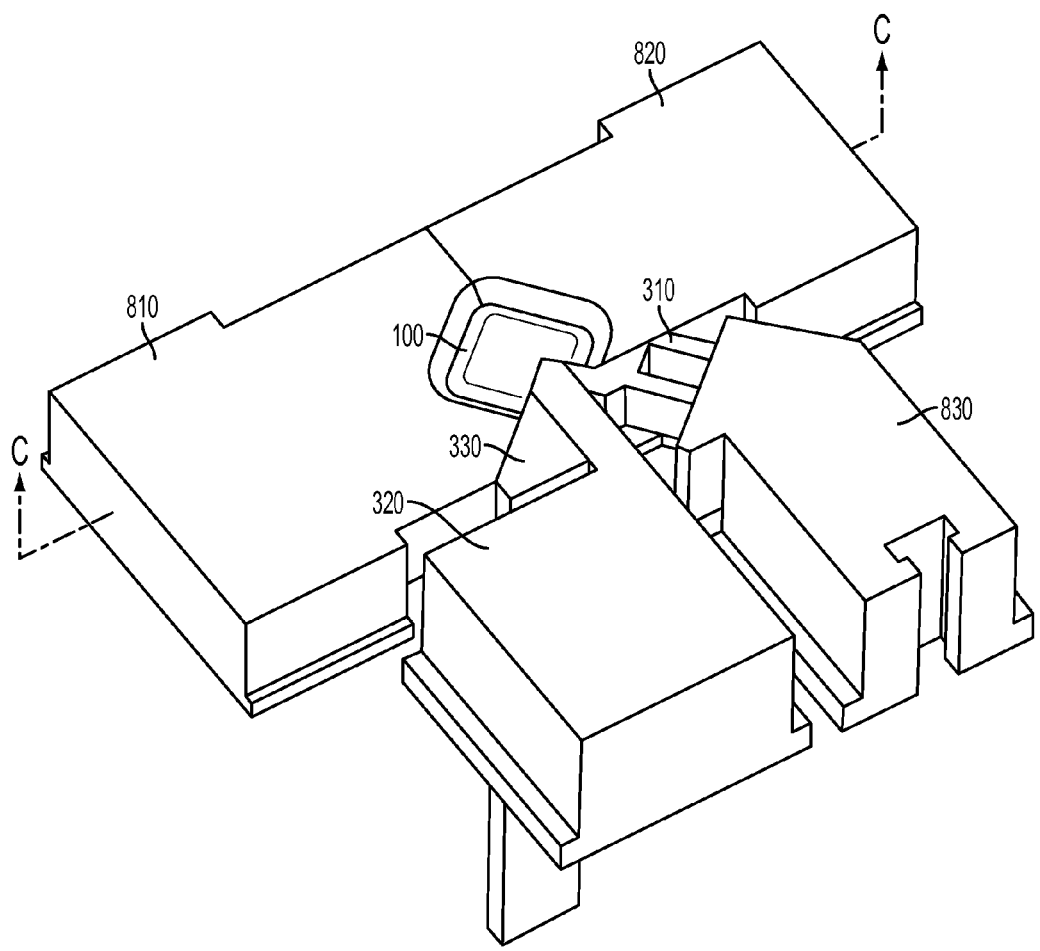
FIG. 8B illustrates parallel projection view of a portion of an example injection molding tool for forming a housing of unitary construction in accordance with the cross sections of FIG. 8C-J.
Figure 8C:
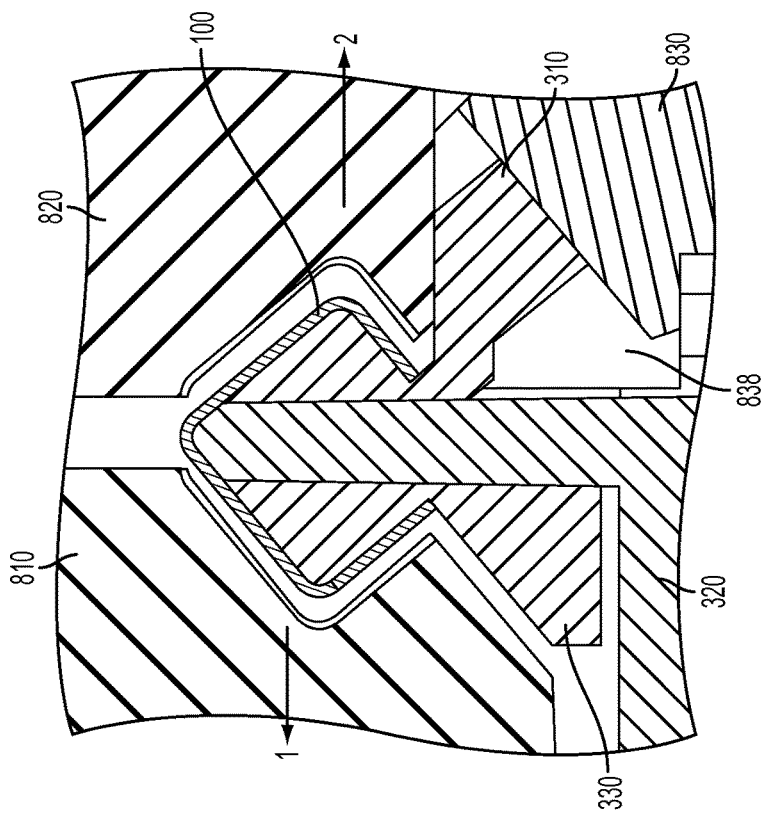
FIG. 8C illustrates a side cross section view of an example injection molding tool for forming a housing of unitary construction as viewed from a section C-C in FIG. 8B.

FIG. 8B illustrates the first exterior plate 810 and the second exterior plate 820 in the absence of the upper plate 803 and the lower plate 805. The first exterior plate 810 and the second exterior plate 820 may each form a plurality of the sides of housing 100. In this example, the first exterior plate 810 and the second exterior plate 820 are each configured to be separable from housing 100. The second exterior plate 820 may form bottom surface 115c and right surface 115f. The first exterior plate 810 may form left surface 115e and top surface 115a.

In accordance with various embodiments, as discussed above and illustrated in FIG. 8C the injection molding tool may also include a plurality of interior surface slides such as the third major interior slide 330, the second major interior slide 320, and the first major interior slide 310 which form the major interior mold assembly. As discussed above, the third major interior slide 330 and the second major interior slide 320 may be engaged with one another. The second major interior slide 320 and the first major interior slide 310 may be engaged with one another. Both engagements may be sufficiently tight to prevent resin form flowing between each of the slides but still allowing for each of the slides to move relative to one another. The tool may also include slide areas which may be utilized to move slides within the injection tool. For example, a slide area 838 may be located on one or more sides of the first major interior slide 310. The slide area 838 may allow the first major interior slide 310 to move relative to a third major exterior slide 830 within the injection molding tool. This movement may enable the first major interior slide 310 to exit the housing 100 after the housing is formed.

Figure 8D:
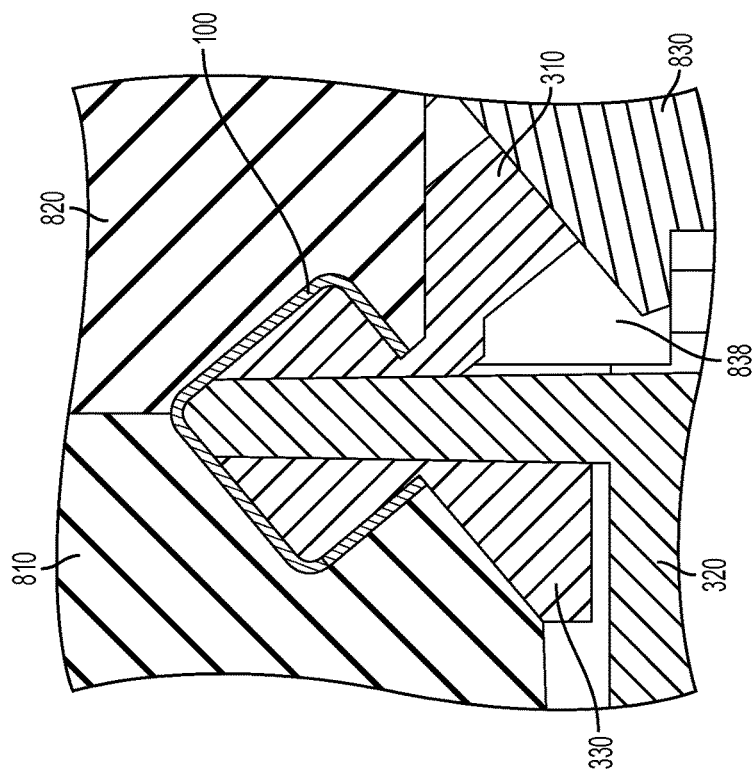
FIG. 8D illustrates an alternative side cross section view of an example injection molding tool for forming a housing of unitary construction as viewed from a section C-C in FIG. 8B.
Figure 8F:
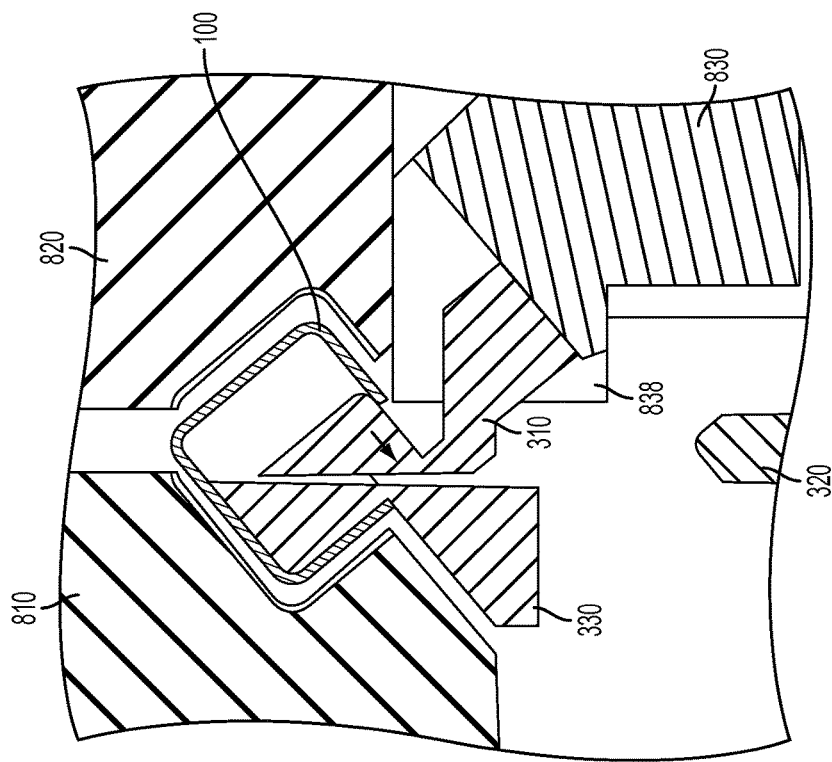
FIG. 8F illustrates an alternative side cross section view of an example injection molding tool for forming a housing of unitary construction as viewed from a section C-C in FIG. 8B.
Figure 8E:
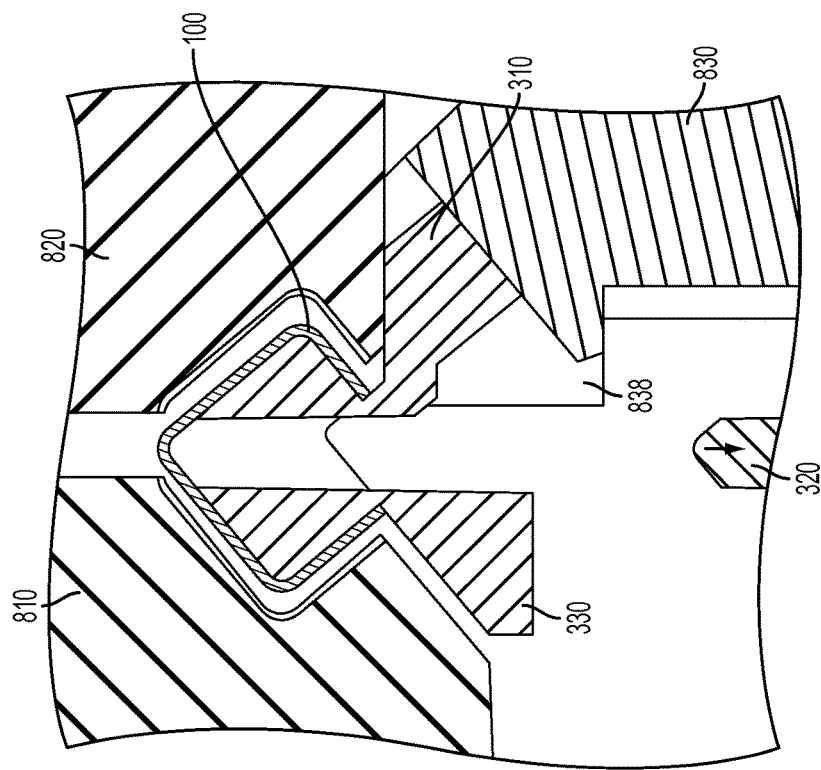
FIG. 8E illustrates an alternative side cross section view of an example injection molding tool for forming a housing of unitary construction as viewed from a section C-C in FIG. 8B.
Figure 8H:
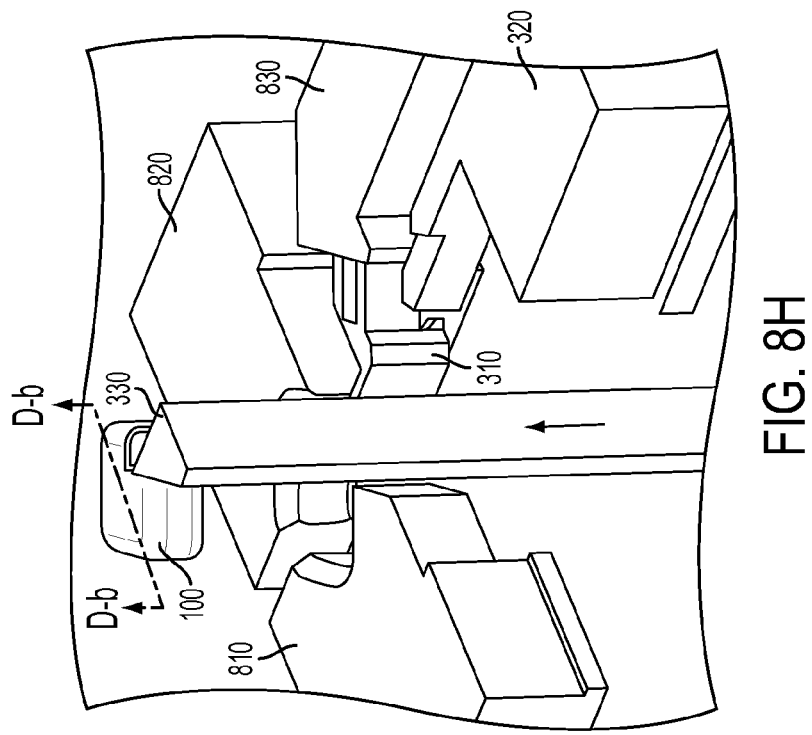
FIG. 8H illustrates a sectional parallel projection view of an example injection molding tool for forming a housing of unitary construction.
Figure 8G:
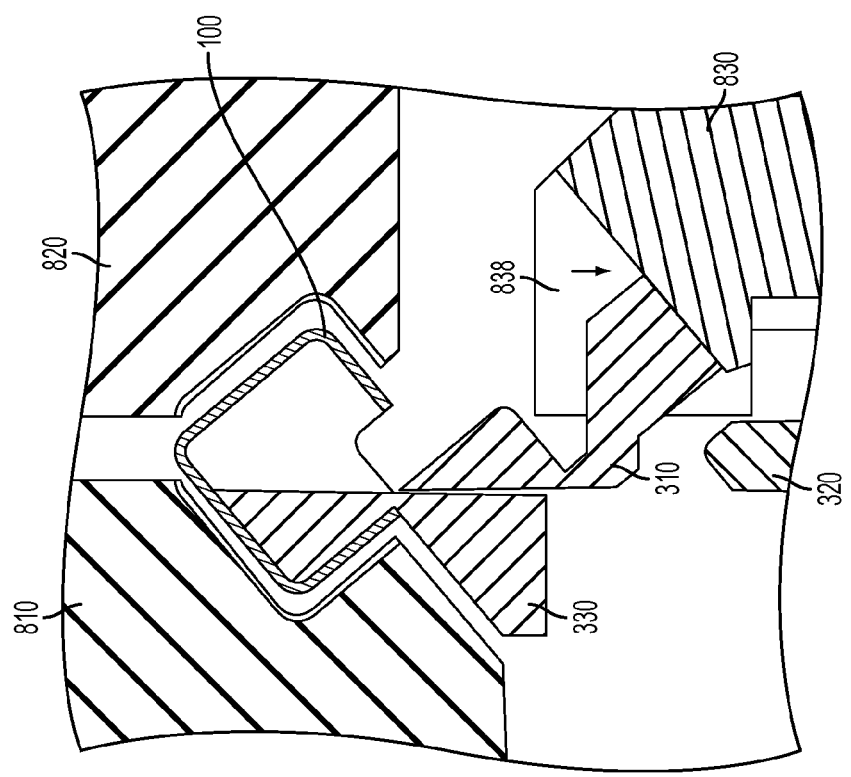
FIG. 8G illustrates an alternative side cross section view of an example injection molding tool for forming a housing of unitary construction as viewed from a section C-C in FIG. 8B.
Figure 8L:
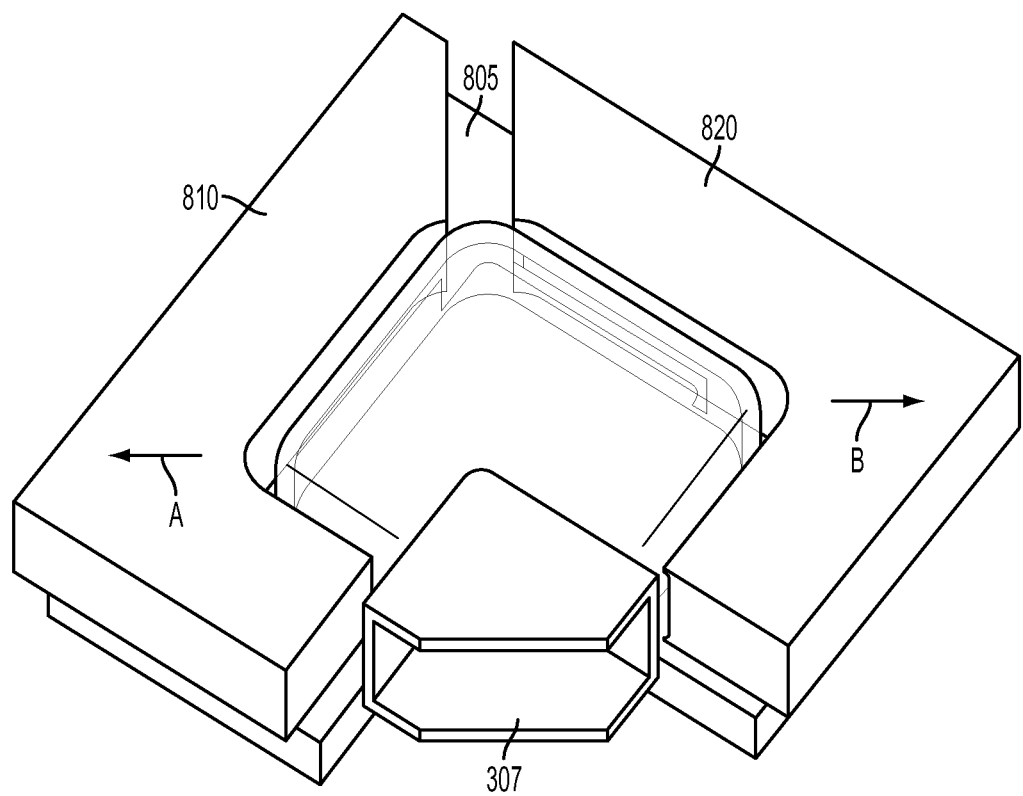
FIG. 8L illustrates a parallel projection view of a portion of an example injection molding tool for forming a housing of unitary construction.
Figure 8M:
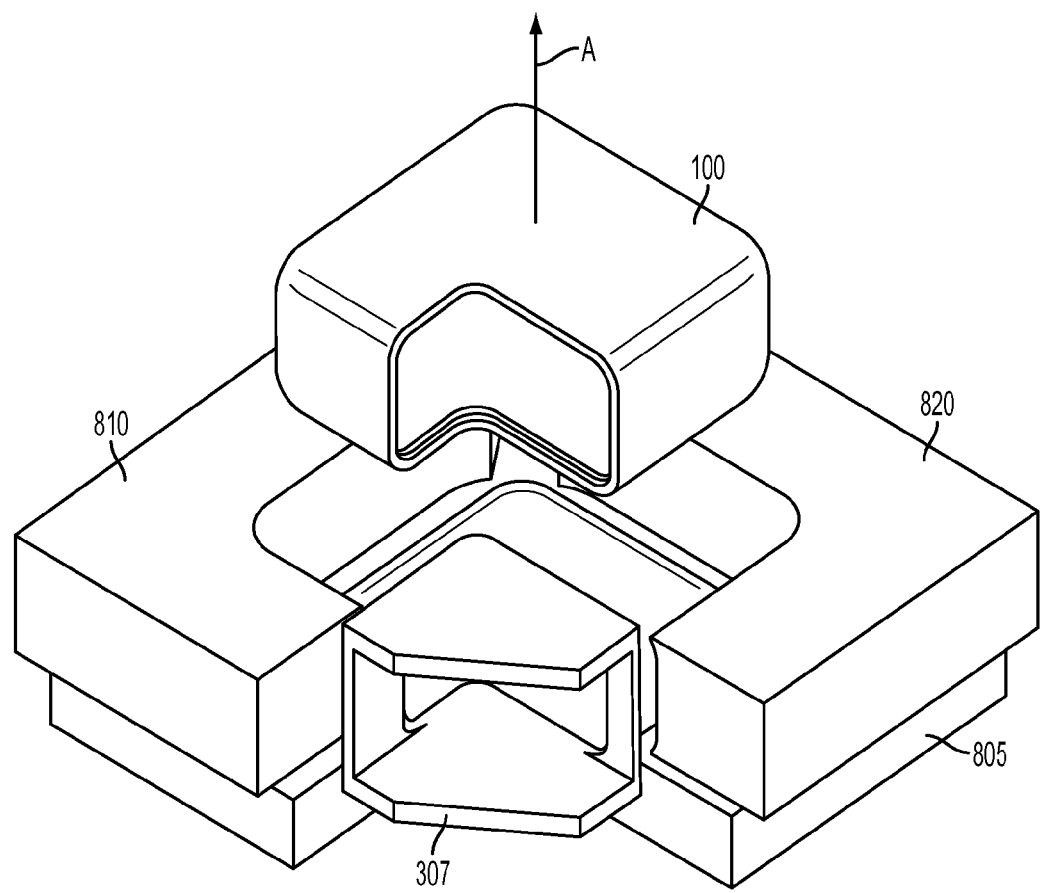
FIG. 8M illustrates a parallel projection view of a portion of an example injection molding tool for forming a housing of unitary construction.

As illustrated in FIG. 8D the first exterior plate 810 and the second exterior plate 820 may be separable exposing the housing 100 after molding is completed. The separation may occur along the directions of arrows 1 and 2 as shown in FIG. 8D. The second major interior slide 320 may be pulled out of the housing 100 along the direction of the arrow illustrated in FIG. 8E. The first major interior slide 310 may be pulled out of the housing 100 along the direction of the arrow illustrated in FIG. 8F. In this movement, the first major interior slide 310 may occupy the slide area 838 set aside for this translation of the first major interior slide 310. The third major exterior slide 830 may be moved along the direction of the arrow illustrated in FIG. 8G. The movement of the third major exterior slide 830 may pull the first major interior slide 310 out of the housing 100 in the direction of the arrow illustrated in FIG. 8G. The third major interior slide 330 may push (or pull) the housing 100 away from the other injection molding tool portions already separated. The movement of the housing 100 may be along the arrow illustrated in FIG. 8H. In this motion, the housing 100 may be suspended and/or touching the third major interior slide 330. The housing 100 may be removed from the third major interior slide 330 by translating the housing 100 in the direction of the arrow in FIG. 8I and then in the direction of the arrow in FIG. 8J.

As discussed above and illustrated in FIGS. 8K-8M, the injection molding tool may include ring 307. By utilizing ring 307 the major interior slides 310, 320, and 330 may be maintained together in tighter tolerances. After injection molding housing 100, the ring may be separated from the housing and other portions of the tool. Until major interior slides 310, 320, and 330 are entirely removed from the interior of the ring 307 the ring 307 may not be entirely separated from the injection molding tool. However, in accordance with various embodiments, once major interior slide 320 is removed from the interior of the housing 100 (along arrow A as shown in FIG. 8K) and out of ring 307, the ring 307 may be separated from the injection molding tool. In separating the ring 307 from the injection molding tool major interior slides 320 and 330 may be moved towards the interior of ring 307. In various examples, the ring 307 may be separated from the aperture of housing 100 along arrow D by 1 mm. Major interior slide 330 may move along arrow B (in one example arrow B may be 57 degrees off a line which can be depicted by direction of arrow A) and be removed from ring 307. Major interior slide 310 may move along arrow C (in one example arrow C may be 37 degrees off a line which can be depicted by direction of arrow A) and be removed from ring 307. After the major interior slides 310, 320, and 330 are removed, the 810 and the second exterior plate 820 may be separated as shown in FIG. 8L. Specifically 810 may be moved along arrow A and 820 may be moved along arrow B as shown in FIG. 8L. Subsequently the housing 100 may be separated from the lower plate 805, ring 307, the first exterior plate 810, and second exterior plate 820 along arrow A, as shown in FIG. 8M.

Injection Molding Tool with Compound Interior Slides

Figure 9A:
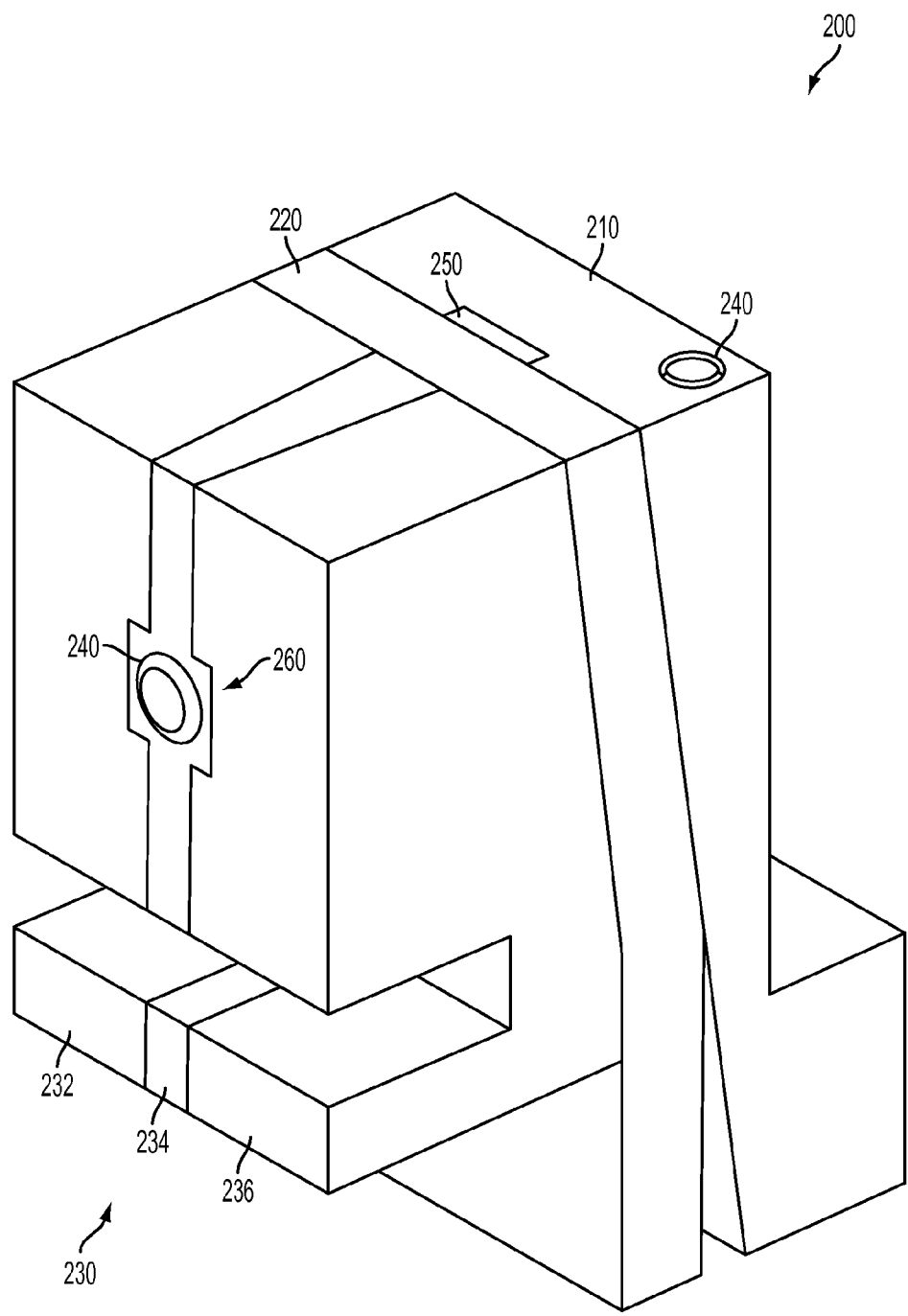
FIG. 9A illustrates a parallel projection view of an example of the movable components of an interior mold for a housing of unitary construction.
Figure 9B:
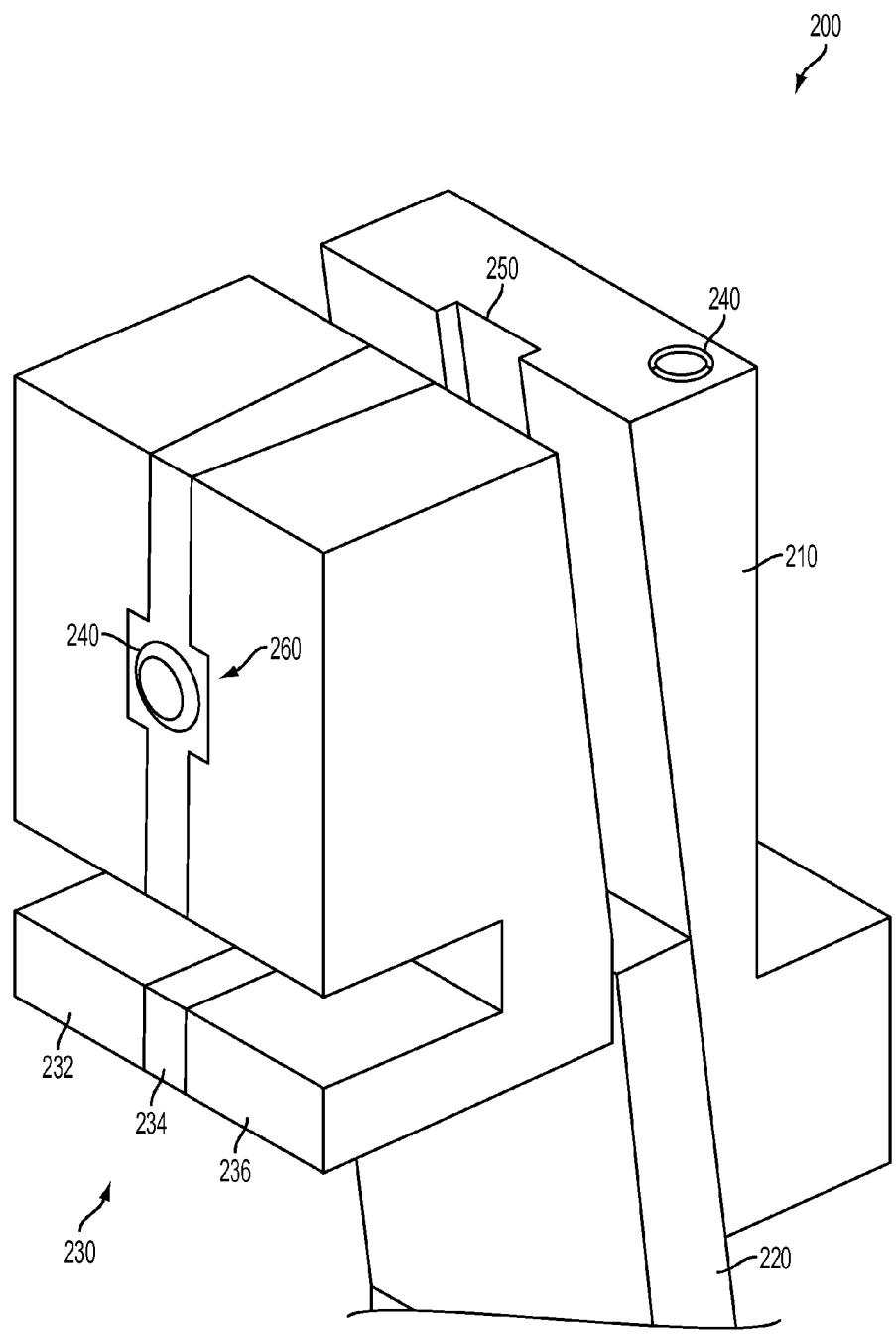
FIG. 9B illustrates a parallel projection view of an example of the movable components of an interior mold for a housing of unitary construction after a second component has been moved into a second position.
Figure 9C:
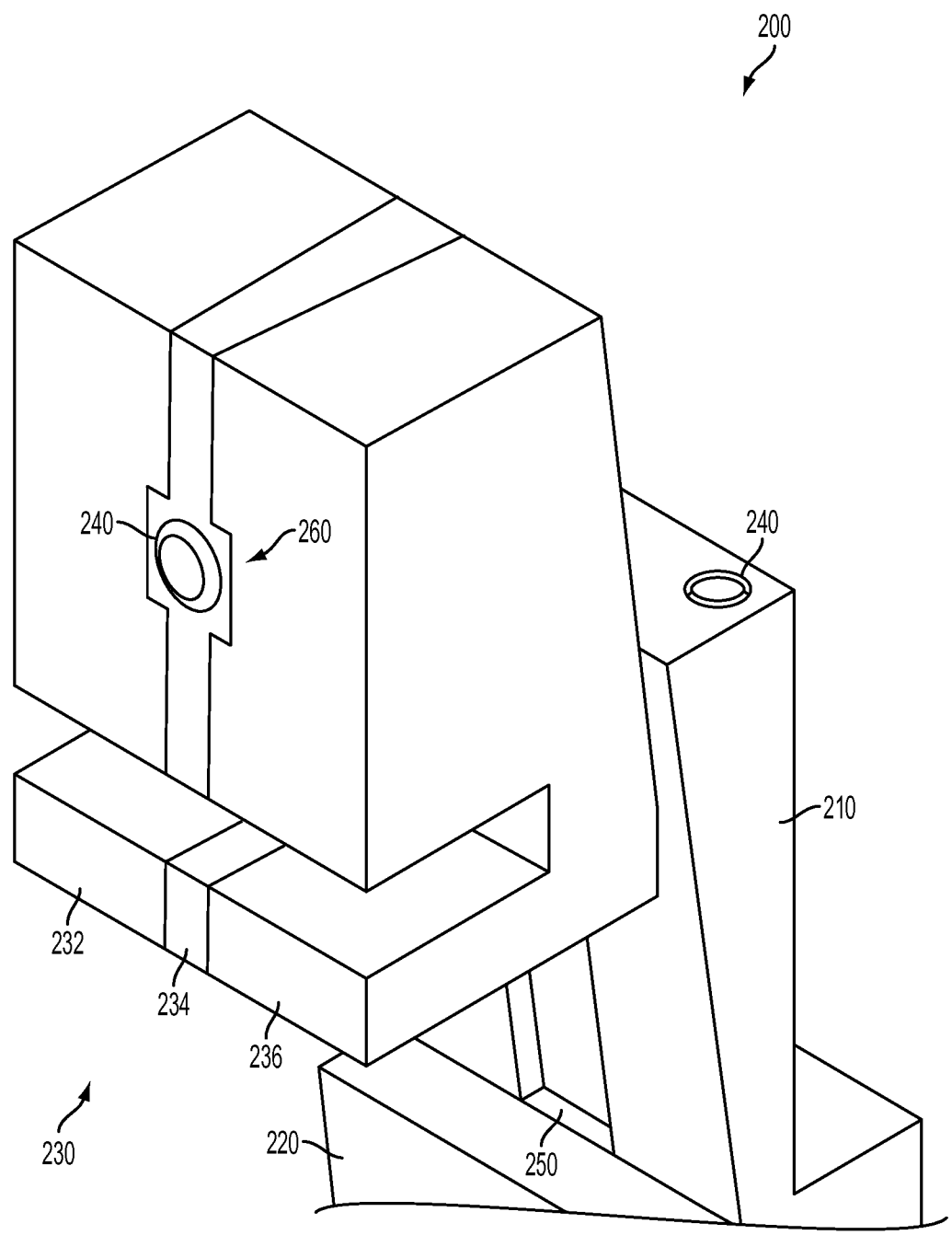
FIG. 9C illustrates a parallel projection view of an example of the movable components of an interior mold for a housing of unitary construction after a first and second component have been moved into a second position.
Figure 9D:
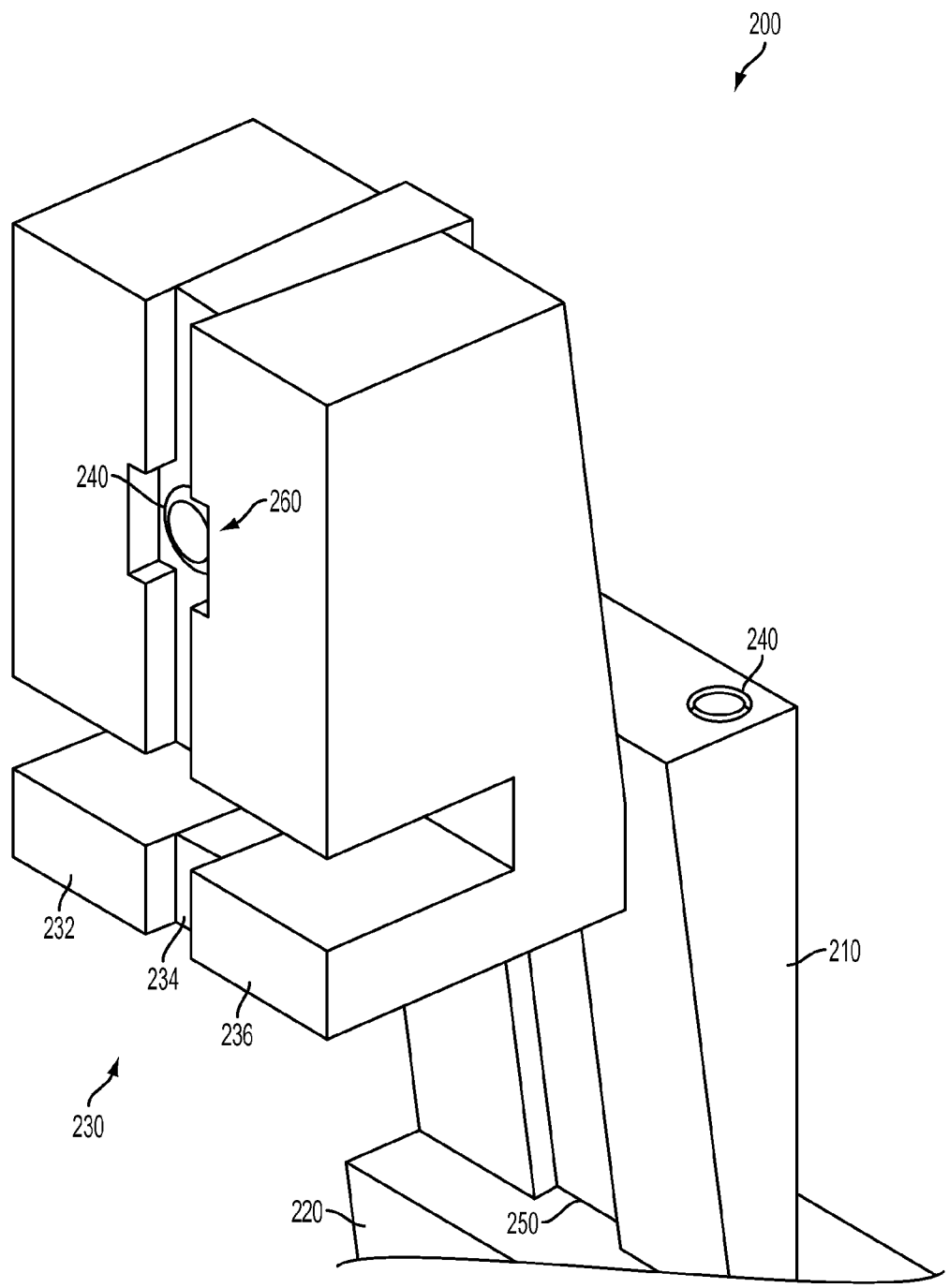
FIG. 9D illustrates a parallel projection view of an example of the movable components of an interior mold for a housing of unitary construction after a first and second component have been moved into a second position and a second minor component of the third major component has been moved into a second position, causing first and third minor components to compress.
Figure 9E:
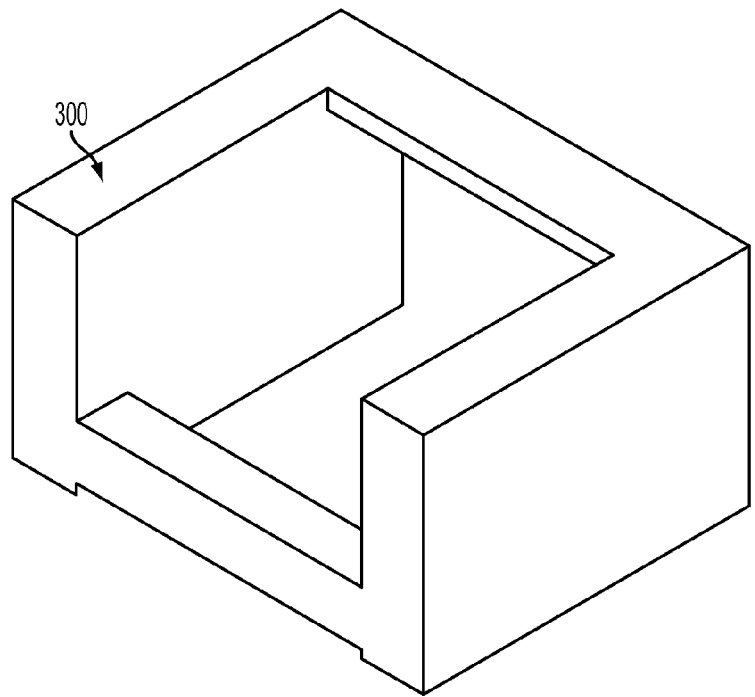
FIG. 9E illustrates parallel projection views of an example of an aperture mold assembly with a semitransparent molded housing overlay.
Figure 9F:
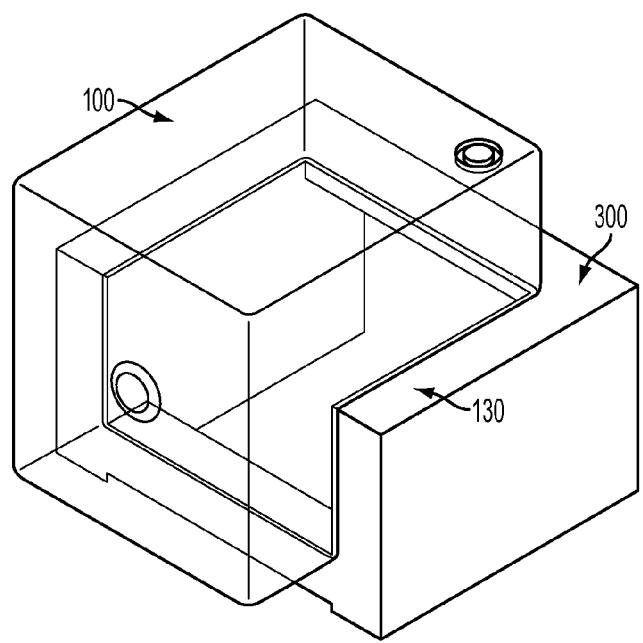
FIG. 9F illustrates parallel projection views of an example of an aperture mold assembly with a semitransparent molded housing overlay.
Figure 9G:
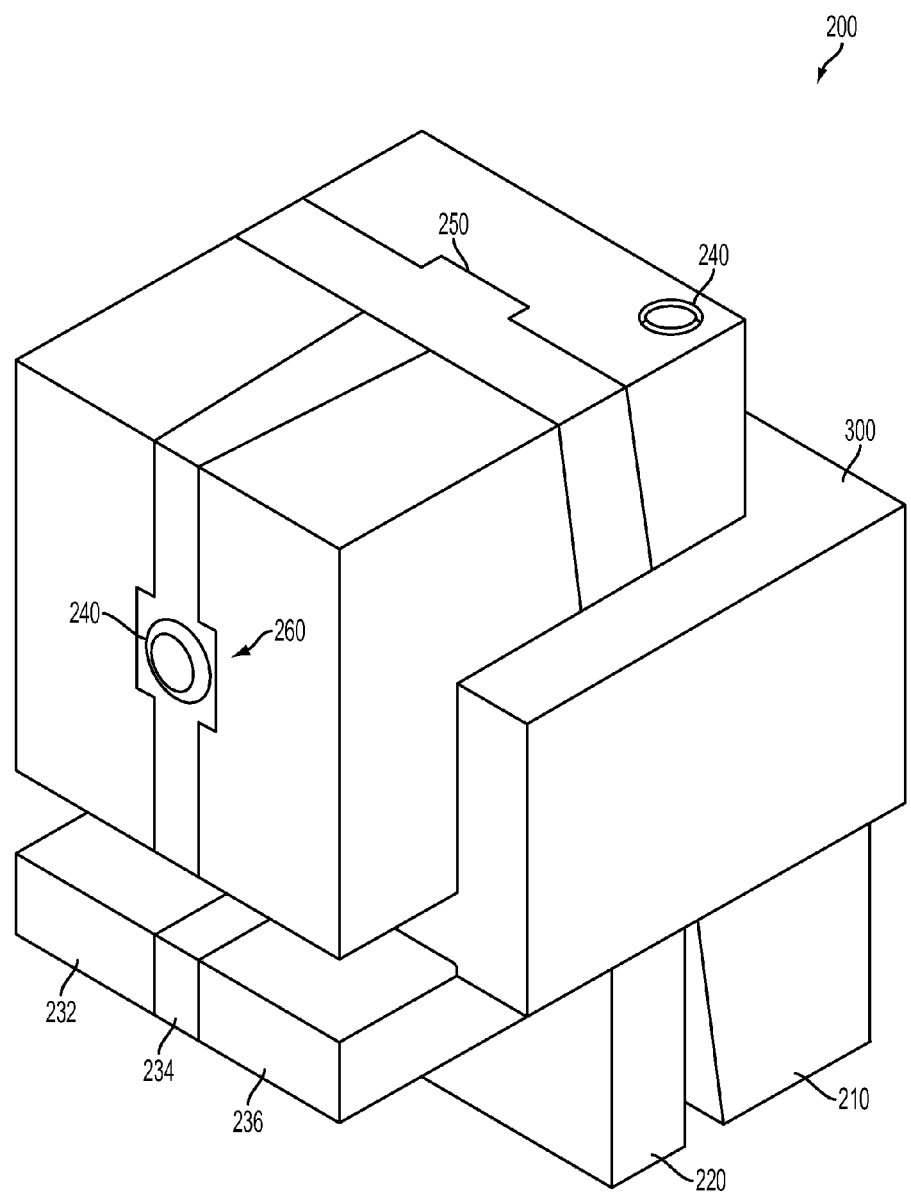
FIG. 9G illustrates a parallel projection view of an example of the movable components of an interior mold for a housing of unitary construction when assembled through an aperture mold assembly in a first position.
Figure 9H:
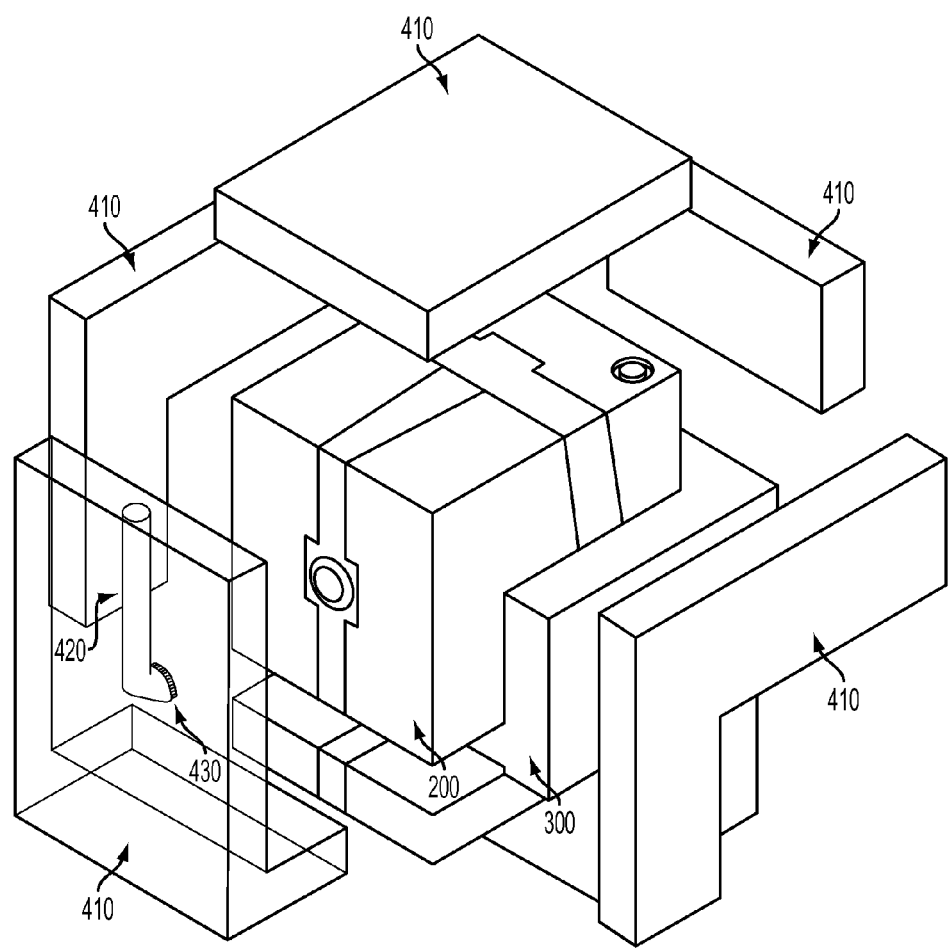
FIG. 9H illustrates a parallel projection view of an example of the movable components of an interior mold for a housing of unitary construction when assembled through an aperture mold assembly in a first position, where movable external mold components are ready to be assembled around the interior mold.
Figure 9I:
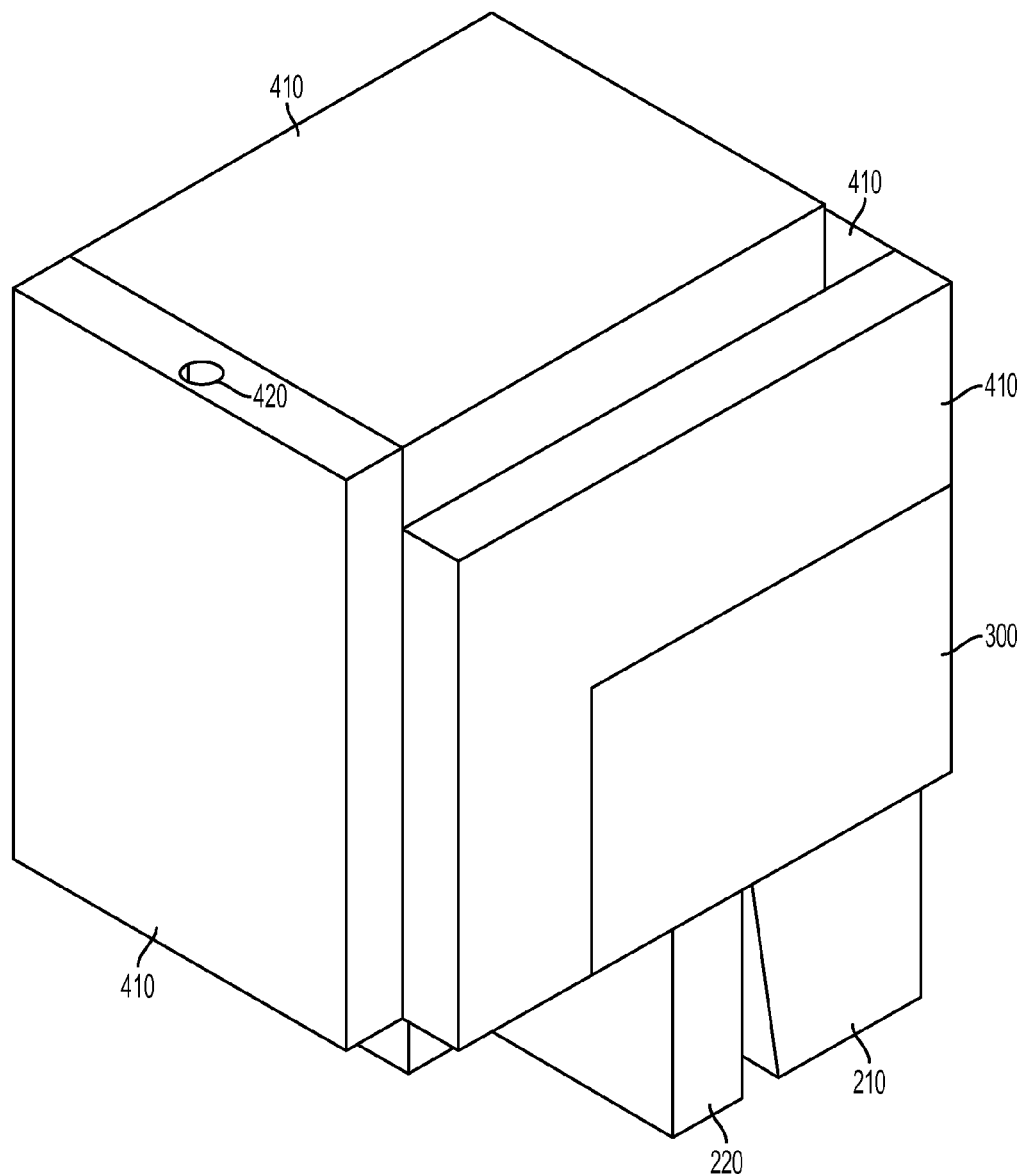
FIG. 9I illustrates a parallel projection view of an example of the movable components of an interior mold for a housing of unitary construction when assembled through an aperture mold assembly in a first position, where movable external mold components are assembled around the interior mold.
Figure 9J:
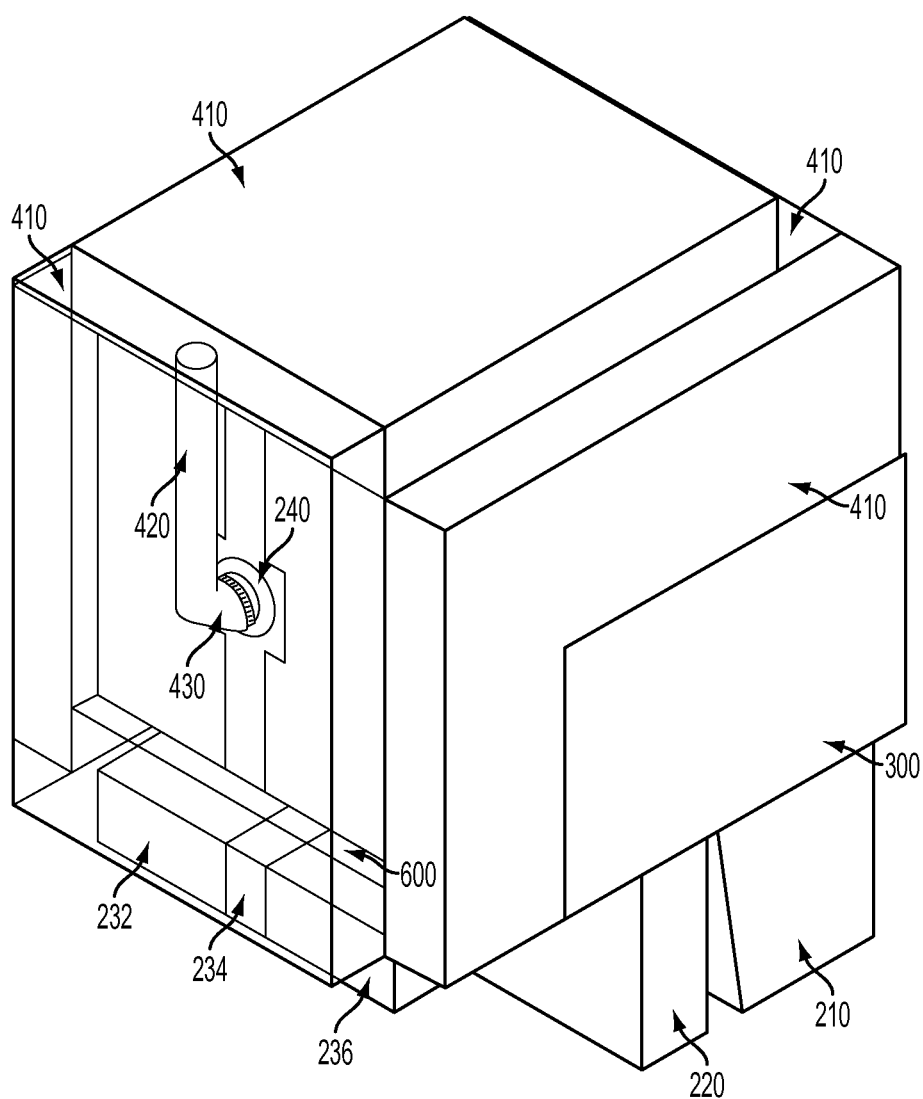
FIG. 9J illustrates a parallel projection view of an example of the movable components of an interior mold for a housing of unitary construction when assembled through an aperture mold assembly in a first position, where movable external mold components are assembled around the interior mold and a portion of the external mold is illustratively transparent to reveal both a runner and a gate for an injection molding process.
Figure 9K:
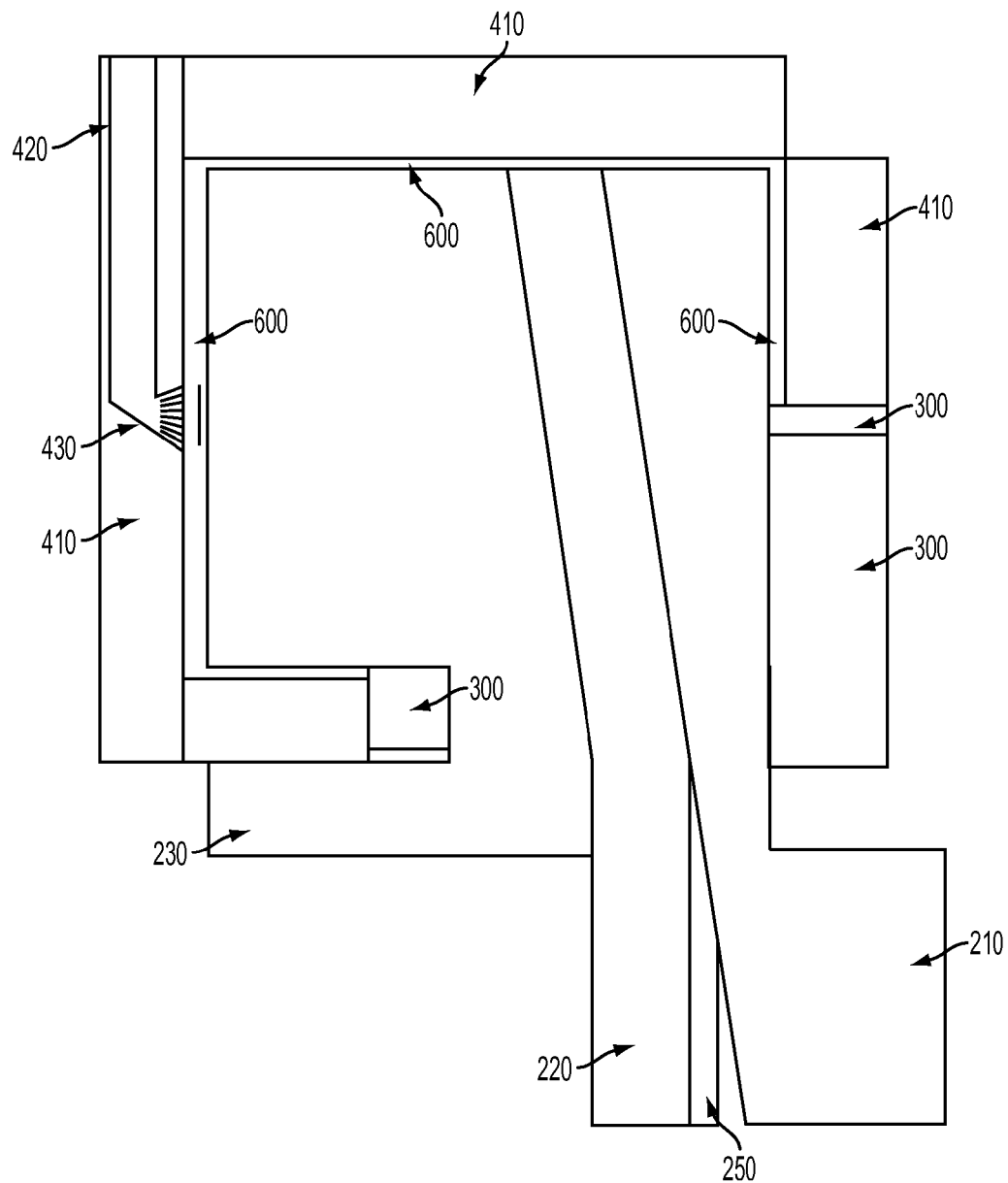
Figure 9L:
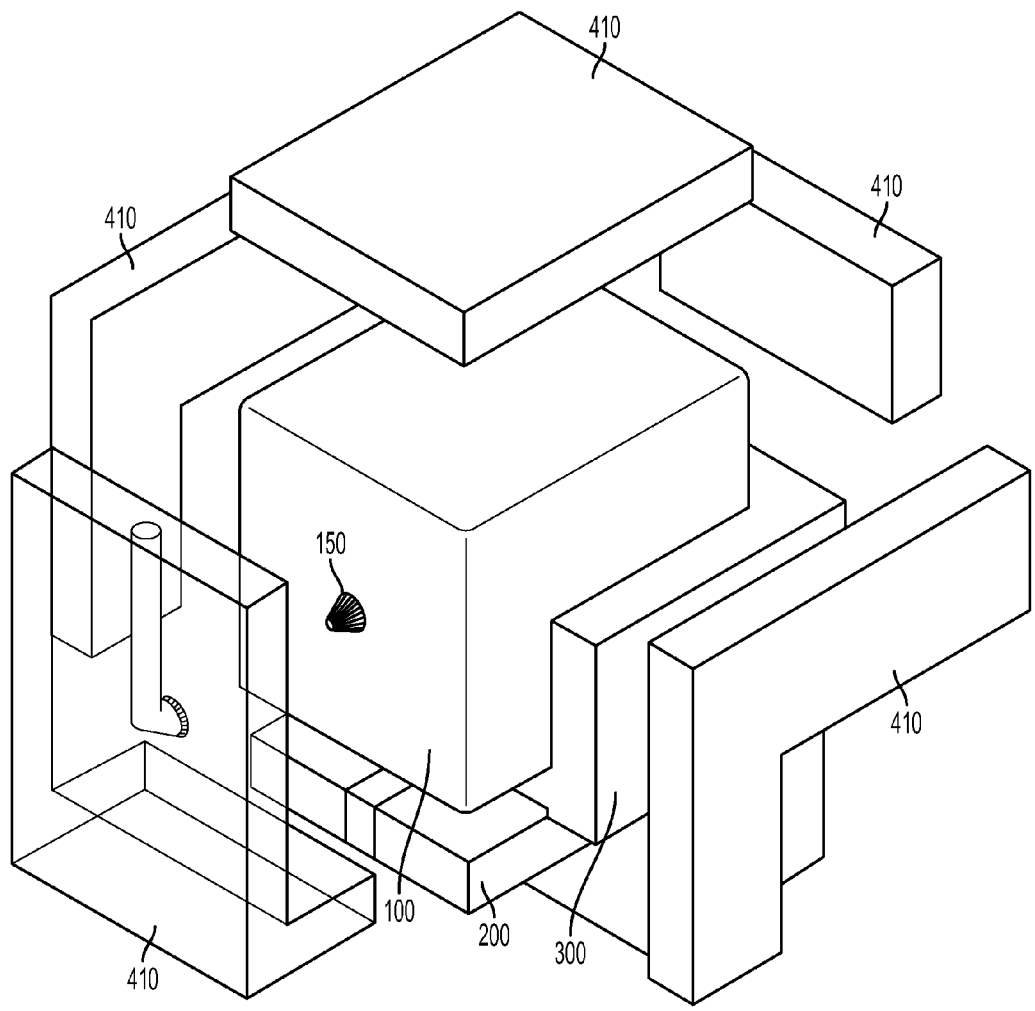
FIG. 9L illustrates a parallel projection view of an example of a completed mold formed around the movable components of an interior mold for a housing of unitary construction when assembled through an aperture mold assembly in a first position, where movable external mold components are separated from the exterior surface of the formed mold.
Figure 9M:
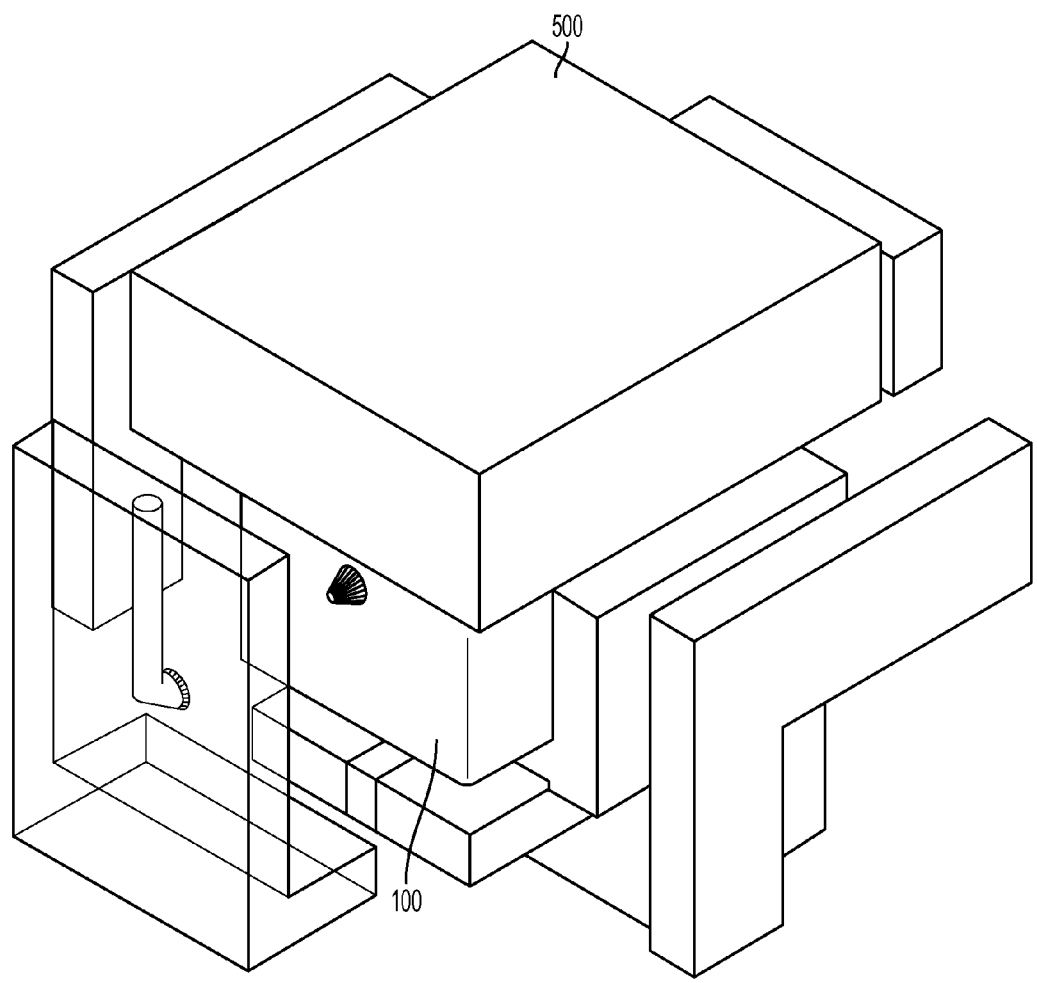
FIG. 9M illustrates a parallel projection view of an example of a completed mold formed around the movable components of an interior mold for a housing of unitary construction when assembled through an aperture mold assembly in a first position, where movable external mold components are separated from the exterior surface of the formed mold and a fixture has been coupled to the formed mold.
Figure 9N:
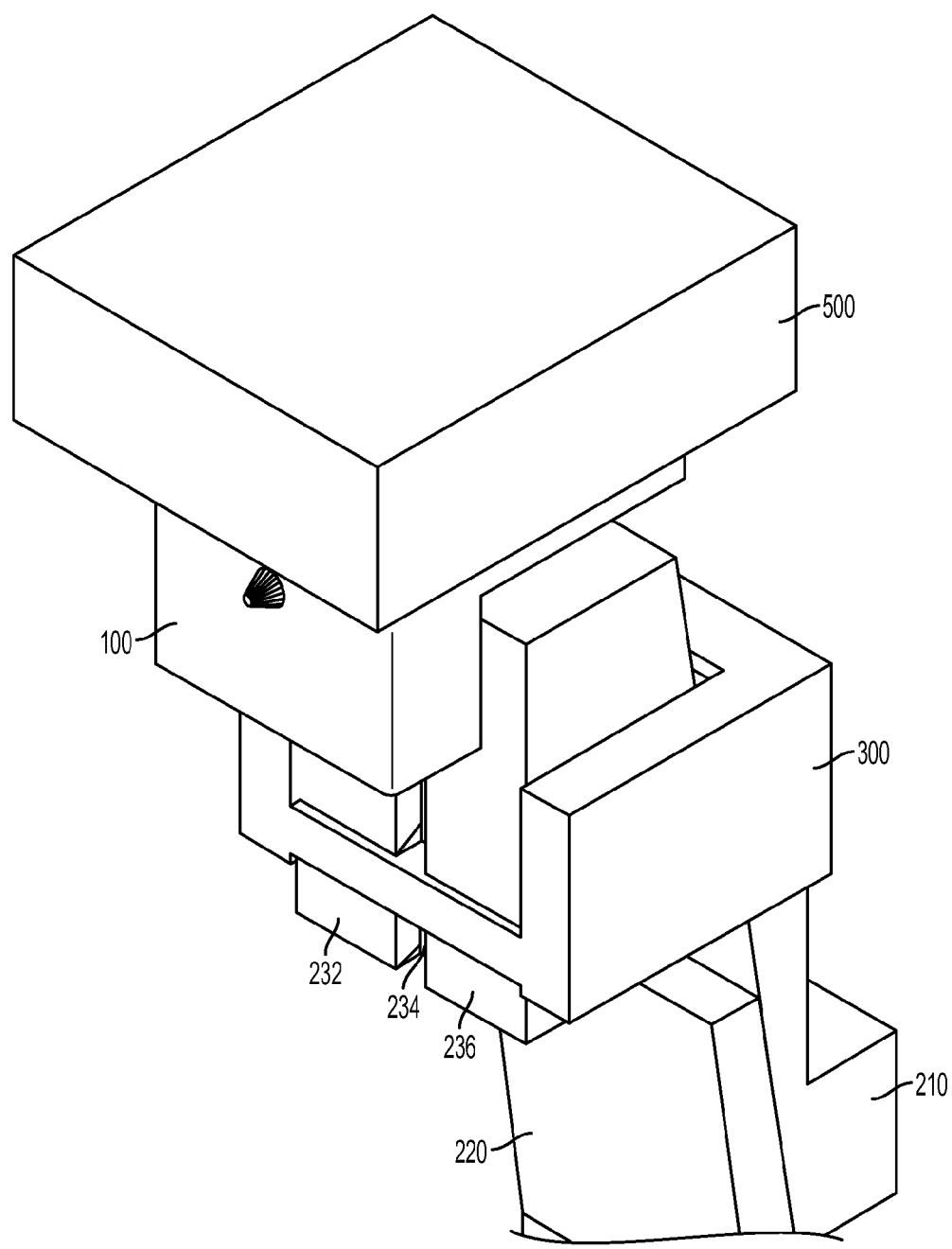
FIG. 9N illustrates a parallel projection view of an example of a fixture coupled to a formed mold being removed at an angle over a third major internal component of the mold, with the first and second internal mold components removed.
Figure 9O:
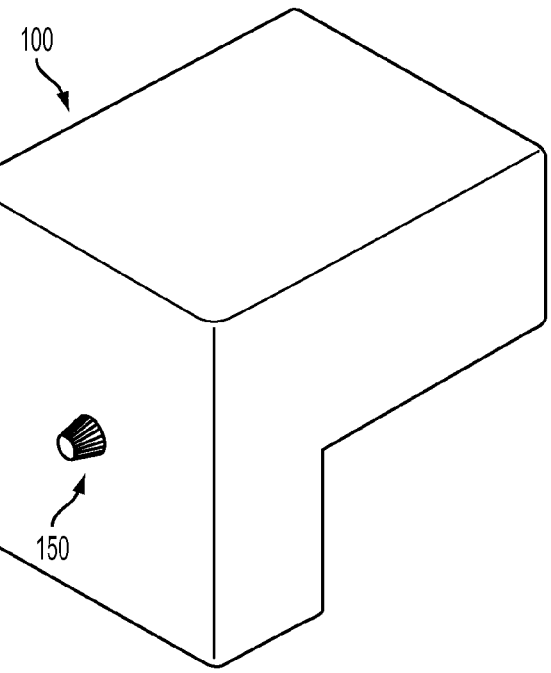
FIG. 9O illustrates a parallel projection view of an example of a housing of unitary construction with injection molding gate residue visible.
Figure 9P:
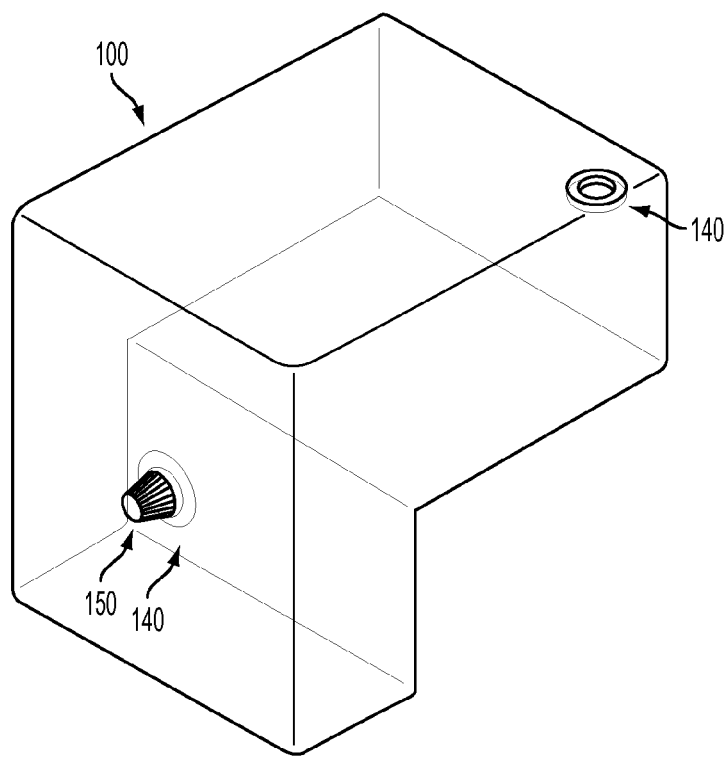
FIG. 9P illustrates a parallel projection view of an example of a housing of unitary construction with injection molding gate residue visible.
Figure 9Q:
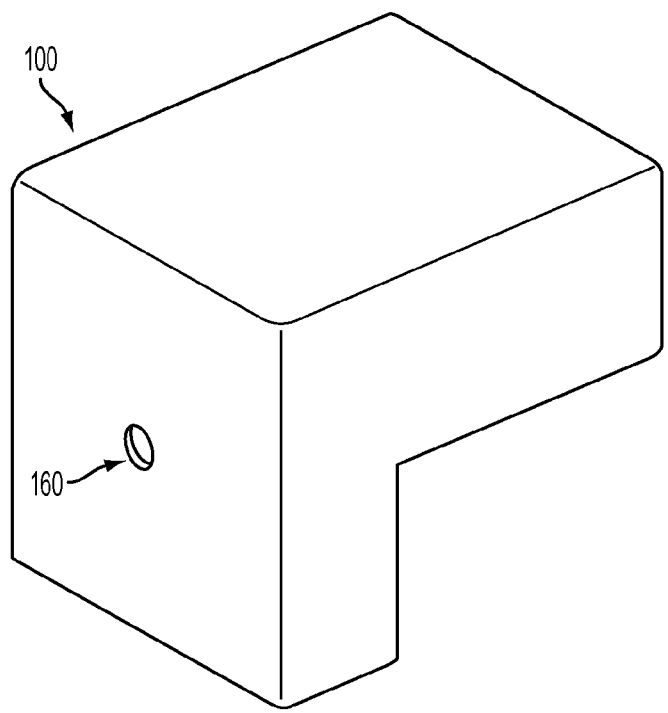
FIG. 9Q illustrates a parallel projection view of an example of a housing of unitary construction after gate residue has been removed and a minor aperture has been opened in the housing.
Figure 9R:
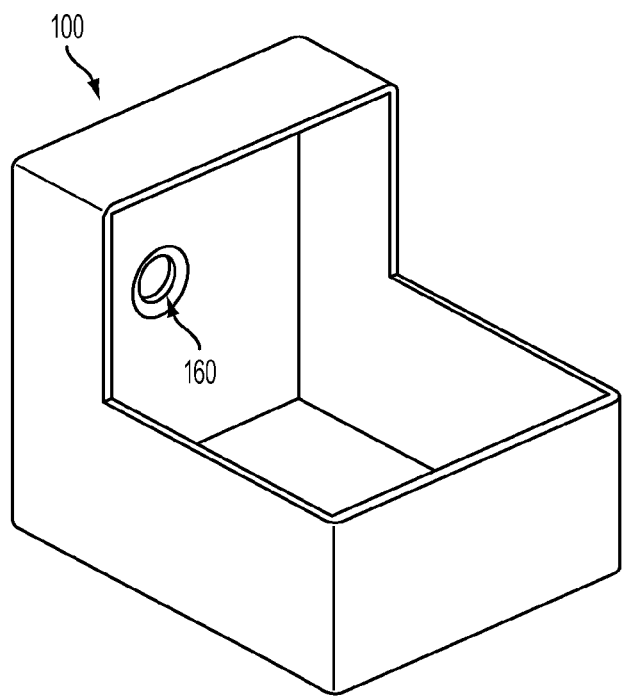
FIG. 9R illustrates a parallel projection view of an example of a housing of unitary construction after gate residue has been removed and a minor aperture has been opened in the housing.

In accordance with another embodiment, as illustrated in FIGS. 9A-R, a major internal mold assembly operable to compress in on itself by utilizing compound interior slides. The additional compression operation of a major internal mold assembly may allow for larger internal features in a housing to be formed using a smaller aperture. Tooling utilizing a major internal mold assembly may operate or have similar features as tooling discussed above. Some of these similar feature and additional features may be discussed below with respect to embodiments directed to compressible internal mold assemblies.

FIG. 9A illustrates an example of a first position of an embodiment of a major internal mold assembly. The major interior surface mold assembly 200 may be comprised of a plurality of movable components. As indicated the plurality of movable components may be selectively movable. The interior surface assembly 200 may comprise three major independently moveable slides. A first major independently movable interior surface slide 210 contours the interior surface of at least a first interior face of the first housing member, but may contour a portion of interior faces adjacent to the first interior face. The first major slide 210 may also form at least one interior surface feature 240 suitable for coupling electronic devices to the interior geometry of the faces the first major slide 210 contours. A second major independently movable interior surface slide 220 may include a dovetail 250 which may engage with the first major slide 210. This may configure the second slide 220 to freely slide along the face of the first major slide 210. The second major slide 220 may contour additional area of the interior faces adjacent to the first face.

Each of the major slides 210, 220, and 230 may be considered compound slides as they may have movable subcomponents. The inclusion of these movable subcomponents as discussed herein may allow the major slides 210, 220, and 230 to exit through a smaller aperture in the completed housing of unitary construction while being able to form a larger interior volume in the housing of unitary construction.

A first minor slide 234, second minor slide 232 and third minor slide 236 may couple together to form a third major independently movable interior surface slide 230. The first minor slide 234 may connect with a dovetail coupling 260 to the second minor slide 232 or third minor slide 236. The width of the first slide 234 may taper parallel to the dovetail coupling 260 such that when the first minor slide 234 slides along the dovetail coupling 260 the second 232 and third minor slide 236 slides may compress together. When the three minor slides (232, 234, 236) are in a first position (e.g. FIG. 9A), the third major slide 230 forms at least a second interior face of the first housing member 100 (not show in FIG. 9A), and may also contour a portion of interior faces adjacent to the first interior face. The third major slide 230 may also form at least one interior surface feature 240 suitable for coupling electronic devices to the interior geometry of the faces the third major slide 230 contours.

FIG. 9B illustrates an example of a second position companion to the embodiment of FIG. 9A. In the embodiment as illustrated, the first major internal surface slide 210 is angled at the interface with the second major interior surface slide 220. The second major independently movable slide 220 may slide down the dovetail coupling 250 along the angled faces between the first major interior surface slide 210 and second major interior surface slide 220.

FIG. 9C illustrates a third position. Which illustrates that the first major interior surface slide 210 and second major interior surface slide 220 may slide at the same time at an angle parallel to the outward facing major face of the first major slide 210, or at such an angle as to remove the mold of interior surface feature 240 without exerting stress on a molded interior surface feature 140 (see e.g. FIG. 3).

FIG. 9D illustrates an example of a fourth position. For example, the first major interior surface slide 210 and second major interior surface slide 220 may slide at the same time at an angle parallel to the outward facing major face of the first major slide 210, or at such an angle as to remove the mold of interior surface feature 240 without exerting stress on the molded interior surface feature 140 (see e.g. FIG. 3). In addition, the first minor slide 234 may be slid along the tapered dovetail coupling 260 toward the vacancy created by the removal of the first major slide 210 and second major slide 220. As a result of the tapered coupling 260, the first minor slide 232 and third minor slide 236 are compressed toward one another. The compression of minor slides 232 and 236 and the movement of minor slide 234 may cause the third major slide 230 to compress along its width. The movement and compression of the third major slide 230 also permits any surface feature molds (e.g. surface feature mold 240) to be removed without exerting stress on a molded interior surface feature 140 (see e.g. FIG. 4).

One of ordinary skill in the art will appreciate that FIGS. 9A-D are presented as showing a progression of positions of an interior mold as it is being removed from an already molded housing 100 as show in FIGS. 2-4. I may be appreciated that additional mold components may be utilized for a complete mold cavity but are not shown in FIGS. 9A-D so that the interior mold component movements may be more clearly understood. On of ordinary skill in the art will understand how to utilized the tooling discussed herein and apply the subject matter.

As illustrated in FIGS. 9E-F, a major aperture mold assembly 300 may be used to contour the geometry of major aperture 130 of the housing 100. The aperture mold has a rotated L-shaped profile, but those skilled in the art will recognize that the aperture may be of an arbitrary shape. The major aperture assembly 300 is sized such that when in the first position as shown in FIG. 9A, major interior mold slides 210, 220 and 230 fit within and through the major aperture 300 to form the inverse of the interior surface 120 (see e.g. FIGS. 3-4). The housing is shown as transparent in FIG. 9F to facilitate the view of the major aperture.

As illustrated in FIG. 9G, the interior mold slides 210, 220 and 230 may be assembled through the aperture mold assembly 300 in the first position as shown in FIG. 9A. The aperture mold assembly may be exactly the width of the interior mold assembly 200 to provide as tight a fit as possible between the parts. As illustrated in FIG. 9H, a number of movable external mold components 410 may be positioned around the other mold components (200 and 300) in order to complete the interior and exterior geometry of the mold cavity. Together, external mold components 410 join together to contour the exterior surface of the mold cavity as exterior mold 400. As further illustrated in FIG. 9H, the foremost external mold component 410 has been made slightly transparent so that the injection molding runner 420 and gate 430 are also visible. Both runner 420 and gate 430 are hollow paths through which mold material may be injected. During the molding process, a certain amount of mold material is injected through runner 420 and gate 430 into the cavity created by the complete assembly of the mold. In various embodiments, the injection molding tool may include five external mold components as illustrated in FIG. 9H, four of which contour a single external face, the foremost contouring two external faces. One skilled in the art will recognize that fewer than five external mold components may be utilized or more than five external mold components may be utilized. For example, some of the mold components may be combined into a single part in order to contour more than one face or edge. Although FIG. 9H illustrates the exterior mold components 410 contouring substantially flat faces and corners, one of ordinary skill can further appreciate that arbitrarily shaped exteriors or corners may be molded as well.

In various embodiments, exterior mold components 410 may be set in place along a path perpendicular to the face each component contours. In other embodiments, exterior mold components 410 may be angled into place or, in other embodiments, slid into position parallel the face each component contours. In further embodiments, exterior mold components 410 may also be rotated into place. One of skill in the art will appreciate that the path the exterior mold components 410 take while being set is arbitrary and may be changed. One of skill will further appreciate that independent external mold components may be set in different ways.

FIG. 9I illustrates an example of a closed mold ready for injection. As the mold is closed, the cavity created by all three mold components (interior mold 200, aperture mold 300, exterior mold 400) is not visible. FIG. 9J is a companion figure to FIG. 9I, with exception that the foremost external mold component 410 is illustrated transparently. In this way, the mold cavity 600 is visible. As illustrated in FIG. 9K, the wall thickness of the mold cavity 600 may be determined by the position of the exterior mold components 410. As demonstrated, the wall thickness of mold cavity 600 is not necessarily uniform. In various embodiments wall thickness may be uniform. One of ordinary skill can appreciate that wall thickness for the mold cavity may arbitrarily differ throughout the geometry of the mold.

Once mold material is injected through runner 420 and gate 430 into the mold cavity 600, the housing of unitary construction 100 has been formed as is ready to be removed for further processing. As illustrated in FIG. 9L, the external mold components 410 may be removed in the order they were set. In other embodiments, external mold components 410 may be removed in a different order. One of ordinary skill will appreciate that as with setting the external mold components, removal path and order of external mold components may be accomplished in a variety of orders. As further illustrated in FIG. 9L, the gate residue 150 may be present if a cold runner injection molding process is used. As the gate residue may not provide an aesthetically or functionally please external geometry, it may be removed in a later process. As shown in FIG. 9L, the interior mold assembly 200 may still be assembled within the molded housing 100.

After the housing 100 has been molded and is prepared to be removed for further processing both the external and internal mold components may be positioned such that the newly molded housing may be separated without damage. In accordance with various embodiments, after external mold components are removed as illustrated in FIG. 9L, a fixture 500 is coupled to the housing 100 (FIG. 9M). The fixtures 500 provides stability to the housing 100 as internal mold slides 210 and 220 are removed and component 230 is compressed in the sequence shown in FIGS. 9A-D. In certain other embodiments, stability for the housing 100 is provided by the external mold assembly 400 during the removal and compression sequence of the internal mold components in FIGS. 9A-D. In various embodiments, the fixture 500 may be coupled to the housing 100 before all external mold components 410 are removed.

As illustrated in FIG. 9N, the injection molding tool may have a final position for the slides 210, 220 and 230 (232, 234, and 236) after the independent movements shown in FIGS. 9A-D. As a result, there may be sufficient space provided by the molded aperture 130 (see e.g. FIGS. 2-4) that the housing 100 may be separated from internal mold 230. In this way, the internal mold component 230 is not removed from the aperture assembly 300 during the separation of housing 100 by fixture 500. FIGS. 9O-9P illustrate examples of the molded housing 100 after molding but before final processing if, as an effect of cold runner injection molding, gate residue 150 is left behind. In various embodiments, the gate may be located directly opposite an internal surface feature 140. The housing 100 is transparent in FIG. 9P in order to show details such as internal surface feature 140. FIGS. 9Q-9R illustrate examples of the molded housing 100 after subsequent processing. In various embodiments, a minor aperture may be opened directly opposite an internal surface feature 140. In some embodiments, internal surface features may be configured to provide structural or mechanical support to housing features that are added in subsequent processing steps.

Figure 10:
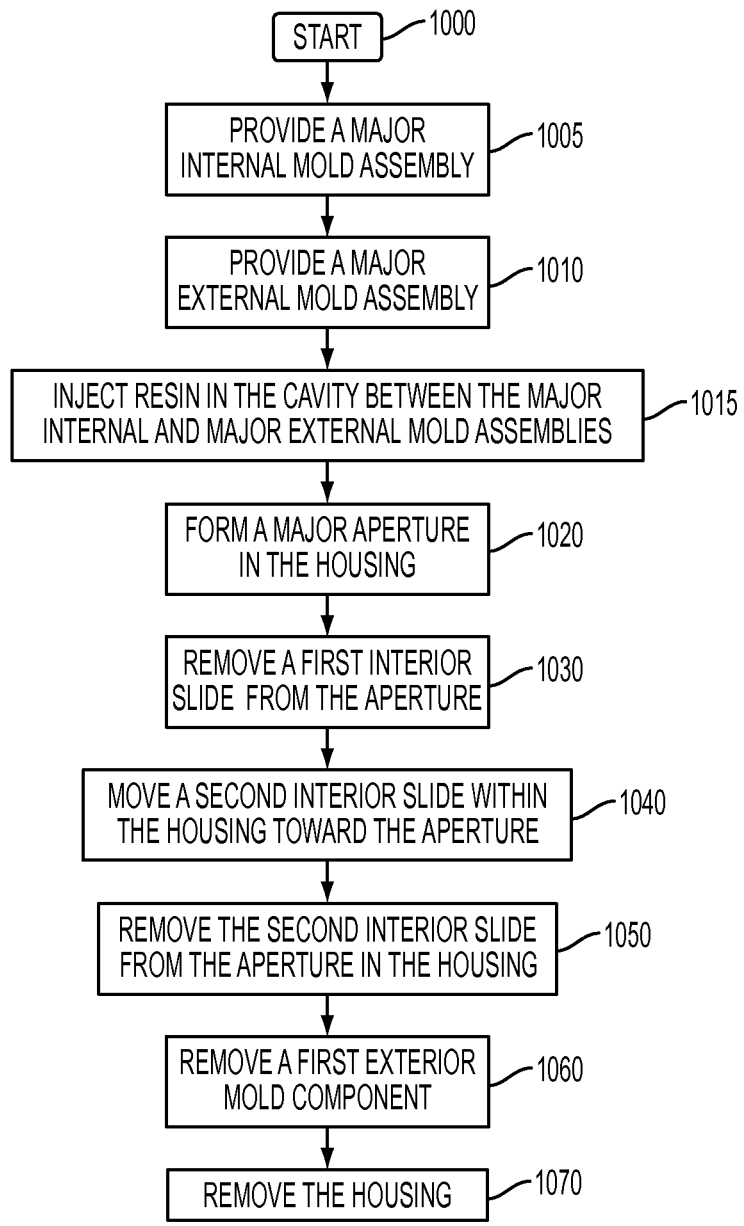
FIG. 10 illustrates a flow chart of an example process for forming a housing of unitary construction.

In accordance with various embodiments, as illustrated in FIG. 10, a housing of unitary construction may be formed in an injection molding process. In operation 1000 a process for molding a housing of unitary construction may be started. In operation 1005, a major internal mold assembly may be obtained or provided. The major internal mold assembly may include providing a plurality of movable interior slides each having an extraction protrusion in a first position for forming an interior cavity of the housing. In operation 1010, a major external mold assembly may be obtained or provided. The major external mold assembly may include providing a plurality of movable components in a first position for forming a major external surface of the housing. A cavity may be formed between the major internal mold assembly and the major external mold assembly. The cavity may be configured for injecting resin to form the housing of unitary construction. The major external mold assembly may mate with the extraction protrusion of each of the plurality of movable interior slides. In operation 1015, resin may be injected in the cavity between the major internal mold assembly and the major external mold assembly. This injection may form a major internal surface and a major external surface, respectively. The formation of the surfaces forms the housing of unitary construction. In operation 1020, a major aperture may be formed in the housing of unitary construction. The aperture may pass from the interior cavity through the interior surface and the exterior surface of the housing. The major aperture may be formed around the extraction protrusions of each of the movable slides. For example, the aperture formation may be located where the major external mold assembly mates with the extraction protrusion of each of the plurality of movable interior slides. This location may be proximal to the cavity formed between the major internal mold assembly and the major external mold assembly. In operation 1030, a first moveable interior slide may be removed through the aperture formed in the housing of unitary construction. In operation 1040, a second moveable interior slide may be moved within the formed housing of unitary construction toward the aperture and in operation 1050, the second moveable interior slide may be removed through the aperture formed in the housing of unitary construction. In operation 1060, the first movable exterior mold component may be removed. In operation 1070, the housing of unitary construction may be removed from the tooling. Although presented in one particular sequence in FIG. 10, one of skill in the art will appreciate that the various procedures may be completed in any of a variety of orders.

Figure 11:
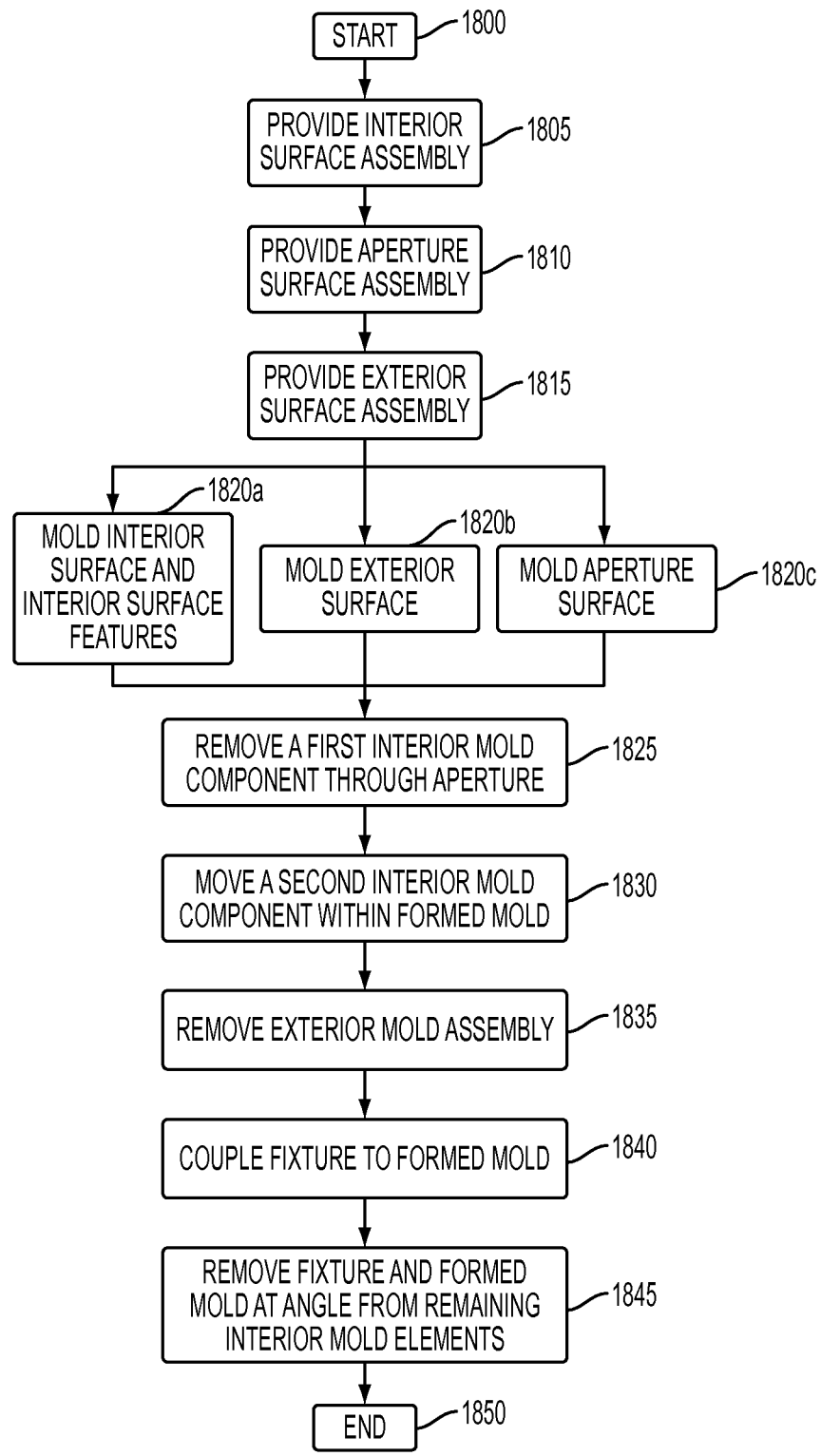
FIG. 11 illustrates a flow chart of an example process for forming a housing of unitary construction.

In accordance with various embodiments, as illustrated in FIG. 11, an injection molding process which begins in operation 1800 may be utilized in forming a housing of unitary construction. In operation 1805, an interior surface assembly may be provided. For example, the interior surface assembly similar to the interior mold assembly 200. In operation 1810, an aperture assembly may be provided. The aperture assembly may contour a major aperture of the housing of unitary construction. For example, the aperture assembly may be similar to aperture mold assembly 300. In operation 1815, an exterior surface assembly may be provided.

In operation 1820*a-c*, an interior surface, interior surface features, an exterior surface, or an aperture surface may be molded. In an example, if the molding process is injection molding, 1820*a-c* may occur simultaneously as the mold material fills the available mold cavity space. In another example, the interior, exterior, or aperture surfaces may be molded in distinct steps. For example, multiple gates may provide mold material to different sectional volumes of the mold cavity. In operation 1825, after molding, a first interior mold component may be removed through the molded aperture, such as the motion discussed in the various examples above see e.g. 9A-B or FIG. 5E. In various embodiments, this first interior mold component may be removed at ninety degrees. In various embodiments, the first interior mold component may be removed at an angle. In still further embodiments, a sequence of interior mold components may be removed in a repetition of operation 1825. In operation 1830, a second interior mold component remaining within the molded housing may be moved towards the aperture, such as the motion discussed in the various examples above, see e.g. FIGS. 9C-D or FIG. 5F. In various embodiments, the second interior mold component's motion may cause other mold components to move. In still further embodiments, a sequence of interior mold components may be removed in a repetition of step 1830. In operation 1835, an exterior mold assembly may be removed. In various embodiments, the individual components of the exterior mold assembly may be removed sequentially. In other embodiments, the components may be removed contemporaneously. In operation 1840, a fixture may be coupled to the formed mold, see e.g. the coupling illustrated in FIGS. 9M-N. In some embodiments, the coupling may be a friction fit. In other embodiments, the fixture may actively adhere itself to the formed component with suction or some similar means. In operation 1845, the fixture and formed mold may be removed together over the interior mold components remaining within the interior volume of the formed housing. In various embodiments, the fixture and formed mold are removed at an angle. Although presented sequentially in FIG. 11, one of skill in the art will appreciate that the various procedures may be completed in a variety of orders.

Figure 12:
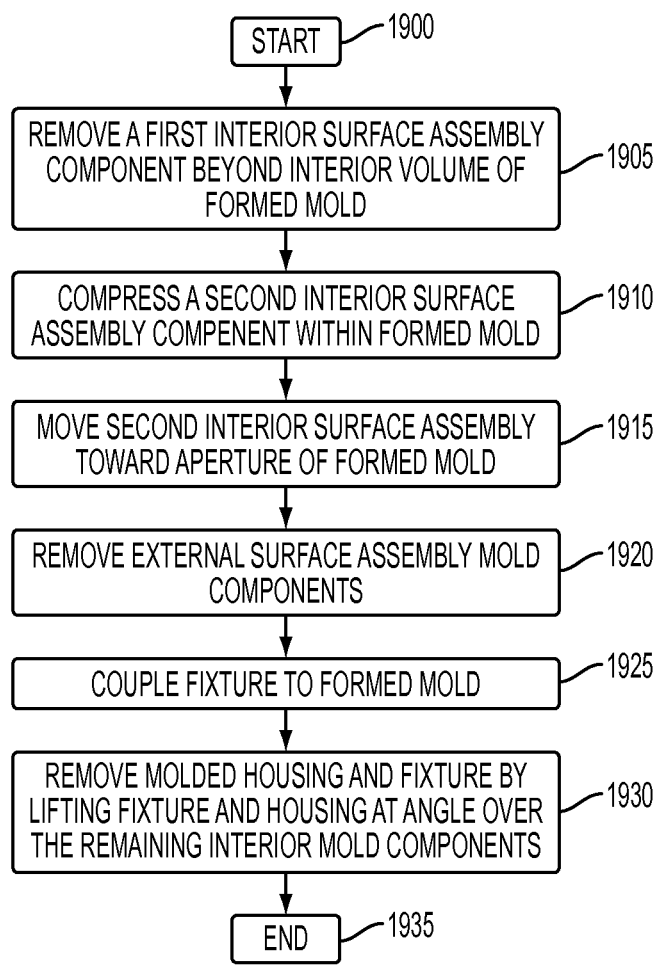
FIG. 12 illustrates a flow chart of an example process for disassembling a mold of unitary construction.

In accordance with various embodiments as illustrated in FIG. 12, a mold for formation of a housing of unitary construction may be disassembled. In operation 1900, the process of disassembly may begin. In operation 1905, the disassembly may include removing a first interior surface assembly component beyond an interior volume of a formed mold. In various embodiments, the first slide may be removed at an angle. In other embodiments, the first slide may be removed at ninety degrees. In still further embodiments, a sequence of interior mold components may be removed in a repetition of operation 1905. In operation 1910, a second interior surface assembly component still within the formed mold may be compressed. The compression may, for example, be caused by the motion of another component. In operation 1915, a second interior surface assembly may be moved toward an aperture of the formed mold. In various embodiments, the second interior surface assembly may be made up of multiple individual slides, each of which may move together or independently toward the aperture of the formed mold. In still further embodiments, a sequence of interior mold components may be removed in a repetition of the previous processes. In operation 1920, components of an exterior mold assembly may be removed. In various embodiments, the individual components of the exterior mold assembly may be removed sequentially. In other embodiments, the components may be removed contemporaneously. In operation 1925, a fixture may be coupled to the formed mold, see e.g. the coupling illustrated in FIGS. 9M-N. In various embodiments, the coupling may be a friction fit. In other embodiments, the fixture may actively adhere itself to the formed component with suction or some similar means. In operation 1930, the fixture and formed mold may be removed together over the interior mold components remaining within the interior volume of the formed housing. In various embodiments, the fixture and formed mold are removed at an angle.

As used throughout this document in each of the embodiments, aspects, examples, lists and various descriptions of the subject matter contained herein, the word "or" is intended to be interpreted in its inclusive form (e.g. and/or) not in its exclusive form (e.g. only one of) unless explicitly modified to indicate only one item in a list is intended (e.g. only one of A, B, or C). For example, the phrase A, B, or C is intended to include any combination of the elements. The phrase can mean only A. The phrase can mean only B. The phrase can mean only C. The phrase can mean A and B. The phrase can mean A and C. The phrase can mean B and C. The phrase can mean A and B and C. This concept extends to any length of list (e.g. 1, 2, 3 . . . n) used herein.

Although the foregoing discussion has presented specific embodiments, the foregoing merely illustrates the principles of the invention. Persons skilled in the art will recognize that changes may be made in form and detail without departing from the spirit and scope of the disclosure as various modifications and alterations to the described embodiments will be apparent to those skilled in the art, in view of the teachings herein. For example, the processing steps may be performed in another order, or in different combinations. It will thus be appreciated that those having skill in the art will be able to devise numerous systems, arrangements and methods which, although not explicitly shown or described herein, embody the principles of the disclosure and are thus within the spirit and scope of the present invention. From the above description and drawings, it will be understood by those of ordinary skill in the art that the particular embodiments shown and described are for purposes of illustration only, and references to details of particular embodiments are not intended to limit the scope of the present invention, as defined by the appended claims.

We claim:

1. A housing for electronic components, the housing comprising:
   a body having a major interior surface that defines an interior cavity and a major exterior surface comprising at least first and second intersecting surfaces;
   a major aperture formed in the body and extending from the interior cavity through the major interior surface and major exterior surface, wherein the major aperture passes through a portion of the first surface and the second surface but not the entirety of the first surface and the second surface and wherein the interior cavity is dimensionally larger than the major aperture such that a largest cross-section of the interior cavity is larger than a largest cross-section of the major aperture;
   a receiving lip formed around a perimeter of the major aperture;
   a retention cap having first and second exterior cap surfaces that intersect at an elbow of the retention cap, wherein the retention cap is coupled to the receiving lip such that the first and second exterior cap surfaces are flush with the first and second surfaces of the body, respectively, and wherein the retention cap includes a protrusion that extends outward from the first exterior cap surface and a minor aperture that extends through the second exterior cap surface to the interior cavity; and
   wherein the housing body is of a single, unitary construction formed of a rigid material of substantially uniform thickness that defines the entirety of the major exterior surface such that the major exterior surface does not include any seams.

2. The housing of claim 1 wherein the body includes at least one interior surface feature configured to couple to electronic components.

3. The housing of claim 1, wherein the major aperture additionally passes through a portion of a third surface and a fourth surface.

4. The housing of claim 3, wherein the major aperture comprises a substantially L-shaped cross section.

5. The housing of claim 3, wherein the first surface is orthogonal to the second surface, the third surface and the forth surface; wherein the second surface is orthogonal to the third surface and the forth surface; wherein the third surface and the fourth surface are parallel to one another.

6. The housing of claim 5, wherein the first surface, the second surface, the third surface and the fourth surface are all contiguous and have no separate surfaces mechanically attached to form any of the first surface, the second surface, the third surface and the forth surface.

7. The electronic device housing set forth in claim 1 wherein major exterior surface of the body includes first and second opposing faces each of which is shaped as a concave hexagon having all right angles with at least some rounded corners.

8. A housing, comprising:
   an injection-molded body defining an interior cavity therein, the injection molded body having a major exterior surface comprising at least first surface and second intersecting surfaces; and
   a major aperture passing through the injection-molded body and opening to the interior cavity;
   a receiving lip formed around a perimeter of the major aperture;
   a retention cap having first and second exterior cap surfaces that intersect at an elbow of the retention cap, wherein the retention cap is coupled to the receiving lip such that the first and second exterior cap surfaces are flush with the first and second surfaces of the body, respectively, and wherein the retention cap includes a protrusion that extends outward from the first exterior cap surface and a minor aperture that extends through the second exterior cap surface to the interior cavity;
   wherein the interior cavity is dimensionally larger than the major aperture such that a largest cross-section of the interior cavity is larger than a largest cross-section of the aperture; and the injection-molded body is of a unitary construction that does not include any seams along the major exterior surface.

9. The housing of claim 8, wherein the injection-molded body lacks a seam.

10. The housing of claim 8, wherein:
the injection-molded body defines at least a pair of sidewalls adjacent one another; and
the aperture passes through the at least a pair of sidewalls.

11. The electronic device housing set forth in claim 8 wherein major exterior surface of the body includes first and second opposing faces each of which is shaped as a concave hexagon having all right angles with at least some rounded corners.

12. An electronic device housing comprising:
a seamless body having a major exterior surface and a major interior surface that combine to define a plurality of walls which in turn define an interior volume, wherein the plurality of walls includes first and second opposing faces and a sidewall extending between the first and second opposing faces along a perimeter of the seamless body, the sidewall including first, second, third and fourth sidewall faces where the first and second sidewall faces meet at a first corner, the second and third sidewall faces meet at a second corner and the third and fourth sidewall faces meet at a third corner in a catercorner position to the first corner;
a major aperture formed at a corner of the seamless body catercorner to the second corner and opening to the interior volume, the major aperture formed between the first and second opposing faces and between the first and fourth sidewall segments, and the major aperture having a cross-sectional dimension between the first and fourth sidewall segments that is less than a cross-sectional dimension of the interior volume between the first and third corners;
a receiving lip formed around a perimeter of the major aperture; and
a retention cap having first and second exterior cap surfaces that intersect at an elbow of the retention cap, wherein the retention cap is coupled to the receiving lip such that the first and second exterior cap surfaces are flush with the first and fourth sidewall segments of the body, respectively.

13. The electronic device housing set forth in claim 12 further comprising a first electronic module comprising a plurality of electronic components, the first electronic module having a length that is substantially equal to a interior dimension of the internal cavity, a width that is substantially equal to the cross-sectional dimension of the major aperture between the third and fourth sidewall segments, and rounded corners that enable the first electronic module to be inserted through the aperture into the internal cavity and then rotated into a final position.

14. The electronic device housing set forth in claim 13 further comprising a second electronic module coupled to the first electronic component.

15. The electronic device housing set forth in claim 12 wherein the first, second and third corners are each rounded.

16. The electronic device housing set forth in claim 15 wherein each of the first and second opposing faces is shaped as a concave hexagon having all right angles.

17. The electronic device housing set forth in claim 16 wherein the retention cap includes a protrusion that extends outward from the first exterior cap surface and a minor aperture that extends through the second exterior cap surface to the interior volume.

* * * * *